(12) United States Patent  (10) Patent No.: US 8,866,168 B2
Bailey et al.  (45) Date of Patent: Oct. 21, 2014

(54) OPTICAL DEVICES FOR CONTROLLED COLOR MIXING

(75) Inventors: Edward Bailey, Westampton, NJ (US); Shane Harrah, Moorestown, NJ (US)

(73) Assignee: Lighting Science Group Corporation, Satellite Beach, FL (US)

( * ) Notice: Subject to any disclaimer, the term of this patent is extended or adjusted under 35 U.S.C. 154(b) by 1651 days.

(21) Appl. No.: 11/737,101

(22) Filed: Apr. 18, 2007

(65) Prior Publication Data

US 2007/0268694 A1  Nov. 22, 2007

Related U.S. Application Data

(60) Provisional application No. 60/792,885, filed on Apr. 18, 2006.

(51) Int. Cl.
*F21V 9/00* (2006.01)

(52) U.S. Cl.
USPC .......... 257/98; 257/88; 257/89; 257/100; 257/E25.02; 257/E33.073; 257/E33.074; 362/231

(58) Field of Classification Search
CPC .......... G02B 27/0955; G02B 19/0014; G02B 19/0066; G02B 19/0028; H01L 33/54; H01L 25/0753; H01L 33/58; H01L 2933/0091; F21V 9/00
See application file for complete search history.

(56) References Cited

U.S. PATENT DOCUMENTS

| | | | |
|---|---|---|---|
| 2,429,849 A * | 10/1947 | Somers | 348/270 |
| 3,957,031 A | 5/1976 | Winston | |
| 4,053,208 A * | 10/1977 | Kato et al. | 359/460 |
| 4,991,030 A * | 2/1991 | Sato et al. | 358/474 |
| 5,001,609 A * | 3/1991 | Gardner et al. | 362/555 |
| 6,900,936 B2 | 5/2005 | Boyd et al. | |
| 7,021,797 B2 | 4/2006 | Miñano et al. | |
| 7,887,197 B2 * | 2/2011 | Iwanaga | 353/94 |
| 2002/0034710 A1 | 3/2002 | Morris et al. | |
| 2002/0191394 A1 | 12/2002 | Coleman et al. | |

(Continued)

FOREIGN PATENT DOCUMENTS

| | | |
|---|---|---|
| CN | 1433528 A | 7/2003 |
| EP | 1455398 A2 | 9/2004 |

(Continued)

OTHER PUBLICATIONS

Merriam-Webster OnLine definition of "cursory."*

(Continued)

*Primary Examiner* — Hrayr A Sayadian
(74) *Attorney, Agent, or Firm* — Cantor Colburn LLP

(57) ABSTRACT

The present invention provides a multicolor LED assembly packaged with improved and controlled color mixing to create a more uniform color mixture. The assembly includes at least one lens overlying an encapsulant which encapsulates a plurality of LED dies. The lens includes a top surface and a bottom surface with the contour of the bottom surface designed to redirect light from each of the LED dies in different directions towards the top surface of the lens. The contoured shaped of the bottom surface of the lens redirects light from each of the plurality of LED dies such that illuminance and luminous intensity distributions of the plurality of LED dies substantially overlap, wherein the deviation from complete overlap is less than a predetermined amount which is substantially imperceptible to the average human eye.

39 Claims, 67 Drawing Sheets

(56) References Cited

U.S. PATENT DOCUMENTS

| | | | |
|---|---|---|---|
| 2003/0209714 A1 | 11/2003 | Taskar et al. | |
| 2004/0084681 A1 | 5/2004 | Roberts | |
| 2004/0189949 A1* | 9/2004 | Ikeda et al. | 353/20 |
| 2005/0086032 A1 | 4/2005 | Benitez et al. | |
| 2005/0128730 A1 | 6/2005 | Shindoh | |
| 2005/0189549 A1* | 9/2005 | Malone et al. | 257/82 |
| 2005/0225988 A1 | 10/2005 | Chaves et al. | |
| 2005/0243570 A1 | 11/2005 | Chaves et al. | |
| 2007/0001624 A1* | 1/2007 | Blondia | 315/291 |
| 2007/0247873 A1* | 10/2007 | Awai et al. | 362/618 |
| 2007/0268694 A1* | 11/2007 | Bailey et al. | 362/231 |

FOREIGN PATENT DOCUMENTS

| | | |
|---|---|---|
| EP | 1455398 A3 | 9/2004 |
| JP | H07220512 A | 8/1995 |
| JP | H11162232 A | 6/1999 |
| JP | 2004266148 A | 9/2004 |
| TW | I240805 B | 10/2005 |
| WO | 0155783 A1 | 8/2001 |
| WO | 2005050710 A2 | 6/2005 |

OTHER PUBLICATIONS

EP Office Action for EP Application No. 07760864.4-2217; Date of Mailing: Feb. 6, 2012; 4 pgs.

EP Supplementary Search Report for EP Application No. 07760864.4; Date of Mailing: Jun. 24, 2011; 11 pgs.

Abstract only of JP3505985; Date of Publication Mar. 15, 2004; Equivalent to JP11162232(A).

Korean Office Action for KR Application No. 10-2008-7028180; Dated Oct. 22, 2013; English Translation.

Ammer et al. "Chip-level integrated diffractive optical mircolenses for Multimode vertical-cavity surface-emitting laser to fiber coupling", Opt. Eng. 41(12) 3141-3150 (Dec. 2002).

Ning, et al. "Dielectric totally internally reflecting concentrators", Applied Optics. vol. 26, No. 2, Jan. 15, 1987.

Spigulis, "Compact dielectric reflective elements. I. Half-sphere concentrators of radially emitted light", Applied Optics, vol. 33, No. 25, Sep. 1, 1994.

Purcell, et al. "Scattering and Absorption of Light by Nonspherical Dielectric Grains", The Astrophysical Journal, 186:705-714, Dec. 1, 1973.

Winston et al, "Simultaneous Multiple Surface Design Method", Nonimaging Optics, 8.10 The Rxi Concentrator, pp. 202-203.

Secretariat: American National Standards Lighting Group—NEMA, "Specifications for the Chromaticity of Fluorescent Lamps" American National Standard, ANSI C78, 379-2001 (pp. 1-16), Feb. 1, 2001.

EP Office Action for Application No. 07 760 864.4-2217; Dated Sep. 27, 2012; 4 pgs.

TW Office Action for ROC (Taiwan) Paent Application No. 096113842 dated Aug. 31, 2012 with English Translation; 20 pgs.

EP Office Action dated Jul. 9, 2013 for EP Application No. 07 760-864.4-1562. p. 1-5.

EP Supplementary Search Report for EP Application No. 07760864.4; Date of Mailing Jun. 24, 2011; 11 pgs.

* cited by examiner

REGULAR TRANSMISSION

DIFFUSE TRANSMISSION designed BSDF

FIG. 9
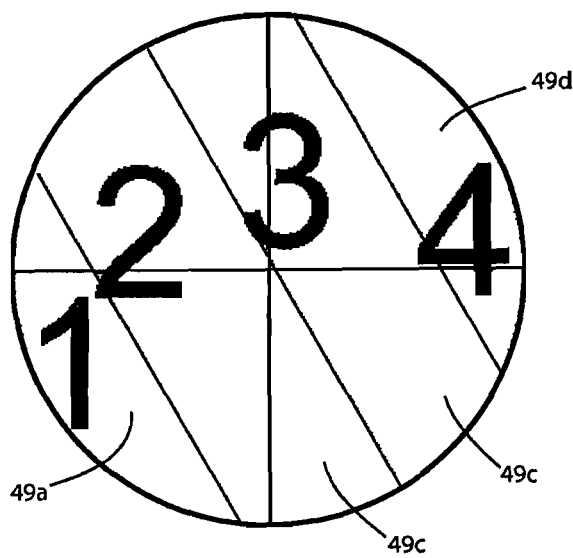
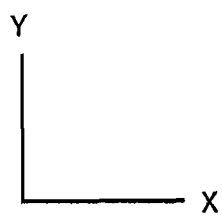

FIG. 13
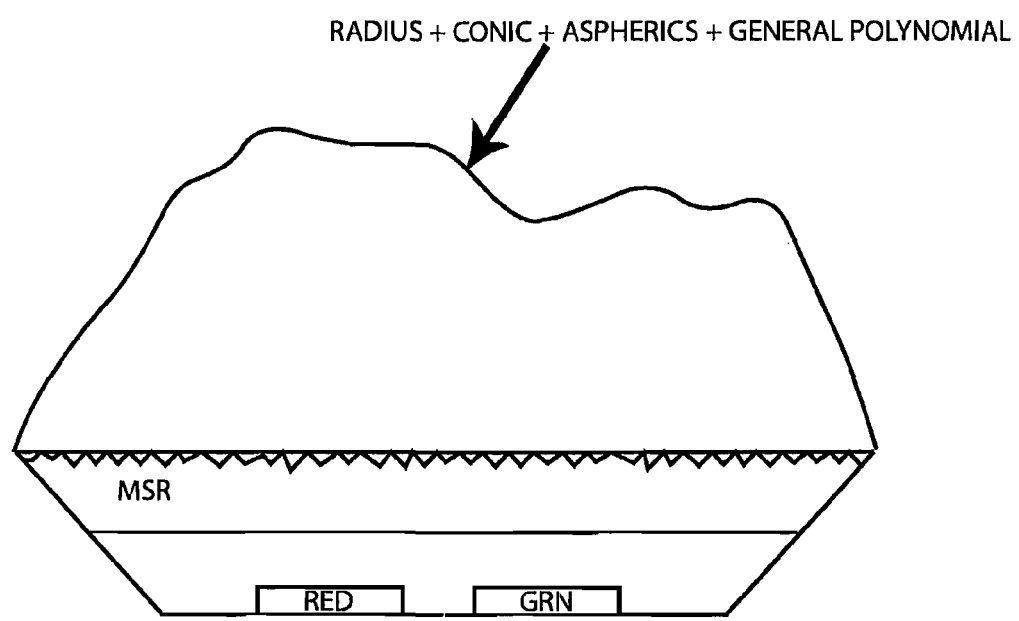
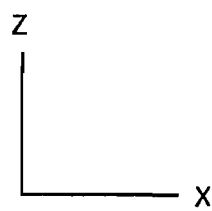

TIR lens

NURBS lens

TIR + FRESNEL Lens

FIG. 20
DOE LENS
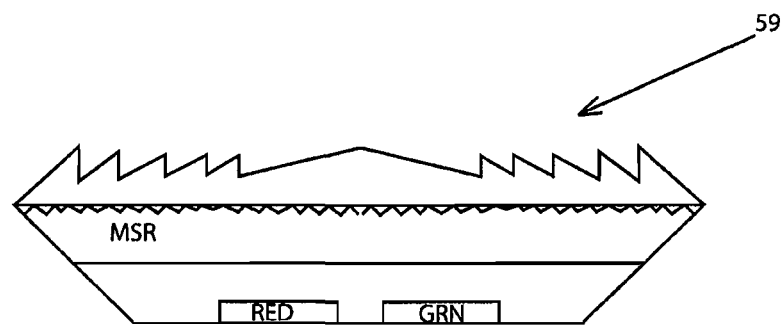
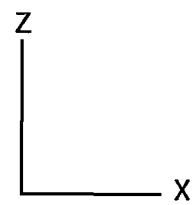

BICONIC Lens

FIG. 22
BICONIC Lens
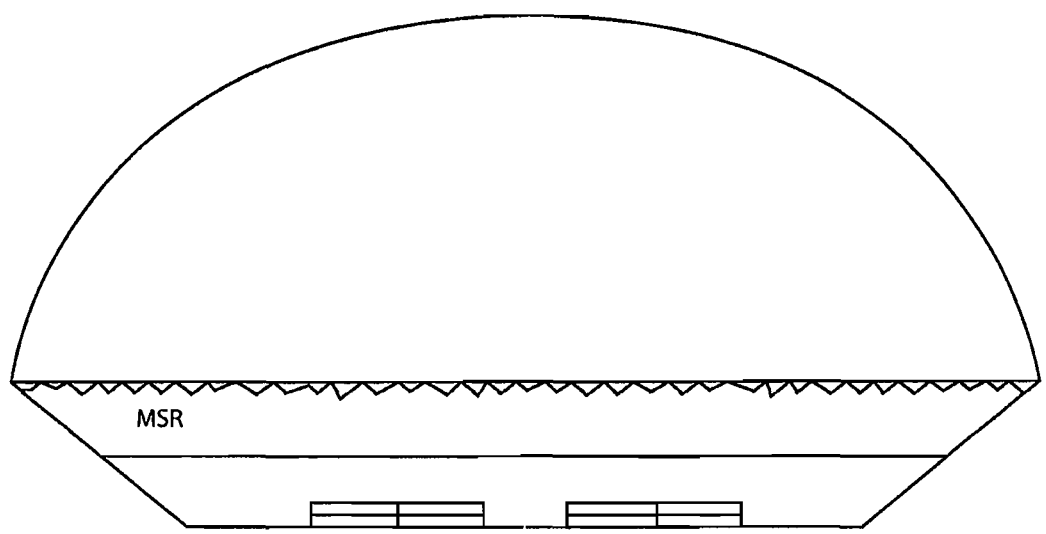
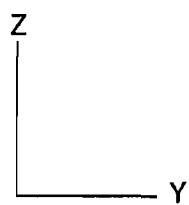

CARTOVAL

MFPC

FIG. 29
MFPC
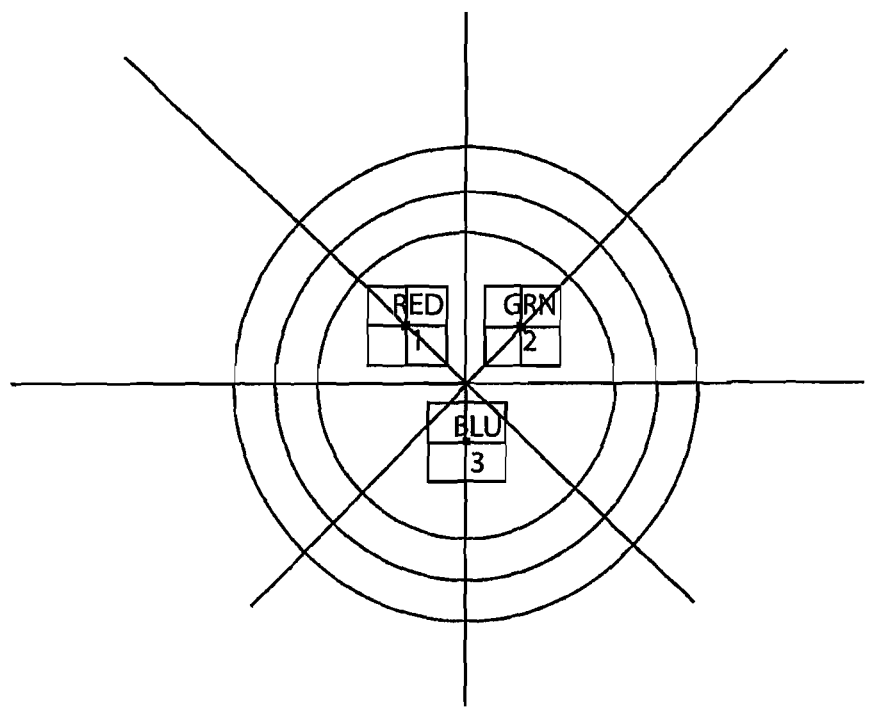
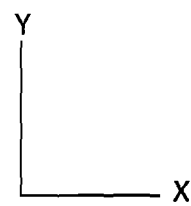

FIG. 30
MFPC
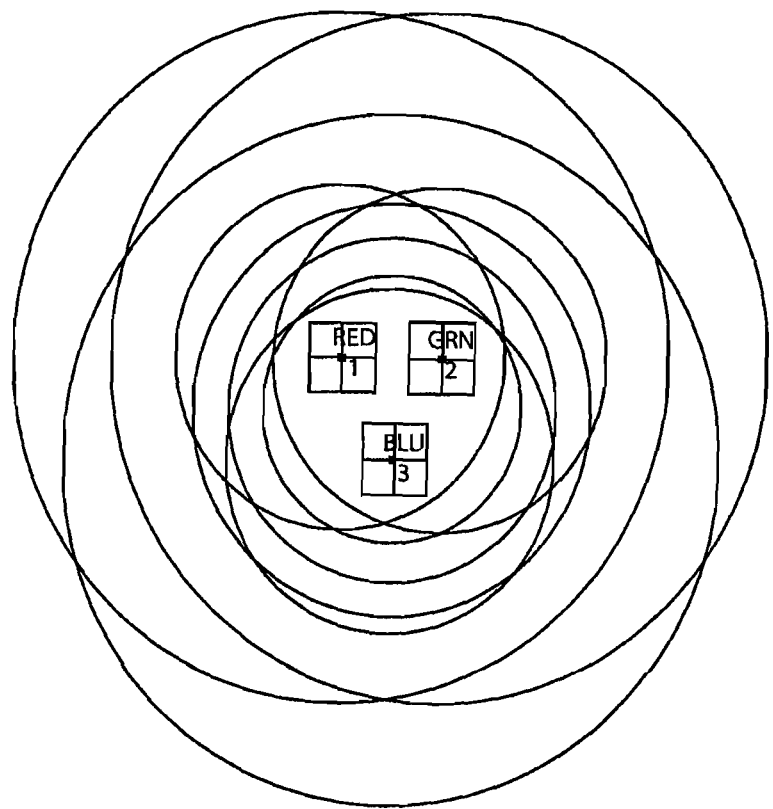
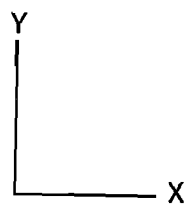

FIG. 31
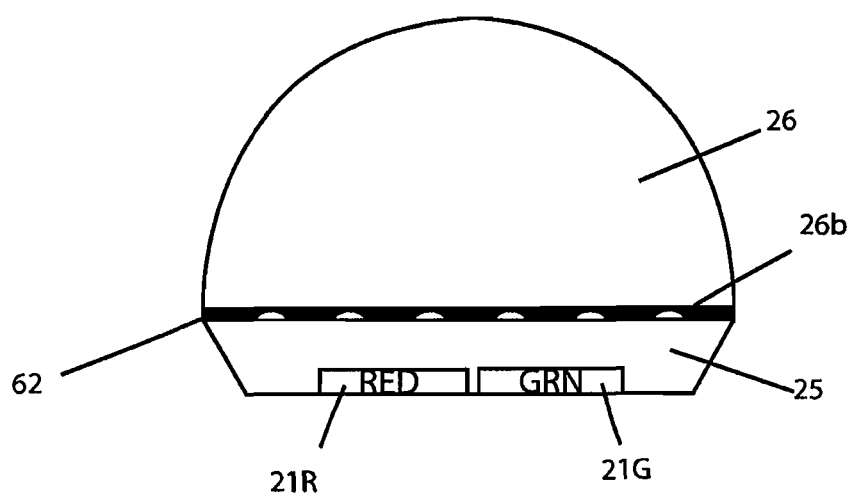
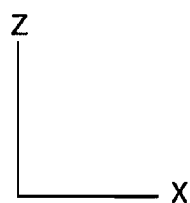

FIG. 33
HEXAGONAL LENSLETS
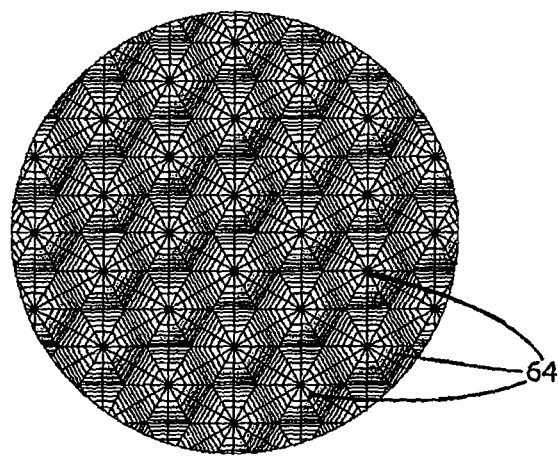
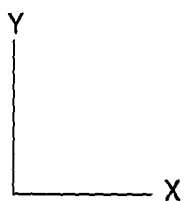

FIG. 34
SQUARE LENSLETS
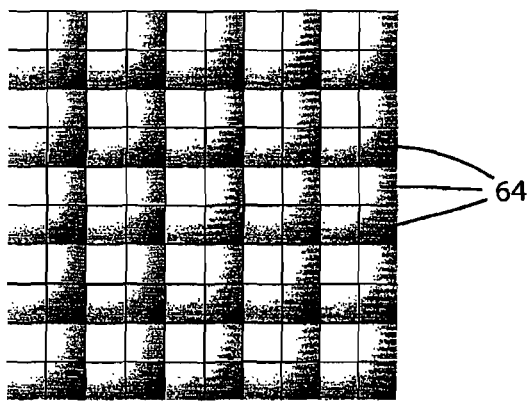
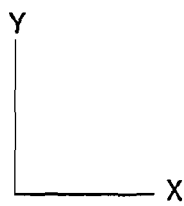

FIG. 35
RECTANGULAR LENSLETS
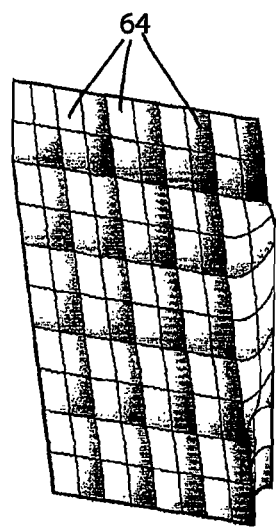
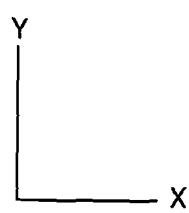

FIG. 36
CIRCULAR LENSLETS
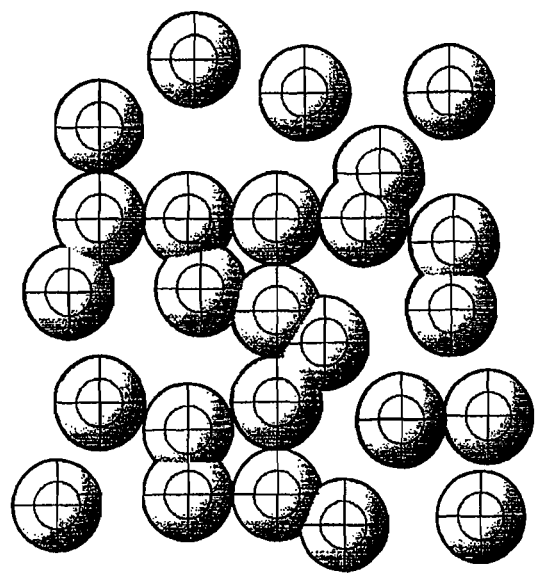
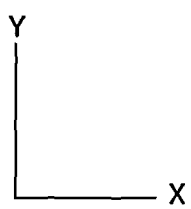

FIG. 39
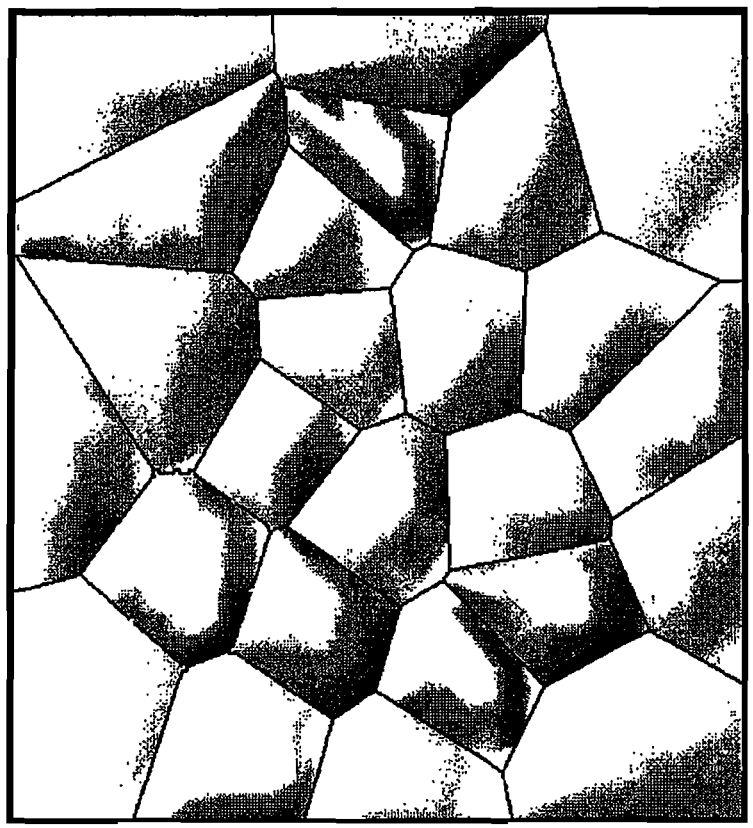
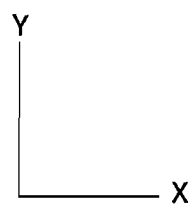

FIG. 44
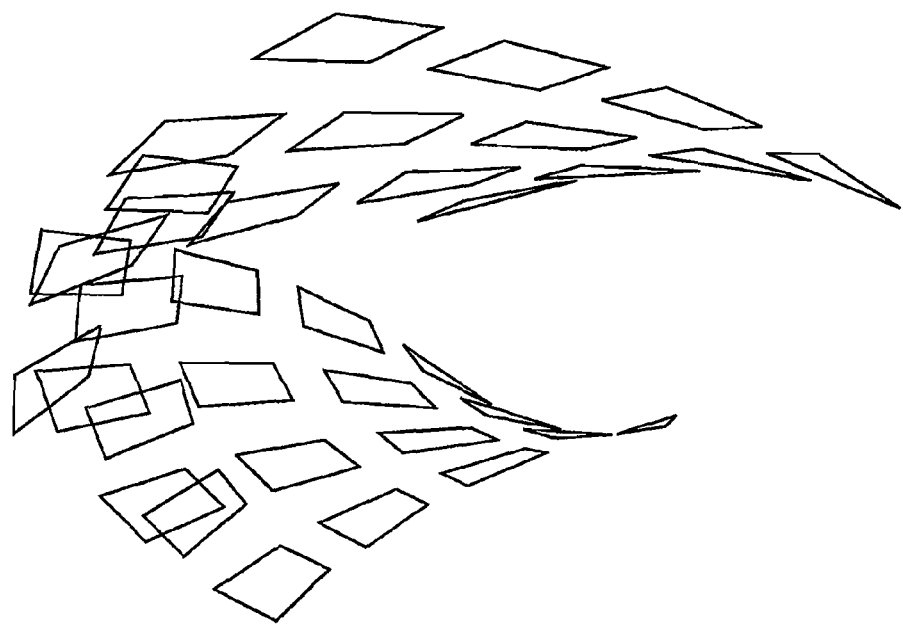
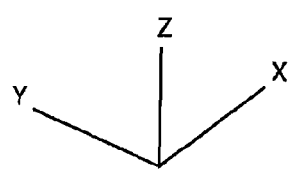

FIG. 45
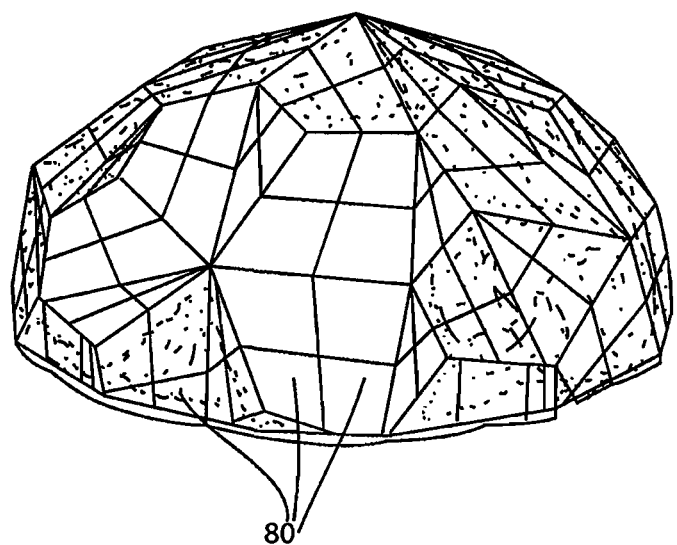
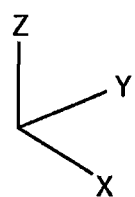

Traditional RXI with faceted reflector, faceted dielectric entrance surface, and fly's eye lenslet structure Voronoi fly's eye lenlet layer with combinations of both designed and randomized placement

FIG. 61C
Perspective view rendered with transparent dielectric
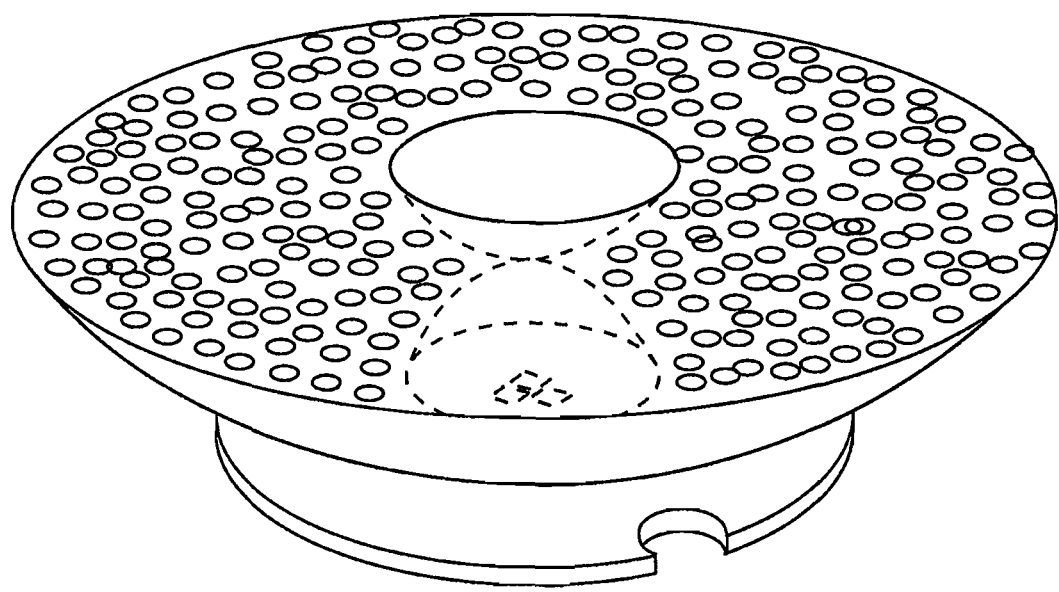
Multi-primary solid state lighting source
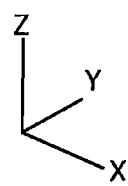

FIG. 61D
Perspective view with solid rendering
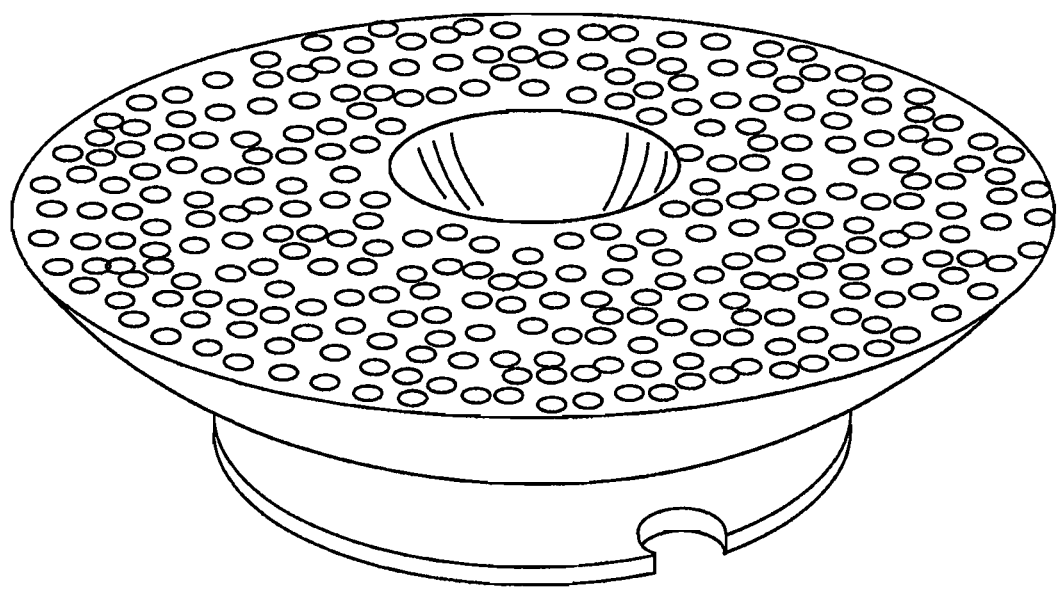
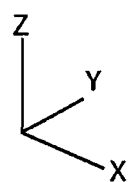

Perspective view wireframe

ОПТICAL DEVICES FOR CONTROLLED
COLOR MIXING

This application claims priority to provisional U.S. application No. 60/792,885 filed Apr. 18, 2006 under 35 U.S.C. §111(b), the contents of which are incorporated herein by reference.

Numerous references including various publications are cited and discussed in the description of this invention. The citation and/or discussion of such references is provided merely to clarify the description of the present invention and is not an admission that any such reference is "prior art" to the present invention. All references cited and discussed in this specification are incorporated herein by reference in their entirety and to the same extent as if each reference was individually incorporated by reference.

FIELD OF THE INVENTION

The present invention relates to optical devices, more specifically, the present invention relates to multicolor optical light source assemblies with controlled color mixing for a uniform color mixture.

BACKGROUND OF THE INVENTION

Light emitting diodes (LEDs) are being used as light sources in an increasing variety of applications extending from communications and instrumentation to household, automotive and visual display uses. In many of these applications color variability is advantageous or required. LEDs have great promise for color variable applications because of their rapid switching time, small size, high reliability, long life and simplicity of color control. A common color variable LED assembly combines red, green and blue (RGB) LEDs in an RGB assembly. Color can be controlled and changed by varying the outputs of each different color LED.

Unfortunately, conventional multi-colored LEDs, including conventional RGB assemblies, suffer from poor color mixing. Because the LED die emit considerable heat, the LED die are typically widely spaced for heat dissipation. As a consequence, die of different color are spaced apart, and viewers may see different individual colors from different viewing angles.

FIG. 1, which is a schematic cross-section of a conventional RGB assembly 10, is useful in understanding poor color mixing. The assembly 10 includes red, green and blue LED die 11R, 11G and 11B, respectively disposed on a mounting base 12 and encapsulated in a transparent dome 13. The die can be mounted within a surface cavity (not shown) in the base 12. In the particular arrangement illustrated, green light from die 11G dominates viewing angles on the left side of the assembly, blue light from 11B dominates views from the right side and red light from 11R dominates central viewing. There is both poor illuminance overlap and poor luminous intensity overlap of the respective colors. Illuminance is defined as the total light flux incident on a surface, per unit area, as perceived by the human eye. Luminous intensity is defined as a measure of the wavelength-weighted power emitted by a light source in a particular direction, based on a standardized model of the sensitivity of the human eye.

Attempts to improve color mixing in the prior art include externally attached secondary optics. Such devices include fly's eye lenslet arrays, holographic diffusers, microlens patterns, and scatter devices. These devices may be attached to refractors, reflectors or hybrid collimators. Other such attachments include internal reflection (TIR) integrators and mirror integrators, which improve overlap of colors at their respective exit apertures.

All such secondary optic devices suffer from several disadvantages. External devices may be bulky and unwieldy for integrated luminaire applications. Secondary optic devices may improve color mixing by spreading the light into a wider beam, but as the light is spread, luminous intensity drops according to etendue and skewness invariance laws. Etendue is a property of an optical system, which characterizes how "spread out" the light is in area and angle. This is undesirable for high intensity narrow distribution applications. TIR or mirror integrators may bring some or all of the luminous intensity back to a full overlap at a given distance from the illumination sources, but suffer from poor matching at other distances from the source. For certain types of TIR mirror integrators, the illuminance distribution functions of different color sources may overlap well, but their corresponding luminous intensity distribution functions do not overlap well. In such circumstances, the colors again separate at further distances from the sources. In other situations, the luminous intensity distributions may overlap well, but the illuminance distributions do not, thereby resulting in one color being visible near the center of the plane at which the sources are viewed, while other colors are more visible near the fringes of the plane, with the resulting illuminance distribution having the appearance of a "bull's eye."

Thus, it is desirable for the light produced by a multi-color array to create a more uniform color mixture everywhere within the emitted light beam. Accordingly, there is a need for a multicolor LED assembly with improved and controlled color mixing.

SUMMARY OF INVENTION

In one embodiment of the present invention, there is provided an assembly of multicolor light emitting diodes packaged for controlled color mixing. The assembly includes a thermally conductive mounting substrate with a plurality of LED die mounted on the substrate. The plurality of the LED die together emit light of more than one color. Also, included is an optically transmissive encapsulant surrounding the plurality of LED die; the encapsulant fills up the surface cavity. Additionally, the assembly may include at least one lens having a top surface and a bottom surface covering said encapsulant, the bottom surface of the lens including a contour to redirect light from each of the plurality of LED die in different directions towards the top surface of the lens. The contoured shaped bottom surface of the lens redirects light from each of the plurality of LED die such that illuminance and luminous intensity distributions of the plurality of LED die substantially overlap, wherein the deviation from complete overlap is less than a predetermined amount which is imperceptible to the average human eye. The predetermined amount falls within the area of a MacAdam ellipse plotted on a chromaticity chart for the colors emitted and mixed together by the plurality of LED die.

The contoured bottom surface may include a microlenslet array, which can be described by a microsurface roughness prescription, a micro-fly's eye lenslet array, or have a Voronoi lenslet array structure. The top surface of the lens may be described by a surface having a number of standard shapes. The lens may be imbedded with refractive or reflective microparticles. If imbedded with reflective microparticles, the microparticles may be arranged to produce microtunnels that act like waveguides to light emitted by the LEDs. The lens may be formed of multiple lobes. The encapsulant surrounding the LED die may itself be surrounded by a reflector. The lens may also be surrounded by a second reflector. The second reflector may be composed of a plurality of randomly-perturbed microfacets. The encapsulant and the lens may be surrounded by an RXI concentrator/collimator, where RXI refers to combinations of reflective (R), refractive (X), and Total Internally Reflecting (I) surfaces.

BRIEF DESCRIPTION OF THE DRAWINGS

The present invention will be more readily understood from the detailed description of exemplary embodiments presented below considered in conjunction with the accompanying drawings. In the drawings:

FIG. 9 is a top plan view of the undersurface of the light extraction lens employed in FIG. 7, showing how different MSR prescriptions can be designed for different "zones" of the lens;

FIG. 13 is a side view of a light extraction lens used with the LED light assembly of FIG. 7, wherein the lens has a radius plus conic constant plus aspherical shape plus general polynomial shape;

FIG. 20 is a side view of a diffractive optical element (DOE) light extraction lens used with the LED light assembly of FIG. 7;

FIG. 22 is a side view of a biconic light extraction lens used with the LED light assembly of FIG. 7, shown in the z-y plane and having a spherical+conic constant B shape;

FIG. 29 is a top plan view in the x-y plane of a light extraction lens having a Multi-Focal Parabolic Concentrator surface, used with the LED light assembly of FIG. 7;

FIG. 30 is a top plan view in the x-y plane of a light extraction lens having a Multi-Focal Parabolic Concentrator surface, used with the LED light assembly of FIG. 7, in which each parabola is rotated to produce the composite lens;

FIG. 31 is a side view of multicolor LED assembly employing a micro fly's eye lenslet prescription, in accordance with another embodiment of the present invention;

FIG. 33 is a bottom plan view of the multicolor LED assembly of FIG. 31, employing hexagonal lenslets;

FIG. 34 is a bottom plan view of the multicolor LED assembly of FIG. 31, employing square lenslets;

FIG. 35 is a perspective view of the multicolor LED assembly of FIG. 31, employing rectangular lenslets with a global deformation applied to the lenslet array;

FIG. 36 is a bottom plan view of the multicolor LED assembly of FIG. 31, employing circular lenslets distributed randomly;

FIG. 39 is a top plan view of the multicolor LED assembly employing a Voronoi cell lenslet prescription of FIG. 38, showing the resulting lenslets in the presence of index of refraction differences between the underlying LED cavity and the overlying light extraction lens materials, wherein the lenslet geometry may include Zernike deformations;

FIG. 44 is a perspective view of the multicolor LED assembly employing reflective particles embedded in the light extraction lens, wherein the particles are oriented to produce a circular reflector tunnel in accordance with another embodiment of the present invention;

FIG. 45 is a top perspective view of a light extraction lens, where it is understood that the actual top surface shown in FIG. 45 may be replaced by any of the top surface designs of FIGS. 10-27 which can employ faceted geometry to further improve color uniformity;

FIG. 61a-e are views of multicolor LED assembly employing an RXI concentrator/collimator, in accordance with another embodiment of the present invention.

It is understood that the attached drawings are for the purpose of illustrating the concepts of the invention and may not be to scale.

DETAILED DESCRIPTION OF THE INVENTION

Figure 1:
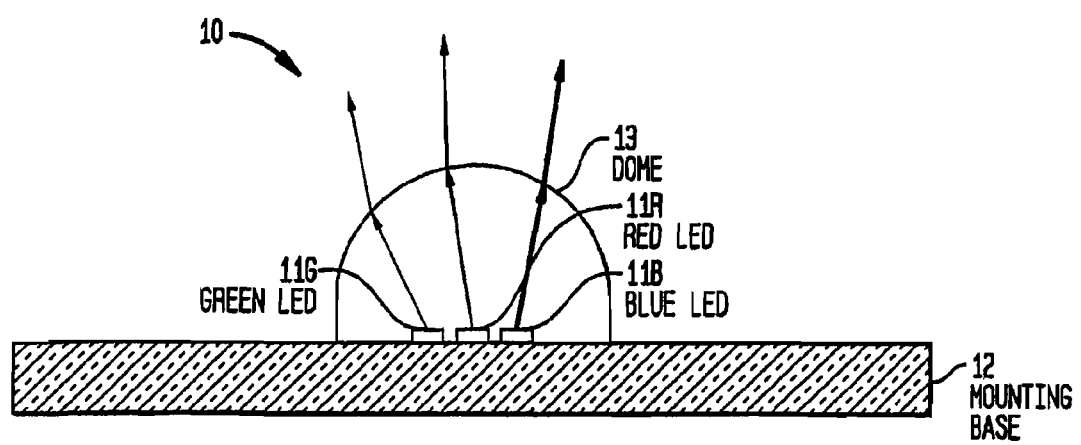
FIG. 1 is a schematic cross section of a conventional RGB LED assembly.
Figure 2:
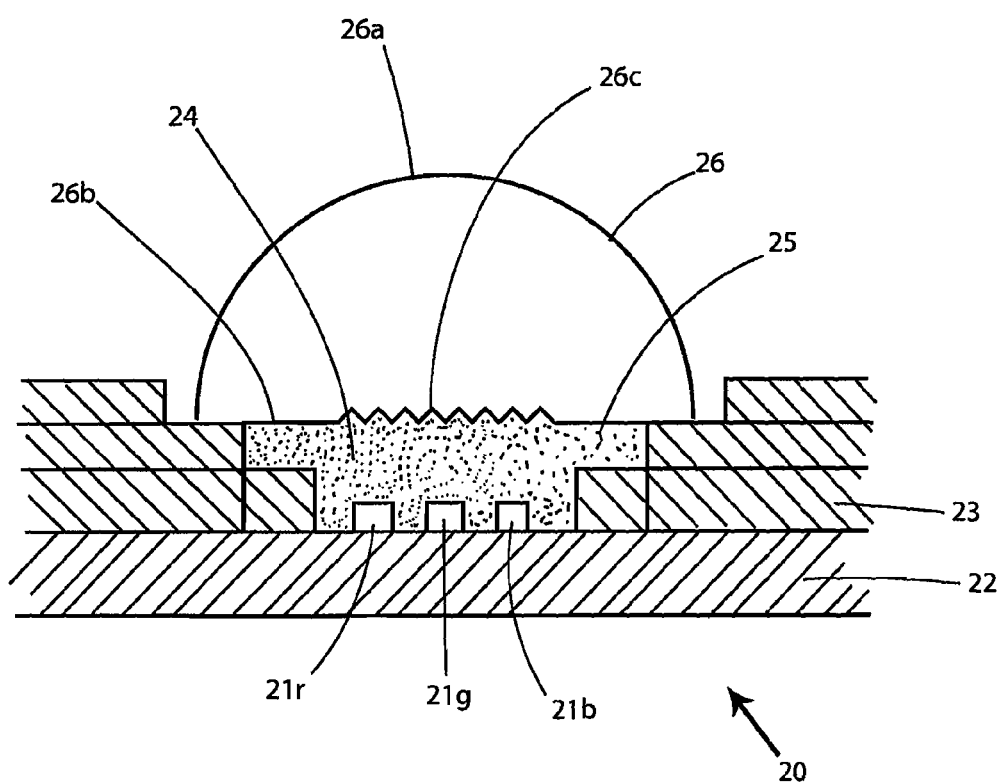
FIG. 2 illustrates an exemplary schematic cross-section diagram of a multicolor LED assembly, in accordance with an embodiment of the present invention.

Referring to FIG. 2, there is shown a schematic cross-section of a multicolor LED assembly 20, according to an embodiment of the present invention. The assembly 20 includes different color LEDs (e.g. 21R, 21B, 21G) that are packaged and configured for enhanced mixing of the light emitted from different color LEDs. The assembly 20 includes a mounting substrate 22 preferably made of metal, one or more overlying layers 23 preferably made of ceramic with an opening defining a surface cavity 24. A plurality of the LED die 21R, 21G, 21B are mounted in the cavity 24 and in thermal contact with the substrate 22. The LED die 21 can preferably be in direct contract with substrate 22 as shown in FIG. 2. Optionally, the LED die 21 can be in thermal contact with the substrate 22 through an intervening thermal-conductive layer (not shown) which preferably matches the coefficient of thermal expansion of the LED die 21, to minimize stress on the die due to expansion or contraction at a rate different from that of substrate 22. The cavity 24 is filled with an optically transmissive encapsulant 25 that surrounds the LED die 21. The encapsulant 25 is preferably a clear silicone or a clear epoxy or a clear acrylic casting resin.

Figure 3:
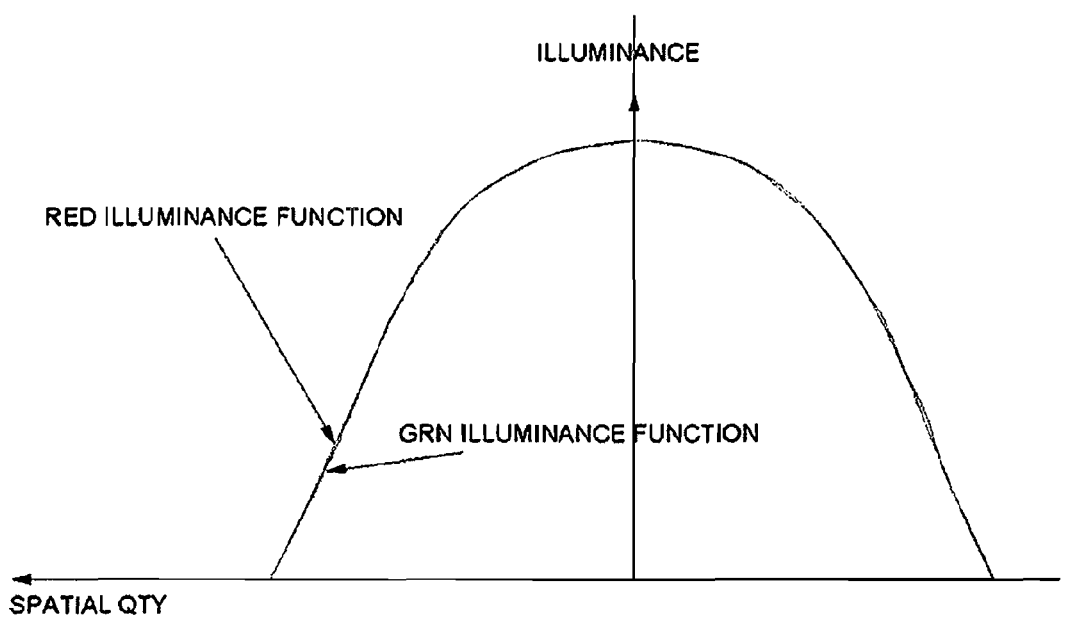
FIG. 3 is an ideal plot of illuminance vs. spatial quantity for the multicolor LED assembly of FIG. 2, in which there is nearly complete overlap of curves for each of the LEDs.
Figure 4:
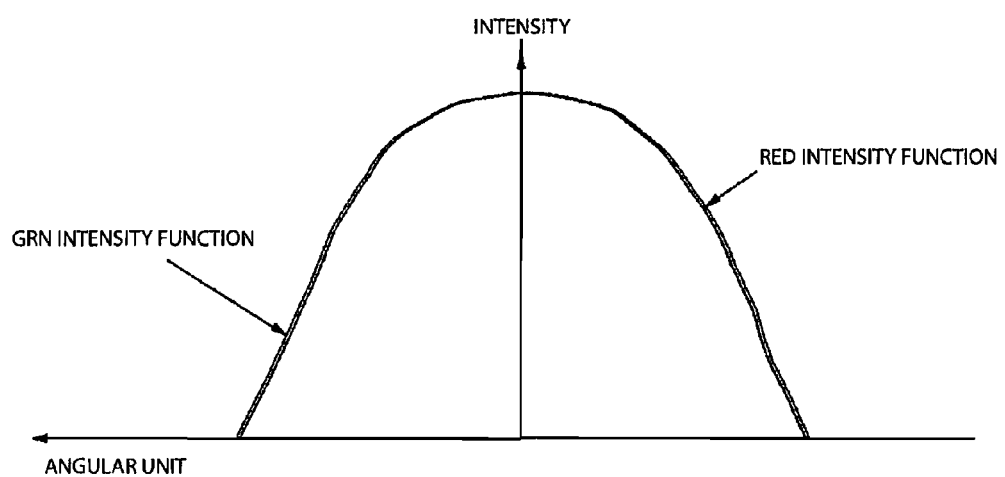
FIG. 4 is an ideal plot of luminous intensity vs. angle for the multicolor LED assembly of FIG. 2, in which there is nearly complete overlap of curves for each of the LEDs.
Figure 5:
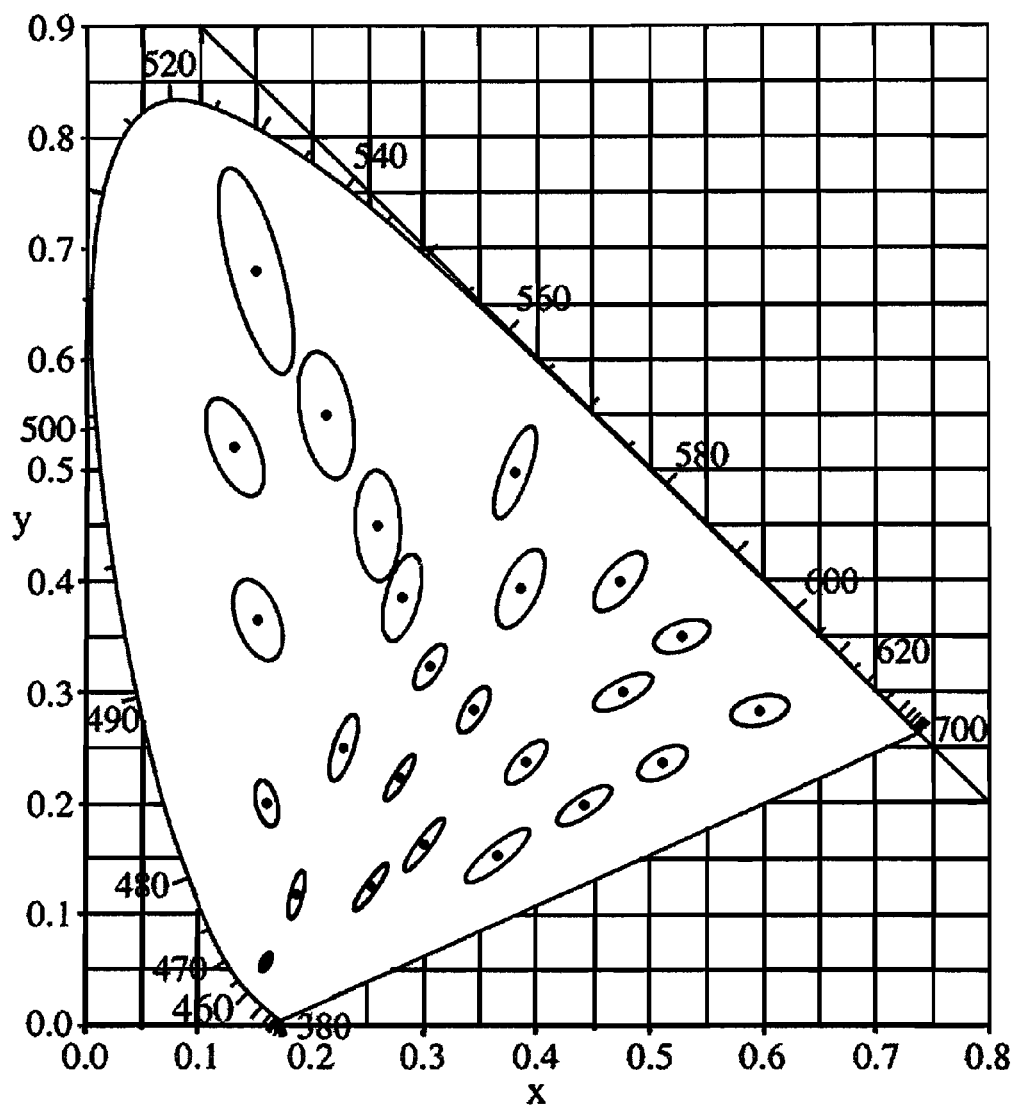
FIG. 5 is a chromaticity chart for the multicolor LED assembly of FIG. 2, showing MacAdam ellipses.

The LED assembly 20 is covered with a clear molded lens 26 having a top surface 26a and a bottom surface 26b. The lens 26 is preferably made of an injection molded polycarbonate, acrylic, nylon or silicone. The top surface 26a of the lens 26 may preferably be simple spherical shape, aspherical, or a more complex shape, depending on the desired radiation pattern of the primary optic to be described hereinbelow. The bottom surface 26b of the molded lens 26 is preferably contoured to provide and control the color mixing and improve on the optical efficiency of the assembly. Specifically the bottom surface 26b is sized and shaped such that there is nearly complete overlap of both illuminance (FIG. 3) and luminous intensity (FIG. 4) distribution functions for the color LEDs (e.g. 21R, 21B, 21G) having different spectral content and spatial placement. More particularly, as shown in FIG. 5, the deviation from complete overlap of colors plotted on a chromaticity chart, is smaller than the size of MacAdam ellipses, which indicate regions on a chromaticity chart which contain all the colors which are indistinguishable to the human eye. The color at the center of an ellipse shown in FIG.

5 is indistinguishable to the human eye from a color anywhere else within or on the perimeter of the ellipse.

The exact shape of the bottom surface 26b will depend on the size of the lens or dome 26, the number of LED die 21, the size of each LED die 21 and the location of each LED 21 relative to the central axis of the lens 26. In the preferred embodiment of the present invention, the LED die 21 is located as close to the central axis of the LED as possible, and the diameter of the lens's bottom surface 26b is relatively large with respect to the array of LED die 21.

It is noted that typically LED die 21 are located close together within the cavity 24 to enhance the optical efficiency of the LED array. However, in some circumstances there may be optical advantages for the LED die 21 to be spaced further apart depending on the desired radiation pattern. Additionally, it is noted that the LED array may include either one or multiple cavities, each filled with multiple LED die of different colors or phosphors.

Figure 6:
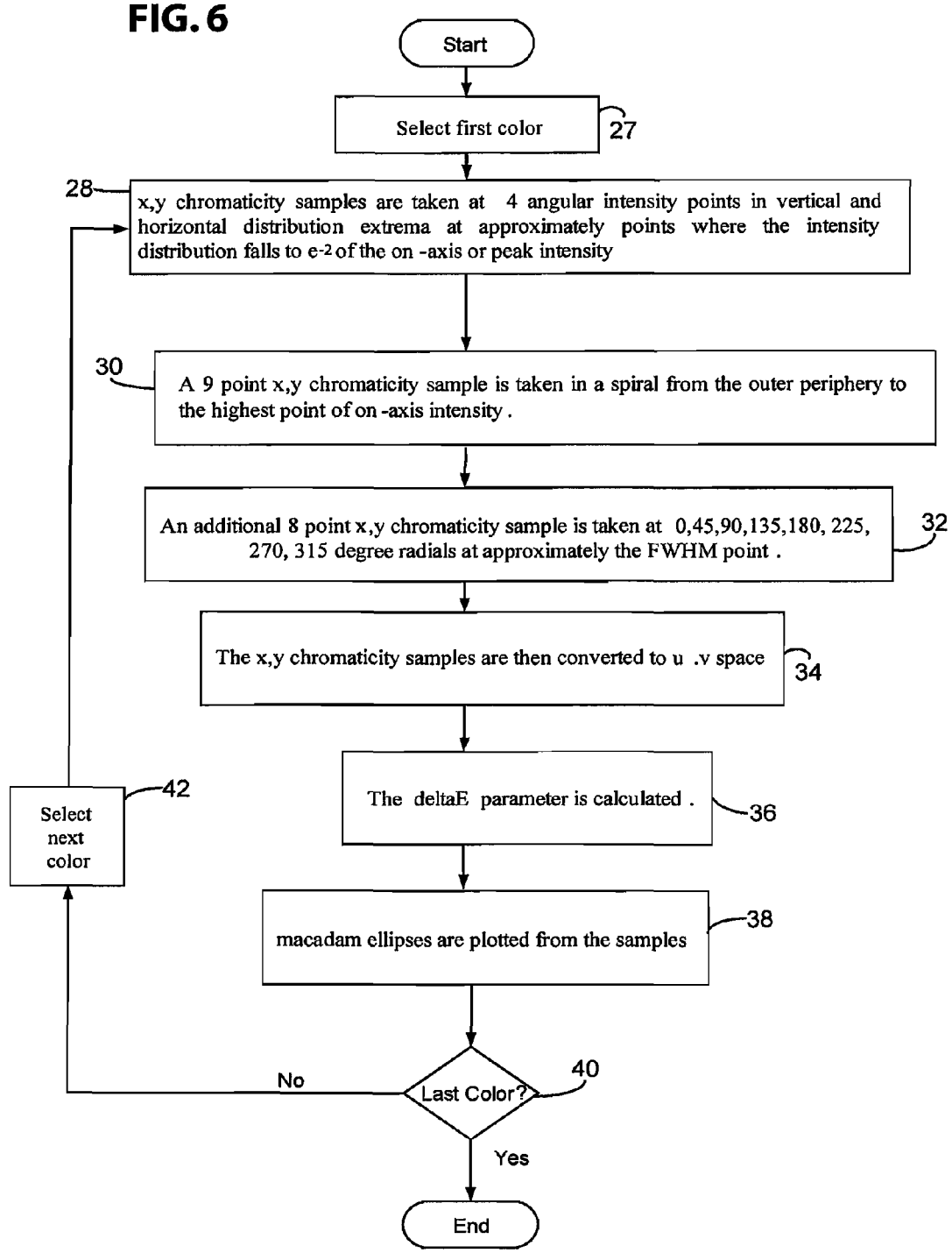
FIG. 6 is a flow chart showing the steps of obtaining a desired metric for determining acceptable color uniformity based on MacAdam Ellipses for the multicolor LED assembly of FIG. 2.

A metric for determining acceptable color uniformity based on MacAdam Ellipses is outlined in the steps of the flow chart shown in FIG. 6. At step 28, x,y chromaticity samples of the beam are taken at 4 angular luminous intensity points in vertical and horizontal distribution extrema at approximately points where the intensity distribution falls to $1/e^2$ of the on-axis or peak intensity. At step 30, a 9 point x,y chromaticity sample is taken in a spiral from the outer periphery to the highest point of on-axis luminous intensity. At step 32, an additional 8 point x,y chromaticity sample is taken at 0, 45, 90, 135, 180, 225, 270, 315 degree radials at approximately the full width at half maximum (FWHM) point. At step 34, the x,y chromaticity samples are then converted to u,v space. Transformation from x,y chromaticity space to the 1960 u,v space produces a closer correlation in distance between two color samples to the minimally perceived color difference. The transformation equations to convert x,y chromaticity coordinates to u, v coordinates include the following: $u=4x/(-2x+12y+3)$, $v=6y/(-2x+12y+3)$. At step 36, MacAdam ellipses are plotted from the samples. At step 38, a deltaE parameter is calculated. DeltaE refers to the magnitude of the color difference perceived between two color samples which are specified in terms of tristimulus values. Tristimulus values are the relative amounts of primary stimuli in red, green, and blue required to match an achromatic stimulus. The delta E parameter must be less than a 2-step MacAdam's ellipse or match/exceed the maximum field chromaticity difference of the standard. MacAdam ellipse refers to a chromaticity region in which the human eye cannot perceive the change in color. Approximately 65% of the population can detect chromaticity differences within two standard deviations or steps greater than the standard MacAdam ellipse. 95% can detect differences on the order of 3-steps or standard deviations from the ellipse, and 99% of the population can detect color differences on the order of 4-steps. The American National Standard Institute specifies a 4-step ellipse as the maximum chromaticity difference tolerance for fluorescent lamps. ANSI standard C78.376-2001. At step 40, if this is not the last color to be included in a mixture, then steps 32-38 are repeated for another color. For example, this process is repeated for Red+Green+Blue, or cyan, yellow, magneta. Red+Green+Blue will produce a color which is perceived as white. A white uniformity which is acceptable for a white source such as a fluorescent lamp produces color uniformity with deviation less than a 4-step MacAdam ellipse. When using more than one mixed primary color to produce white the tolerance is sometimes increased to as high as a 7 or 8-step ellipse. Analyzing the uniformity of Cyan, Magenta, and Yellow is one way of additive color uniformity analysis in which Red+Green=Yellow, Red+Blue=Magenta, and Blue+Green=Cyan. A white beam may be comprised of varying combinations of red, green, and blue or other alternative wavelength multi-primary sources all turned on at the same time to yield a color perceived as white. A color perceived as white requires more green according to the spectral response of the m cones. White color disuniformity occurs when the color temperature of the white light field has visible changes as perceived by the human eye in which some areas have more blue or red within the white composite. When trying to achieve high white color uniformity the process of analysis must include an additional constraint is added with regards to maximum acceptable Correlated Color Temperature (CCT) or x,y chromaticity differences over the illuminance or luminous intensity distributions. CCT is defined as the temperature of the blackbody radiator whose human perceived color most closely resembles that of the given radiator at the same brightness and under the specified viewing conditions when the chromaticity of the luminous sample is not exactly equal to any of the chromaticities of the blackbody radiator compared. Chromaticity differences in the spatial illuminance and spatial intensity are undesirable. The purpose of integrating color uniformity enhancement geometry in an LED is to minimize chromaticity differences as measured in x,y or u,v coordinates over the field of measurement.

Figure 7:
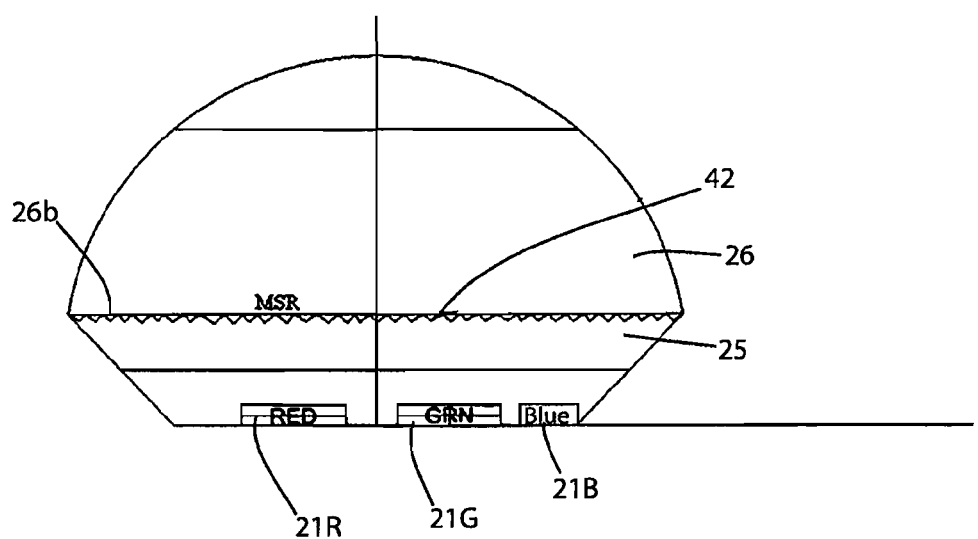
FIG. 7 is a side view of multicolor LED assembly employing a microsurface roughness prescription, in accordance with another embodiment of the present invention.

In one embodiment of the present invention, referred to in FIG. 7, the contoured bottom surface 26b of the lens 26 is designed to meet the criteria described in FIG. 5 according to a micro-surface roughness prescription, which is shown as a micro-surface roughness index difference interface (MSR) layer 42 between the encapsulant 25 and lens 26. The MSR layer 42 is a surface roughness feature which takes advantage of slight index of refraction difference between encapsulant 25 and the lens 26 to redistribute color specific phase of the light emanating from the color LEDs 21R, 21B, 21G. The MSR layer 42 serves to control the intensity of the light emanating from the color LEDs 21R, 21B, 21G as it propagates over distance. For example, if the intensity of one color beam is too narrow compared to another color, then the surfaces of the MSR layer 42 serve to spread the light of the one beam to overlap with the other beam.

The contours or textures of the individual microstructures that make up the shape of the MSR layer 42 can be described by a number of design conventions, which include V-cavity, Harvey Bidirectional Surface Distribution Function (Harvey BSDF), angle resolve scatter, phong, and user-defined BSDF in both isotropic and anistropic forms includes zones and combinations of both isotropic and anisotropic scatter prescriptions. For V-cavity, the MSR layer 42 can be described as a collection of V-shaped teeth or cavities when viewed head on. The surface roughness of the V-cavity is defined through the rms (root-mean-square) slope of the associated V-grooves. The V-groove cavities are distributed randomly and the slopes or the pitch of the cavities may follow a Gaussian normal probability distribution function. The slopes can be described mathematically by a roughness tailored slope error distribution function as follows:

$$[s\cos(u), s\sin(u), (\text{square root }(1-s^2))]; -1 < s < 1 \text{ and } -\pi < u < \pi$$

where "u" is uniformly distributed random number and "s" is a random number-influenced slope error probability distribution function.

Several slope error probability distribution functions may be used, including:

| M | Slope Distribution | (Maximum/RMS)$^2$ |
|---|---|---|
| −3 | Two Deltas | 1 |
| −2 | Lambertian | |
| −1 | Ramp | 2 |
| 0 | Uniform | 3 |
| 1 | Triangular | 6 |
| 2 | Gaussian-like | 9 |
| 3 | Cosine | 5 |
| 4 | Near-Gaussian | 15 |
| 5 | Gaussian | 2 * ln($2^{32}$) | where "M" defines the probability distribution for the normal interface ray, "Slope Distribution" may include Two Deltas, Lambertian, Ramp, Uniform, Triangular, Gaussian-like, Cosine, Near-Gaussian, or pure Gaussian. "Maximum" defines the maximum slope or height deviation. "RMS" is the root mean square of the distributed normal deviations.

Another way to describe the contours or textures of the individual microstructures that make up the shape of the MSR layer 42 is by a Harvey BSDF. A Harvey BSDF function is a non-random tailored micro-structure on the surface 26b of the lens 26 which allows the MSR layer 42 to redistribute scattered rays from a light source in such a manner that multi-LED luminous intensity and illuminance distribution functions overlap to a greater extent than if the structures were purely randomized. An "Isotropic model" for describing the shape of a MSR layer 42 is as follows:

$$BSDF = \left\{\frac{bf(B - B_o)}{1}\right\}^2 \quad f\{x\} = \sqrt{1 + x^2}$$

$$g^m BSDF = bf\left\{\frac{B - B_o}{lg^n}\right\}^2 \quad g = \frac{(C + C_o)}{2}$$

where "B" and "C" are the SIN [ ], and COS [ ] of the angle of scatter from the normal to the substrate 22 of the surface cavity 24 containing the LED die 21. "$B_o$" and "$C_o$" are the SIN [ ], and COS [ ] of the primary angle of specular scatter. "m" and "n" define surface roughness invariance parameters.

Figure 7A:
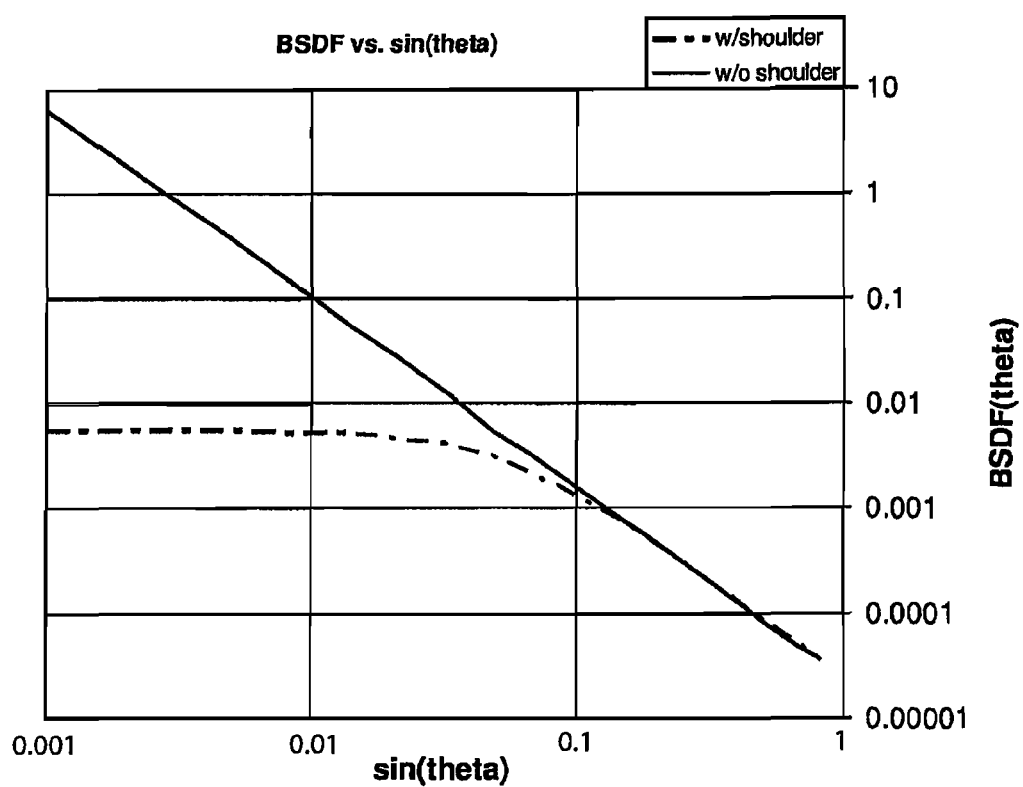
FIG. 7A is a graph of the Bidirectional Surface Distribution Function (BSDF) with and without shoulder points.

A "Full anisotropic Harvey model" describing the contours or textures of the individual microstructures that make up the shape of the MSR layer 42 can be defined by the function $$BSDF = bf\left\{\frac{A - A_o}{1}, \frac{B - B_o}{1^r}\right\}^2 f\{x, y\} = \sqrt{1 + x^2 + y^2}$$

where "b" is the maximum BSDF normal specular, and "f" is the asymptotic fall-off with angle. I and I' are the A-Ao, and B-Bo shoulder points in radians. The addition of shoulder point constants to the model allow the BSDF to better approximate the diffuse scatter zone properties over a range of angles. See FIG. 7A.

Generally to offer more control over the direction cosines of the ray bundles passing through the lens the MSR prescriptions require more general anisotropic control. For example a combination of phong and Harvey is:

$$BSDF = \sum_{i=1}^{N} \{p_i(A^2 + A_o^2) + q_1(B^2 + B_o^2) + a_1 A_o b_1 B B_o + c_i C C_o + d_1\}^{e_i}$$

$$C^2 = 1 - A^2 - B^2 = \cos^2\theta, \quad C_o^2 = 1 - A_o^2 - B_o^2 = \cos^2\theta_o$$

Where A, Ao, B and Bo refer to shoulder scatter points, pi, qi, a1, b1, ci, and d1 refer to anisotropic constants. θ and $\theta_o$ refer to the scatter and specular angles.

A specular ray is a sampling of the light field which strikes a mirror polished surface where the angle of reflection is equal to the angle of incidence. For multiple primary sources the surface roughness scatter is defined in terms of more than one wavelength or spectral distribution as follows:

$$BSDF(\lambda_2) = BSDF(\lambda_1)\left(\frac{\lambda_1}{\lambda_2}\right)^{(4+m)}$$

BSDF has dimensional units of inverse solid angle.

Another way to describe the contours or textures of the individual microstructures that make up the shape of the MSR layer 42 is by "angle resolved scatter" which describes a total integrated scatter (TIS) function at the surface of the MSR layer 42. The TIS function can be defined as the product of intrinsic surface roughness, the extrinsic measurement parameters of incident wavelength, the angle of incidence of the light emission from the wavelength specific sources, the material index and material index of refraction difference maximum, and the scattering angle. Integrating over 3D space produces the total integrated scatter (TIS) function as follows:

$$TIS = 1 - e^{\wedge}[-(2\pi\Delta n\delta/\lambda)^{\wedge}2] \cong (2\pi\Delta n\delta/\lambda)^{\wedge}2$$

where δ is the RMS surface roughness, Δn is equal to the maximum index of refraction difference between the encapsulant 25 and the lens 26, and λ is equal to the peak wavelength incident on the surface of the MSR layer 42.

In order to improve illuminance and intensity overlap of multi-color source distributions even further with an MSR prescription, it may be appropriate to add in a design scatter surface as follows:

$$F_s = F_o \rho(\theta_i, \phi_i; \theta_s, \phi_s) \frac{A\cos(\theta_e)\cos(\theta_s)}{n' R^2}$$

where $F_s$ is flux of the desired scattered rays emanating from the MSR surface, $F_o$ is the flux of incident rays entering the scatter design surface, $\rho(\theta_i, \phi_i, \theta_s, \phi_s)$ is the BSDF of the scatter surface 42 of the MSR layer 42 applied to the lens 26. A is the area of the scatter surface attractor. For multi-primary sources (LEDs 21), "A" defines the illuminance periphery of the specific color for which the second color must match after application of the tailored roughness surface design. n' defines the desired number of rays (first order approximation of light field) required to scatter and strike the attractor surface. R defines the distance from the scatter surface of the MSR layer 42 to the scatter design surface.

Another way to describe the contours or textures of the individual microstructures that make up the shape of the MSR layer 42 is by a phong. Phong refers to a broad peak scatter model or a model which takes into account combinations of both specular and diffuse scattering at the local reflection level. Phong scatter does not account for second-order reflections as does rigorous Monte-Carlo raytracing.

Figure 8A:
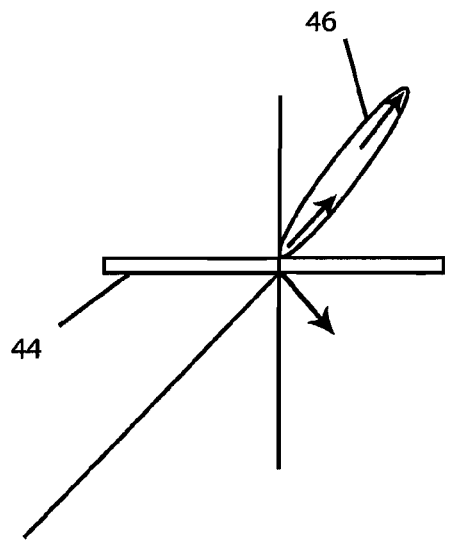
FIGS. 8A-8C are diagrams showing how energy is distributed from an incident ray through a surface employing a microsurface roughness prescription as it scatters from the surface of the multicolor LED assembly of FIG. 7.
Figure 8B:
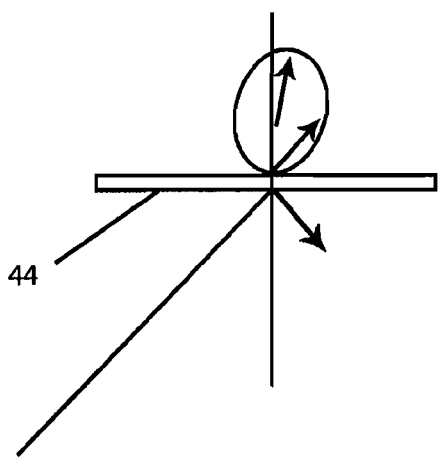
Figure 8C:
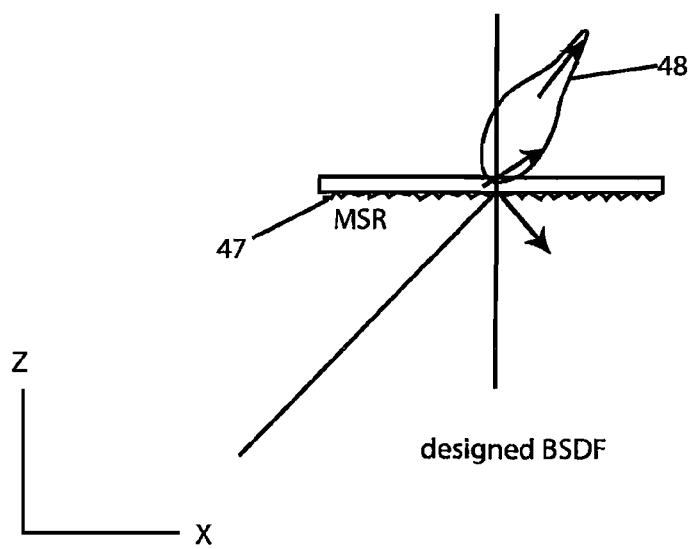

FIGS. 8A-8C show how energy is distributed from an incident ray through a surface as it scatters from a surface. In FIG. 8A, the surface 44 presents little scattering, so the resulting energy scatter vs. position 46 produces a narrow-shaped ellipse. For a random distribution of an MSR prescription (FIG. 8B), the light energy is scattered over a larger area but produces a smooth circular-like distribution. Referring to FIG. 8C, using a user-defined BSDF distribution of non-randomly distributed angular surfaces, transmission after refraction through the surface 47 with an MSR prescription is optimized for a resulting energy scatter lobe 48 that can approach the more narrow distribution surface of an unobstructed beam. The energy incident on a detector would not fall off as quickly as a randomly distributed surface so that better control of the spread of light is obtained and therefore there can be better control of color uniformity.

A user-defined BSDF function seeks to tune the A and B coefficients in the following equation) to produce a desired $\alpha$ and $\in$ angular and scatter lobe shape and width coefficients as follows:

$$f(\alpha,\in)=A_1+A_2\cdot\cos(\alpha)^{B_2}+A_3\cdot e^{-B_3(\alpha-\in)^2}+A_4\cdot e^{-B_4|\alpha-\in|}+A_5\cdot e^{-B_5|\alpha+\in|}$$

A1=isotropic scatter
A2=Lambertian scatter
A3=Gaussian scatter
A4=specular Gaussian scatter
A5=degree of retro-reflection
$\alpha$=width of scatter energy lobe as referenced from refractive angle
$\in$=exiting refractive angle The microsurface roughness prescription may also be described by such functions as forward Harvey, retro Harvey, Lambertian, Poisson distributed micro features, forward Phong, and retro Phong. Each of these roughness or scatter features may also be added or combined with each other.

The index of refraction difference between a material encapsulating a light emitter (the encapsulant 25) and a lens 26 is very important. Large differences in index of refraction have a large effect on light extraction and intensity distributions. For example, the index of refraction of semiconductor light emitters is very high (from 2.4-3.4) and therefore the desired encapsulant index of refraction is also high. As the index of refraction of the lens increases to match that of the encapsulant index of refraction, less light has the likelihood of encountering total internal reflections and thereby becoming reabsorbed by the light emitters. Small index differences improve the effectiveness of the micro-surface roughness prescription but may still be not enough to causes nearly total overlap of the illuminance and luminous intensity distribution functions of spatially distributed light emitters (the LEDs 21).

In such circumstances, different MSR prescriptions can be designed for different "zones" of a lens as shown in FIG. 9. The "zones" 49a-49d may have the form of stripes, polygons, or freeform peripheral shapes of arbitrary size and distribution. Each of the "zones" 49a-49d may have an optimized MSR prescription tuned to overlap color-specific illuminance and intensity distributions. For example, a red light emitter can have an MSR prescription which spreads the light as much as possible, while it may be more preferable for the prescription for a green and/or blue LED emitter to minimize the spreading of light through the MSR surface.

Figure 10:
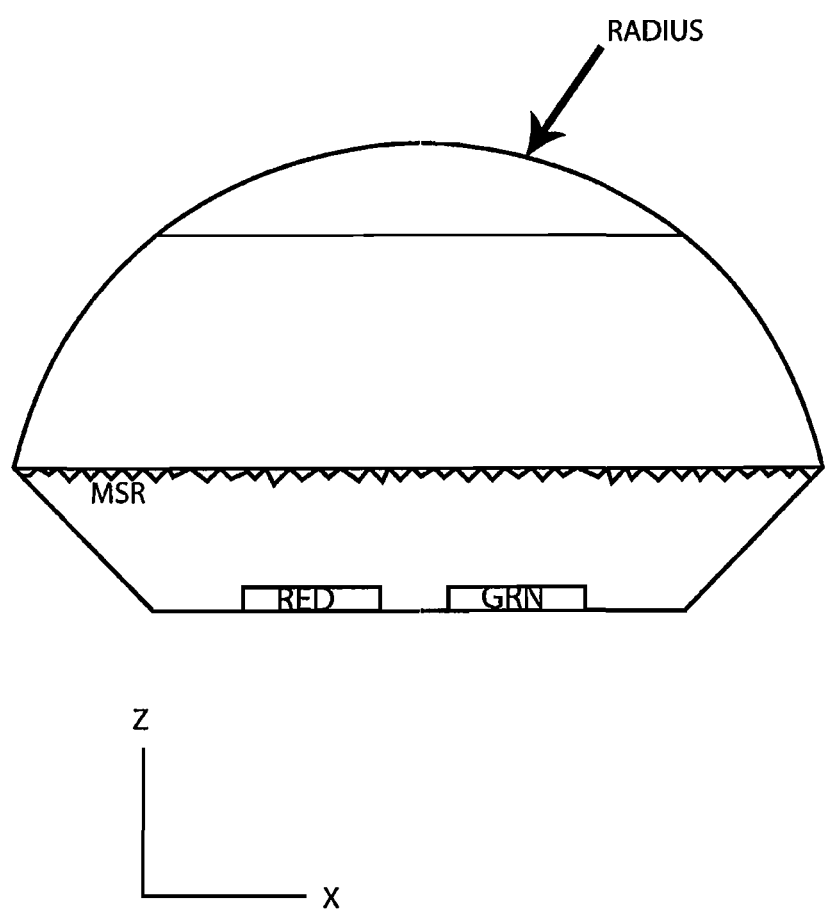
FIG. 10 is a side view of a light extraction lens used with the LED light assembly of FIG. 7, wherein the lens has a spherical shape.
Figure 11:
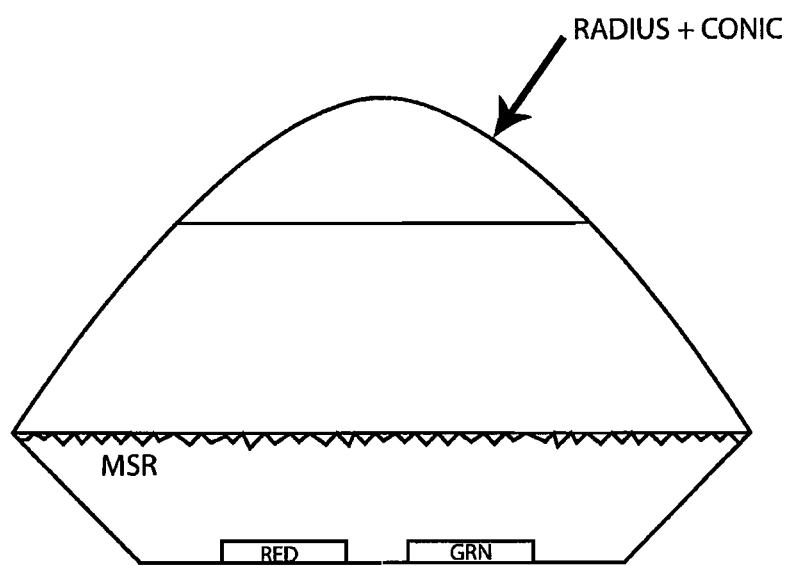
FIG. 11 is a side view of a light extraction lens used with the LED light assembly of FIG. 7, wherein the lens has a spherical radius plus conic constant shape.
Figure 12:
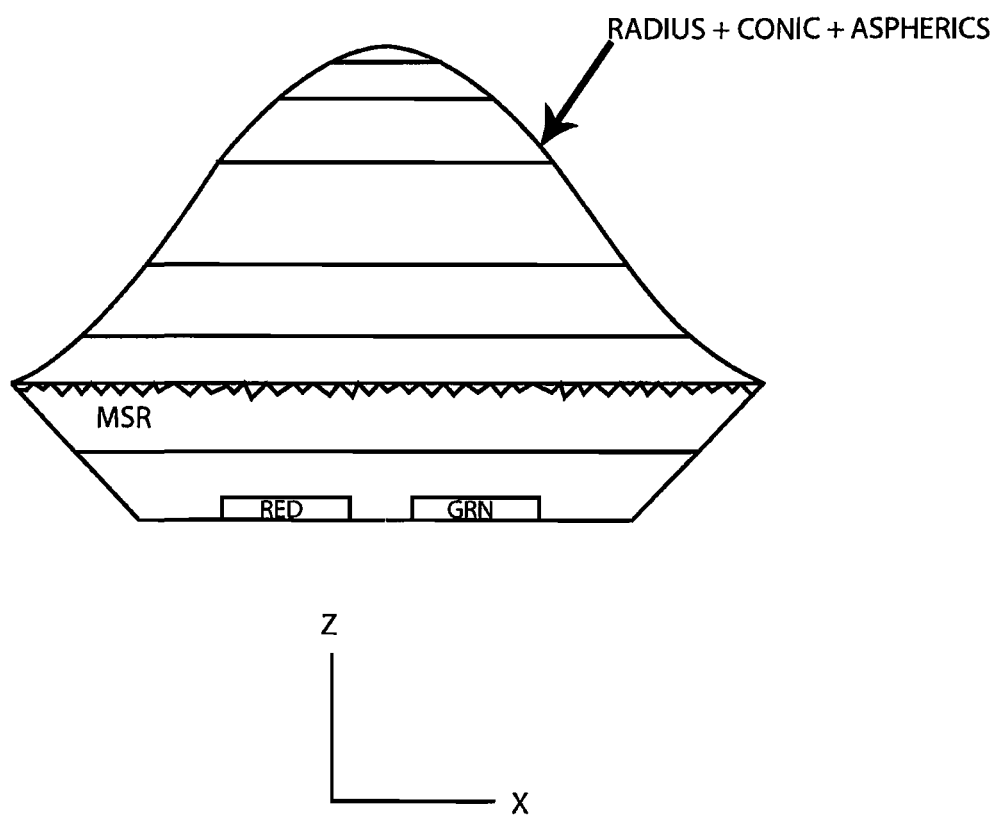
FIG. 12 is a side view of a light extraction lens used with the LED light assembly of FIG. 7, wherein the lens has a radius plus conic constant plus aspherical shape.
Figure 14:
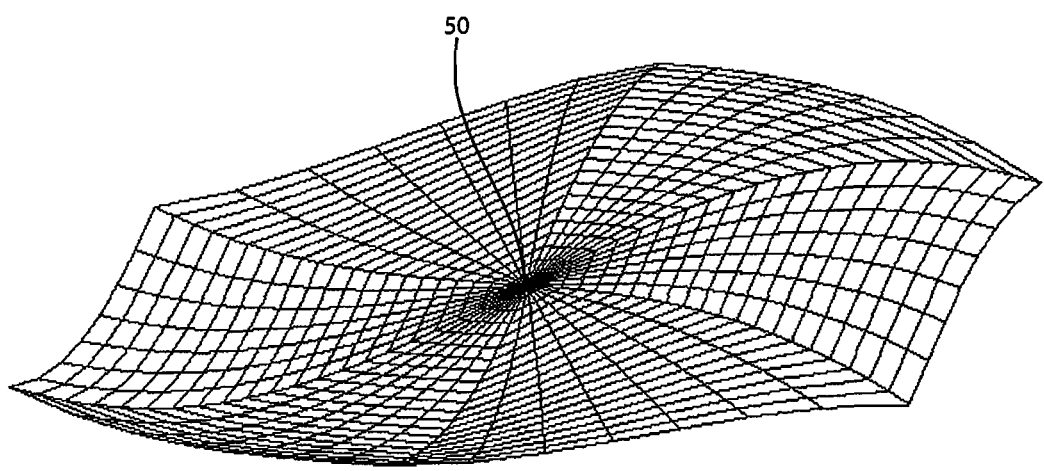
FIG. 14 is a perspective view of a light extraction lens used with the LED light assembly of FIG. 7, wherein the lens has a shape according to a global Zernike deformation.
Figure 15:
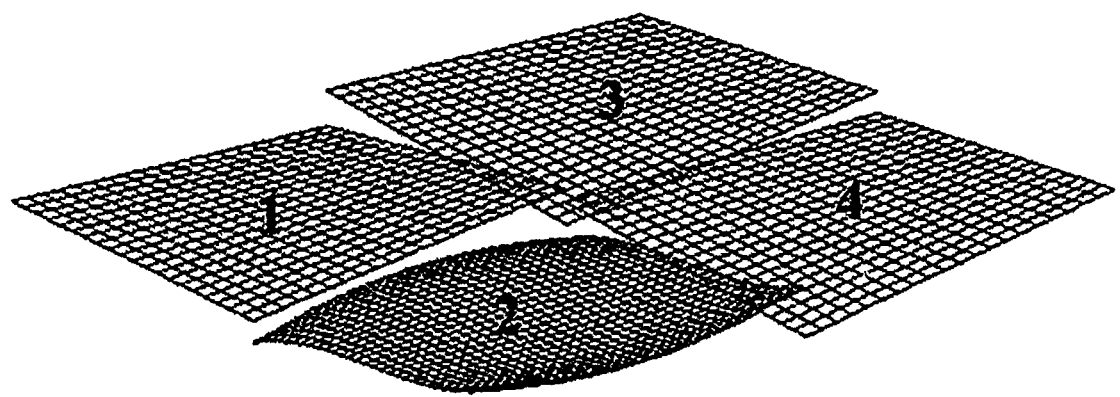
FIG. 15 is a perspective view of a light extraction lens used with the LED light assembly of FIG. 7, wherein the lens has a shape according to a plurality of different Zernike deformations.
Figure 17:
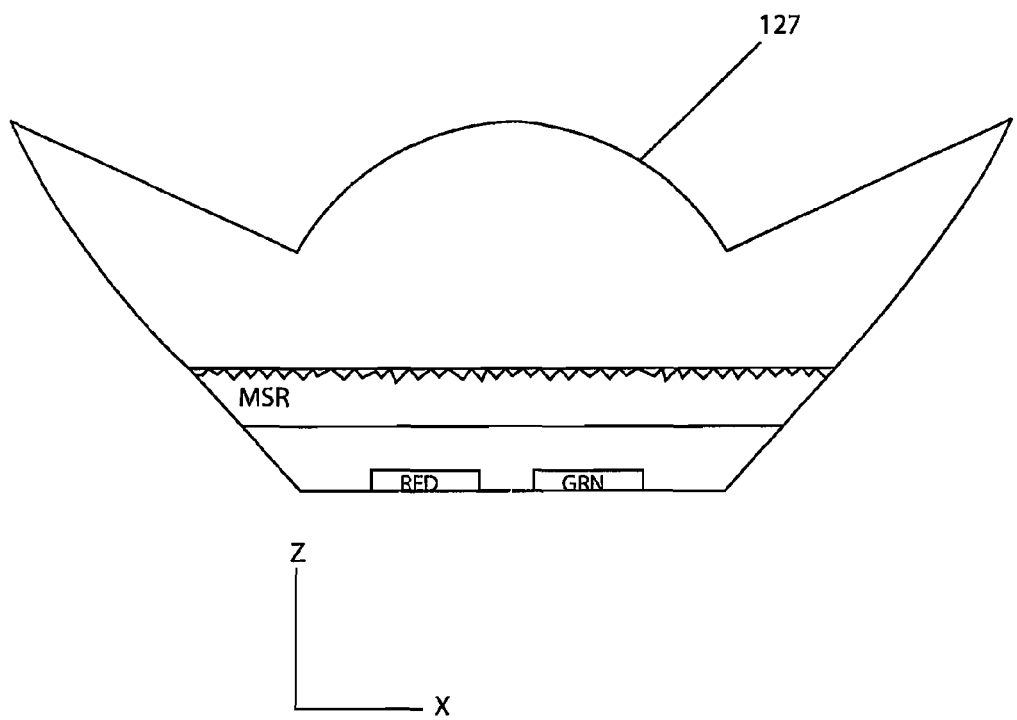
FIG. 17 is a side view of a total internal reflection (TIR) light extraction lens used with the LED light assembly of FIG. 7.
Figure 18:
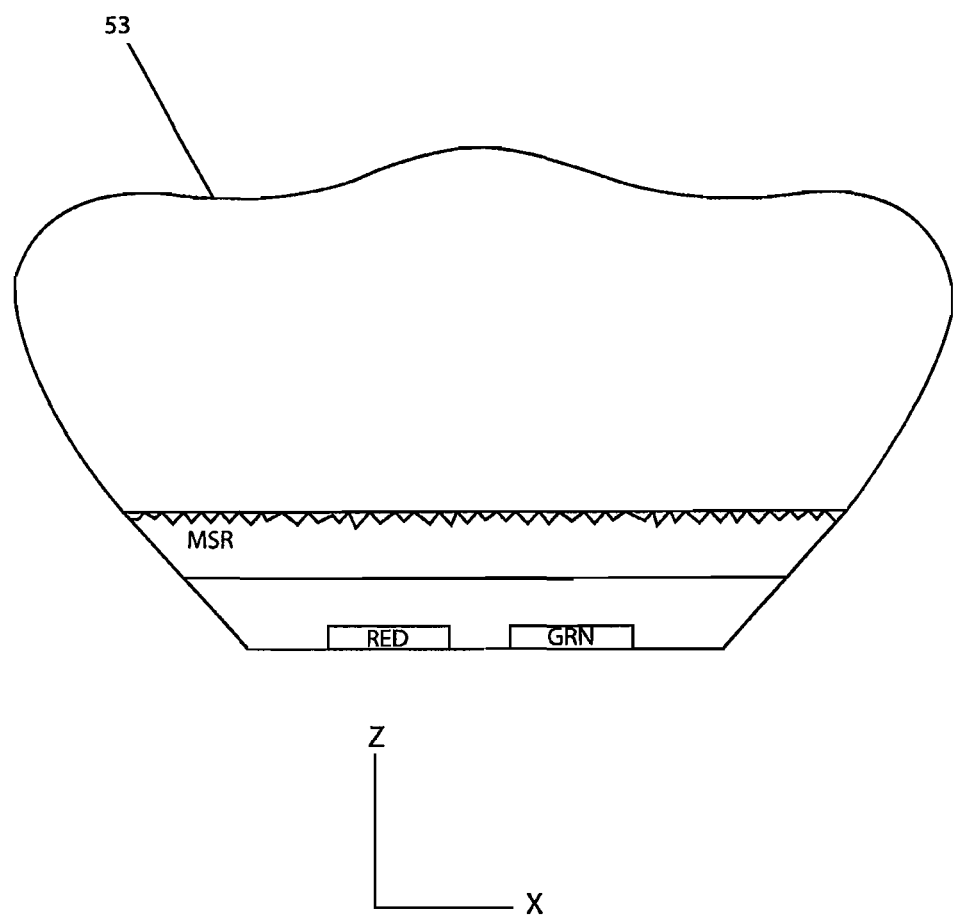
FIG. 18 is a side view of a light extraction lens used with the LED light assembly of FIG. 7, wherein the lens is described by a NURBS equation.
Figure 19:
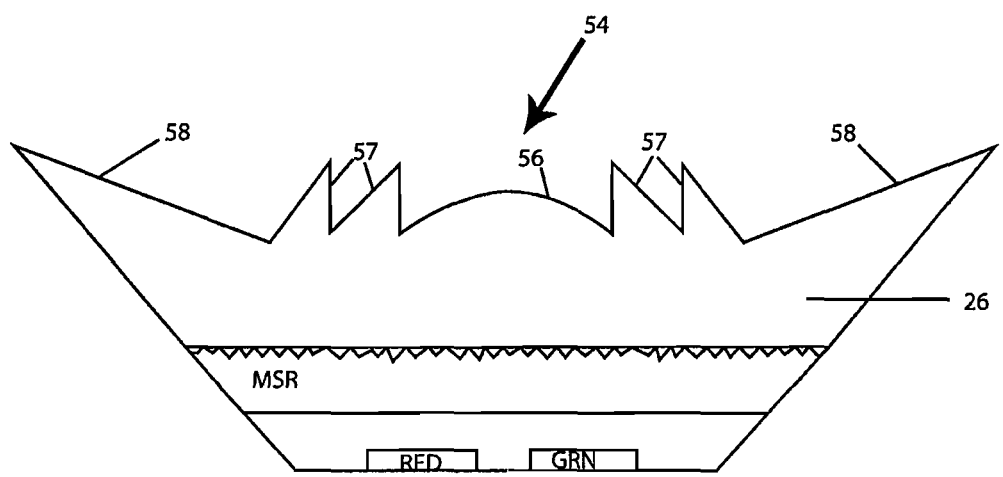
FIG. 19 is a side view of a light extraction lens used with the LED light assembly of FIG. 7, wherein the lens is a combination of a TIR lens and a Fresnel lens.
Figure 21:
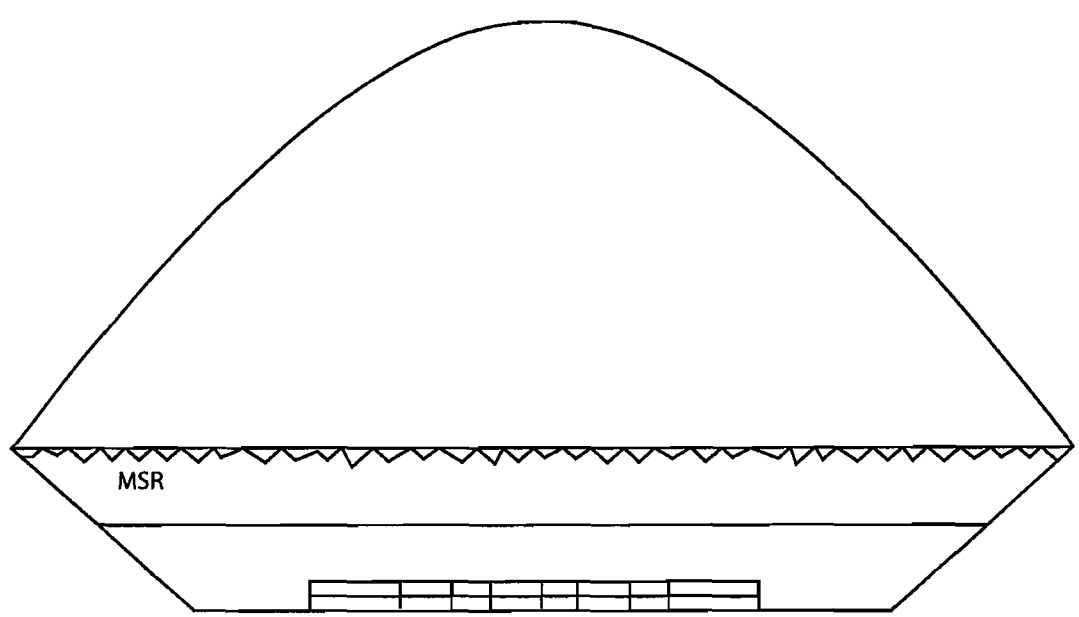
FIG. 21 is a side view of a biconic light extraction lens used with the LED light assembly of FIG. 7, shown in the z-x plane and having a spherical+conic constant A shape.
Figure 24:
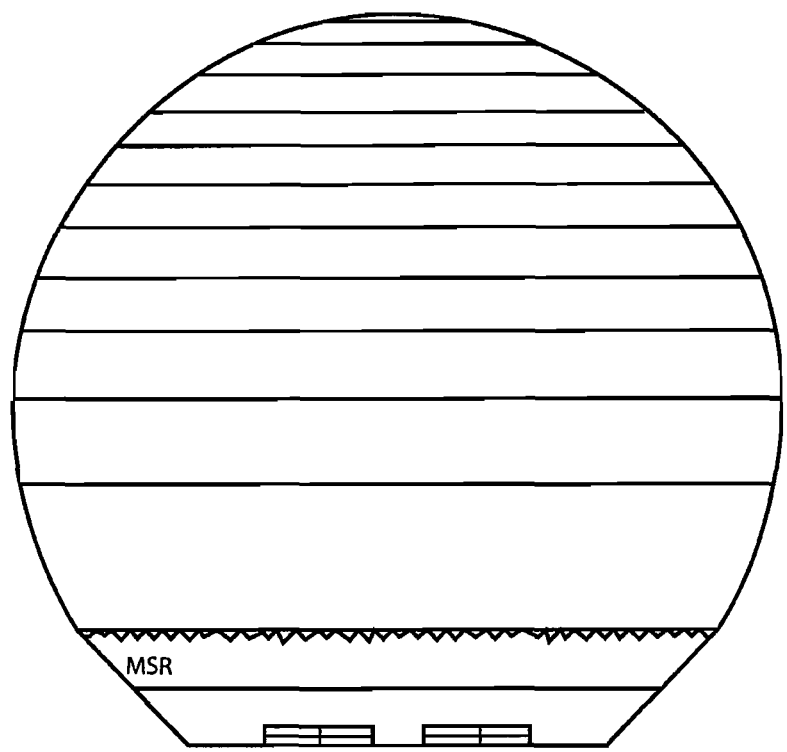
FIG. 24 is a side view of a cartoval light extraction lens used with the LED light assembly of FIG. 7.
Figure 25:
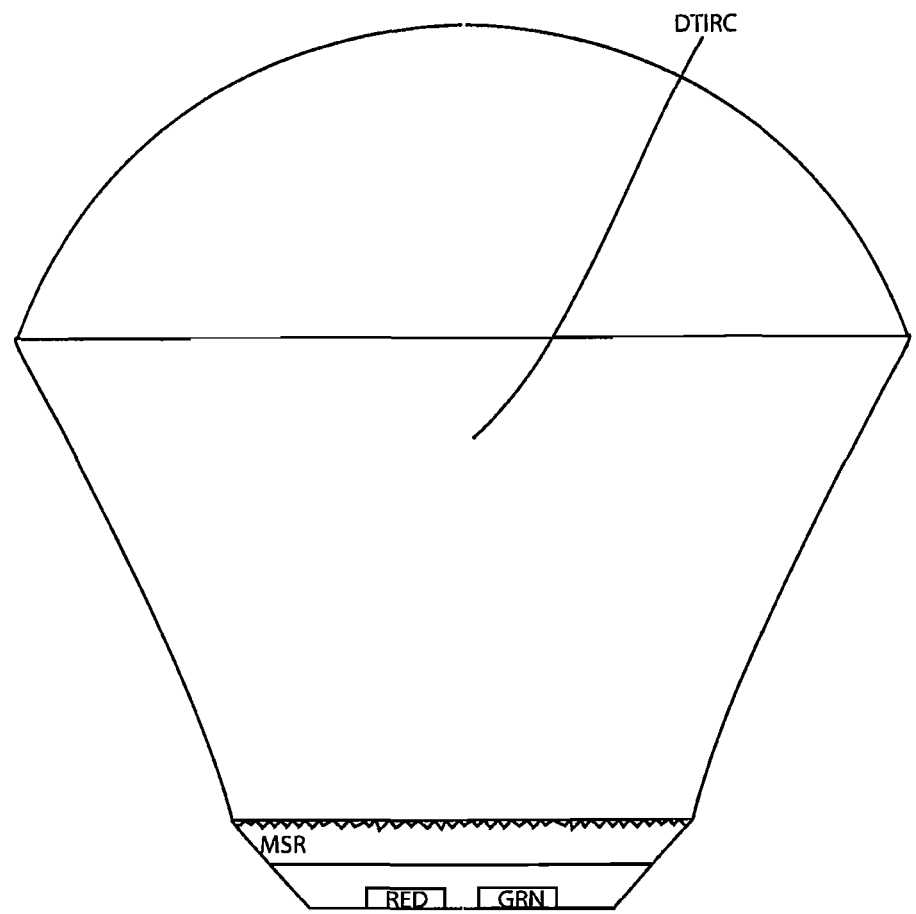
FIG. 25 is a side view of a light extraction lens having a Dielectric Total Internally Reflecting Concentrator (DTIRC) surface, used with the LED light assembly of FIG. 7.
Figure 26:
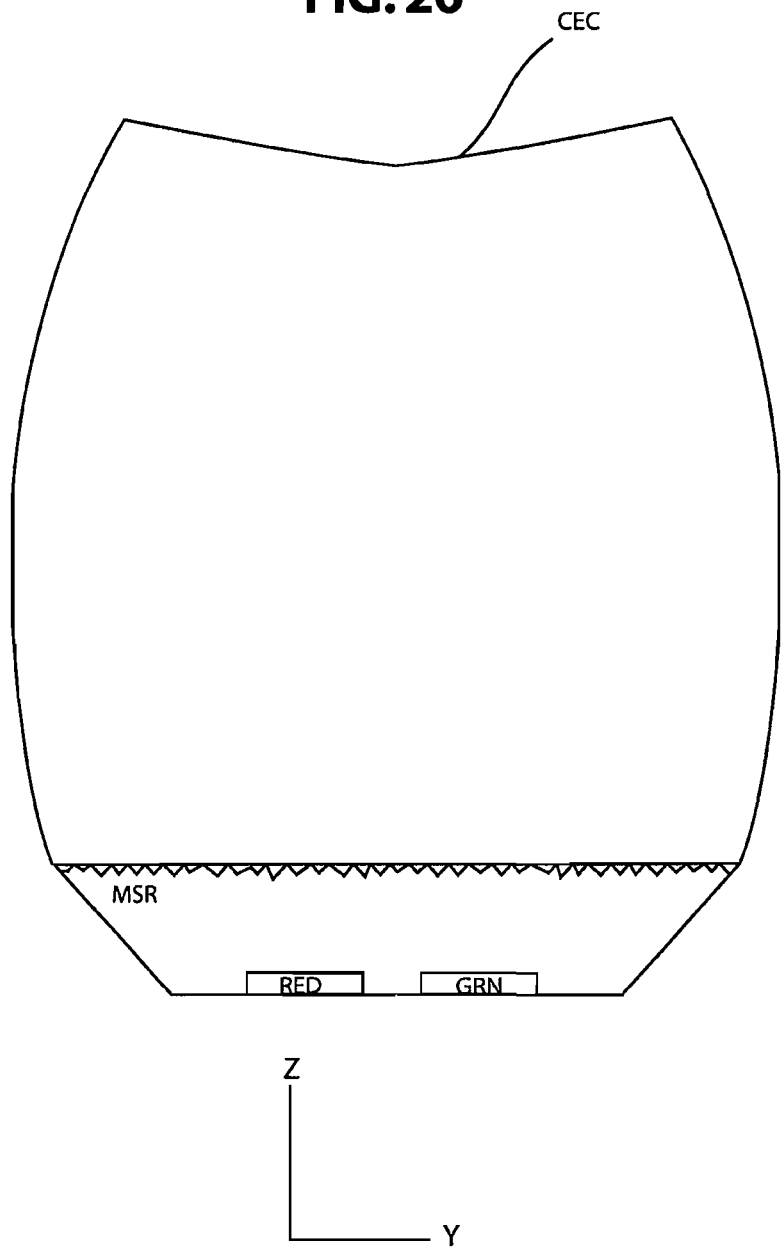
FIG. 26 is a side view of a light extraction lens having a Confocal Elliptical Concentrator surface, used with the LED light assembly of FIG. 7.
Figure 27:
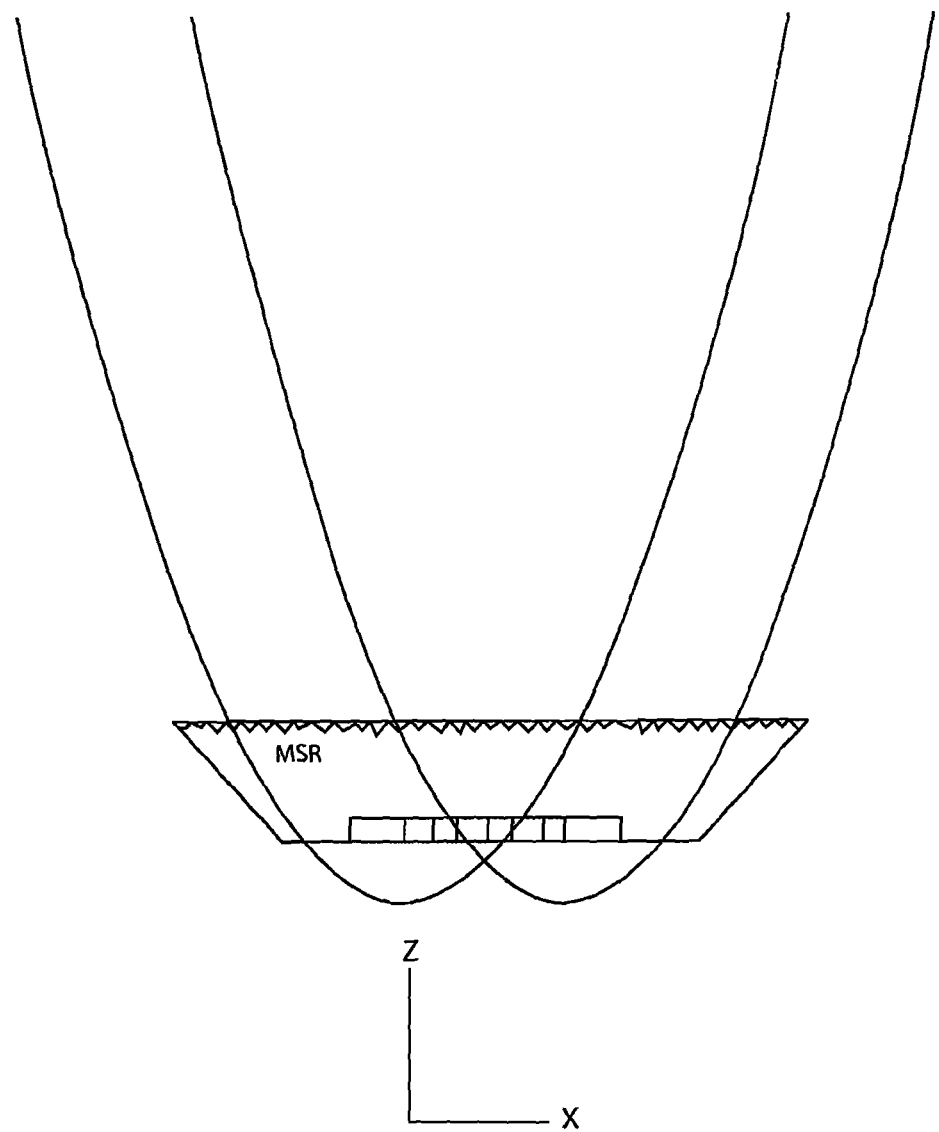
FIG. 27 is a side view in the z-x plane of a light extraction lens having a Multi-Focal Parabolic Concentrator surface, used with the LED light assembly of FIG. 7 with the isolines of the geometric solid shown in the figure.

The MSR features described in FIG. 7 may be applied to an optimized lens where the lens itself has a design prescription tailored to redistribute the light in order to improve color uniformity in the far field. Such lenses may take on various forms including but not limited to those forms listed in Table 1 and shown in FIGS. 10-30:

| LENS GEOMETRY | |
|---|---|
| RADIUS | FIG. 10 |
| RADIUS + CONIC | FIG. 11 |
| RADIUS + CONIC + ASPHERIC COEFFICIENTS | FIG. 12 |
| RADIUS + CONIC + ASPHERIC + GLOBAL GENERAL POLYNOMIAL | FIG. 13 |
| GLOBAL ZERNIKE DEFORMATION | FIG. 14 |
| DIOPTRIC TIR LENS | FIG. 17 |
| FREE-FORM NURBS DEFINED TIR LENS | FIG. 18 |
| FRESNEL + TIR LENS | FIG. 19 |
| DIFFRACTIVE OPTICAL ELEMENT LENS (DOE) | FIG. 20 |
| BICONIC | FIG. 21 |
| CARTOVAL | FIG. 24 |
| DTIRC LENS | FIG. 25 |
| CONFOCAL ELLIPTICAL CONCENTRATOR | FIG. 26 |
| MULTI-FOCAL PARABOLIC CONCENTRATOR | FIG. 27 |

The lenses of FIGS. 10-12 can be described by optical lens sag equations. A sag function describes the shape change of a lens over distance from the center of the lens. For the "radius" lens of FIG. 10 and the "radius plus conic constant" lens of FIG. 11, the sag function is defined as $$\text{sag}(\rho) = \frac{\rho^2/r}{1+\sqrt{1-(1+c)(\rho/r)^2}}.$$

$\rho$=radial coordinate
r=radius of curvature
c=conic constant

For the "radius plus conic constant plus aspheric coefficients" lens of FIG. 12, the sag function is defined as
$\rho$=radial coordinate
r=radius of curvature
c=conic constant
d, e, f, g, h, I, j, k . . . =aspheric coefficients In FIG. 13, the lens shape of FIG. 12 can be extended to include $n^{th}$ order general polynomial in three Cartesian coordinates such that $$f(X,Y,Z) = \sum_{i=0}^{N}\sum_{j=0}^{i}\sum_{k=0}^{j} c_{ijk}(X-x)^{i-j}(Y-y)^{j-k}(Z-z)^k = 0$$

In FIG. 14, the lens shape can be described by Zernike polynomials. Zernike polynomials are a sequence of polynomials that are orthogonal on the unit disk. There are even and odd Zernike polynomials. The even Zernike polynomials are defined as $$Z_n^{-m}(\rho,\phi)=R_n^m(\rho)\cos(m\phi),$$

and the odd Zernike polynomials are defined as $$Z_n^{-m}(\rho,\phi)=R_n^m(\rho)\sin(m\phi),$$

where m and n are nonnegative integers with m≥n, $\phi$ is the azimuthal angle in radians, and $\rho$ is the normalized radial distance. The radial polynomials $R_n^m$ are defined as $$R_n^m(\rho) = \sum_{k=0}^{(n-m)/2} \frac{(-1)^k(n-k)!}{k!((n+m)/2-k)!((n-m)/2-k)!}\rho^{n-2k}$$

for n−m even, and are identically 0 for n−m odd.
For m=0, the even definition is used which reduces to $R_n^m(\rho)$.

Figure 16:
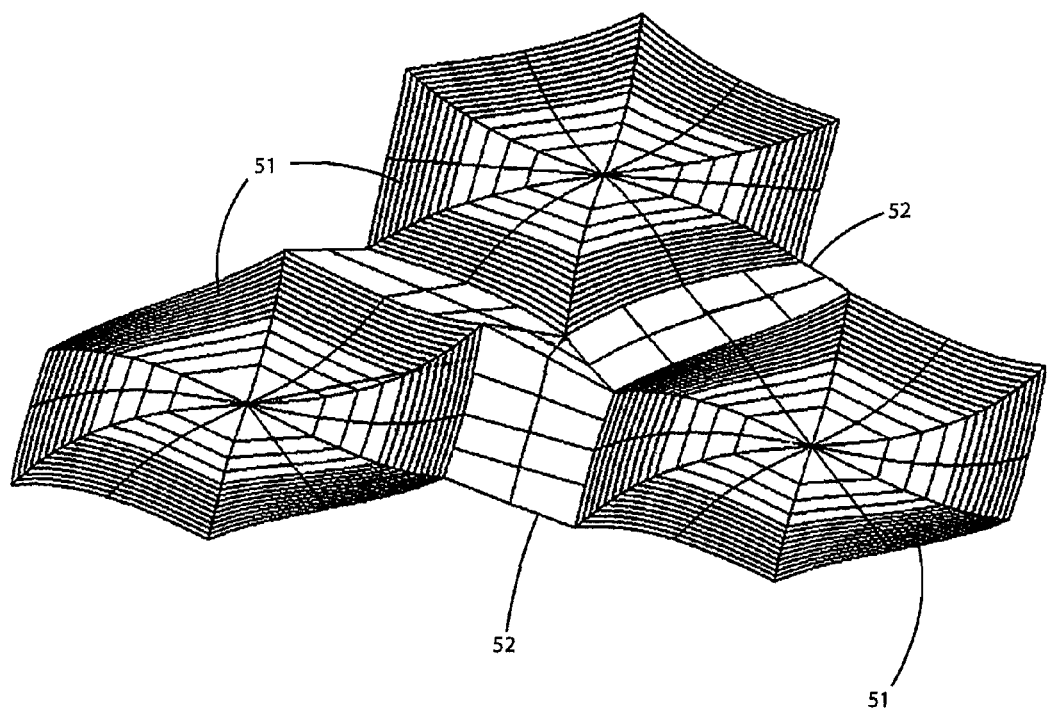
FIG. 16 is an illustration of a lens shape formed of a plurality of Zernike polynomial lenzlet cells joined by surfaces described by Non-Uniform Rational B-Spline (NURBS) geoemntry.

Zernike polynomials can be used to describe wavefronts of optical sources. In optometry and opthalmology, the Zernike polynomials are used to describe aberrations of the cornea or lens from an ideal spherical shape, which result in refraction errors. They are commonly used in adaptive optics for telescopes where they can be used to effectively cancel out atmospheric distortion. In the present context, one or more Zernike polynomials can be used to describe an optical control surface of a lens. Although Zernike equations are only defined within the unit circle optical control zones comprising the Zernike shape may be truncated at the aperture pupil 50 of the lens by circular, rectangular, hexagonal, general polynomial, or freeform peripheral shapes. As an extension, in FIG. 15, a lens can be constructed of a plurality of Zernike control surfaces of either the same or different polynomials. In FIG. 16, the lens shape can be formed of a plurality of Zernike polynomial lenslet cells 51 joined by surfaces 52 described by Non-Uniform Rational B-Spline (NURBS) geometry. An equation describing the NURBS surface geometry used to blend Zernike polynomial cells is as follows:

$$C(u) = \frac{1}{\sum_{i=0}^{n} N_{i,p}(u)w_i} \sum_{i=0}^{n} N_{i,p}(u)w_i P_i$$

where C(u) represents a Bezier curve where u is a parametric parameter,
where i represents a Bezier curve of order equal to 0,
where n represents the maximum Bezier curve order,
where $w_i$ represents a control point weighting parameter,
where $P_i$ represents a control point number, and
where $N_{i,p}(u)$ represents a normalized basis function.

In FIG. 17, the MSR prescription is combined with a total internal reflection lens (TIR) to collimate the light exiting from the top 127 of the lens. A TIR lens of this type is described in Spigulis, Applied Optics, Vol. 33, No. 25, 1 Sep. 1994, which is incorporated herein by reference in its entirety.

In FIG. 18, the control surface 53 of the lens is itself described by a NURBS equation.

FIG. 19 shows a control surface 54 of the lens 26 described by a combination of a TIR lens and a Fresnel lens. The refractive phase induced by the central convex surface 56 is now unfolded into a Fresnel lens 57 and combined with an outer TIR lens surface 58 which reduces the overall volume of the combination lens.

FIG. 20 shows an MSR prescription used in conjunction with a diffractive optical element (DOE) lens. The refractive phase inducing element perturbs the direction cosines of the light ray to manipulate the intensity and illuminance distribution function of the light field. The phase of the light ray refers to the amount of deviation of the light ray path from the unit direction vectors in the x, y, and z directions. A DOE lens element can be produced through a kinoform diffractive structure 59 in which active dimensions of such structures are on the order of the wavelength of light. In other embodiments, a DOE lens can be produced using a holographic patterned grating structure. In still other embodiments, an array of varying DOE structures can be produced in which each of the DOE lenses is tailored to operate at a specific wavelength spectral band where light transfer efficiency is highest.

Figure 23:
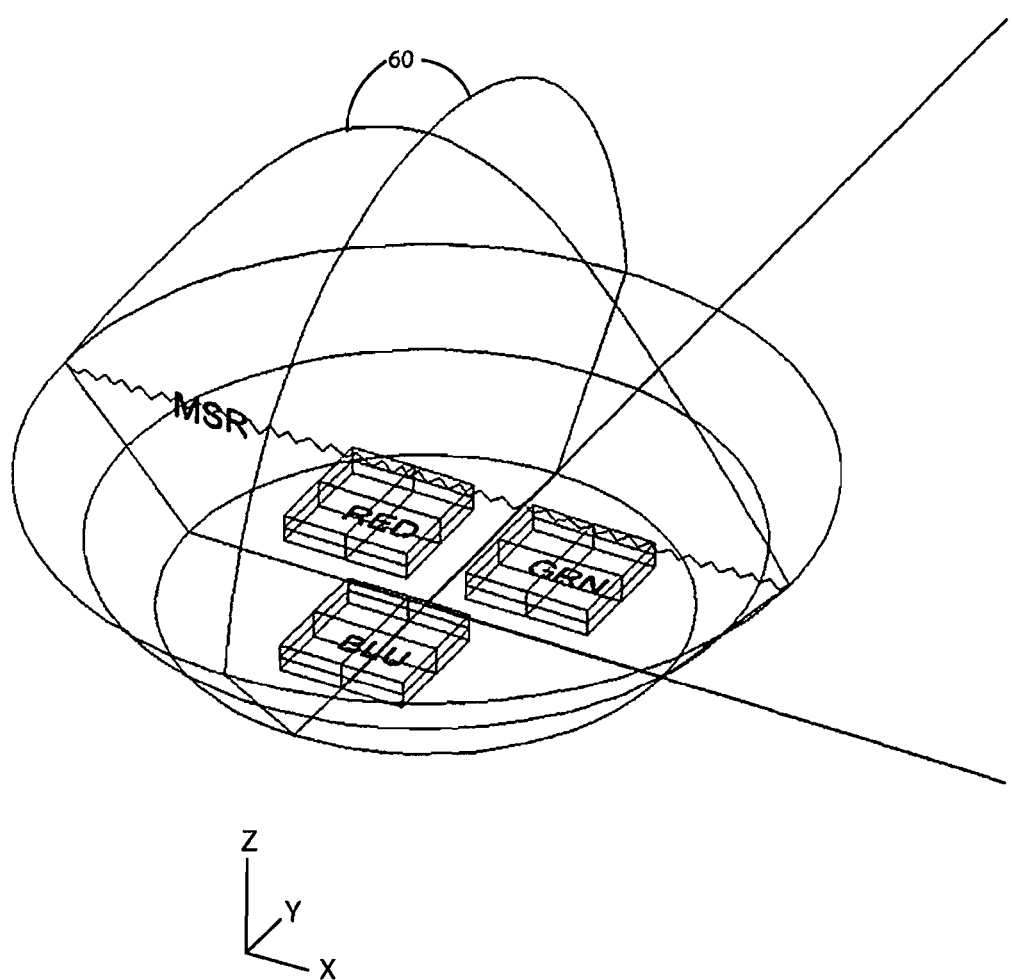
FIG. 23 is a perspective view of the biconic light extraction lens of FIGS. 21 and 22 illustrating the use of two different spherical radii and two different conic constants A and B.

FIGS. 21-23 show different views of a biconic lens. The biconic lens shown combines two or more conic constant-shaped lenses that are rotationally symmetric but have different shapes along different axes in Cartesian coordinates. With such a lens, light is spread into an elliptical beam having more light in one direction than another direction. This is useful for strip LED lights where an array of LED dice are aligned along one axis such that the longer axis of the lens is aligned with the axis of the die to improve color uniformity. FIG. 21 shows a biconic lens projected along the ZX axis, which has a parabolic shape, while the same biconic lens projected along the ZY axis in FIG. 22 has a semicircular shape. FIG. 23 is a perspective view of the biconic lens whose upper surface 60 can be described by the equation:

$$z = \frac{c_x x^2 + c_y y^2}{1 + \sqrt{1 - (1+k_x)c_x^2 x^2 - (1+k_y)c_y^2 y^2}},$$

$c_x$ refers to a constant weighting factor in the x direction
$c_y$ refers to a constant weighting factor in the y direction
x refers to the spatial dimension in the x direction
y refers to the spatial dimension in the y direction
$k_x$ refers to the conic constant in the x direction polynomial
$k_y$ refers to the conic constant in the y direction polynomial FIG. 24 shows an MSR prescription used in conjunction with a cartoval-shaped lens whose control surface can be described by the equation in Cartesian coordinates as follows:

$$[b(x^2+y^2)-2cx+b]^2+4bx+k^2-2c=2c(x^2+y^2).$$

A Cartesian oval or cartoval is a quartic curve consisting of two ovals. $b=m^2-n^2$, $c=m^2+n^2$ where m and n are positive real numbers, k is positive and always real. mr+/−nr'=k, where r and r' are radial distances from the focii of the two ovals.

FIG. 25 shows an MSR prescription used in conjunction with a Dielectric Total Internally Reflecting Concentrator (DTIRC) surface, which is described in by Ning, Winston, and Gallager in "Dielectric Total Internally Reflecting Concentrators," Applied Optics, Vol. 26, No. 2, 15 Jan. 1987, which is incorporated herein by reference in its entirety. The DTIRC surface can be described in Cartesian coordinates by the following sets of equations:

$x=R \sin(\theta)+l_2 \sin(\theta')$;

$y=H-l_2 \cos(\theta')+R[\cos(\phi)]$.

$X_{j+1}=[H+R \sin(\theta)-Y_i X_i \tan(\theta_c+\theta')-R \sin(\theta)\cot(\theta')]/[\tan(\theta_c+\theta')-\cot(\theta')]$; (B1)

$Y_{i+1}=(X_{i+1}-X_i)\tan(\theta_c+\theta')+Y_i$. (B2)

x and y are spatial coordinates defining the surface of the collimator or concentrator, R is the radius of curvature of the lens $R=d_1/(2 \sin(phi))$ where d1 is the entrance diameter of the lens, $l_2$ is the optical path length of a reference ray after the initial TIR reflection at the collimator dielectric/air wall to the exit refraction point. H is the height of the DTIRC. Xi and Yi refer to the coordinates of a point on the P2, P3 side profile in which the P3 is the input radius aperture and P2 a point on the hyperbolic profile. $\ominus_c$ is the TIR critical angle, $\ominus$ is the angle of the reference ray with respect to the vertical axis. $X_{j+1}$ refers to the next connected recursion point in the x spatial direction on the collimator. $Y_{i+1}$ refers to the next connected recursion point in the y spatial direction.

FIG. 26 shows an MSR prescription used in conjunction with a "Compound Elliptic Concentrator" (CEC) surface as described in U.S. Pat. No. 3,957,031 which is incorporated herein by reference in its entirety. In FIG. 26, the CEC surface has altered totally-internally-reflecting walls formed by an equiangular spiral. The geometry is then folded upon itself to reconcentrate the light at the second elliptic foci. The MSR structure serves to redistribute the multi-focal planes to create improved color specific overlap at the second foci which in turn improves multi-primary illuminance and intensity distribution overlap.

Figure 28:
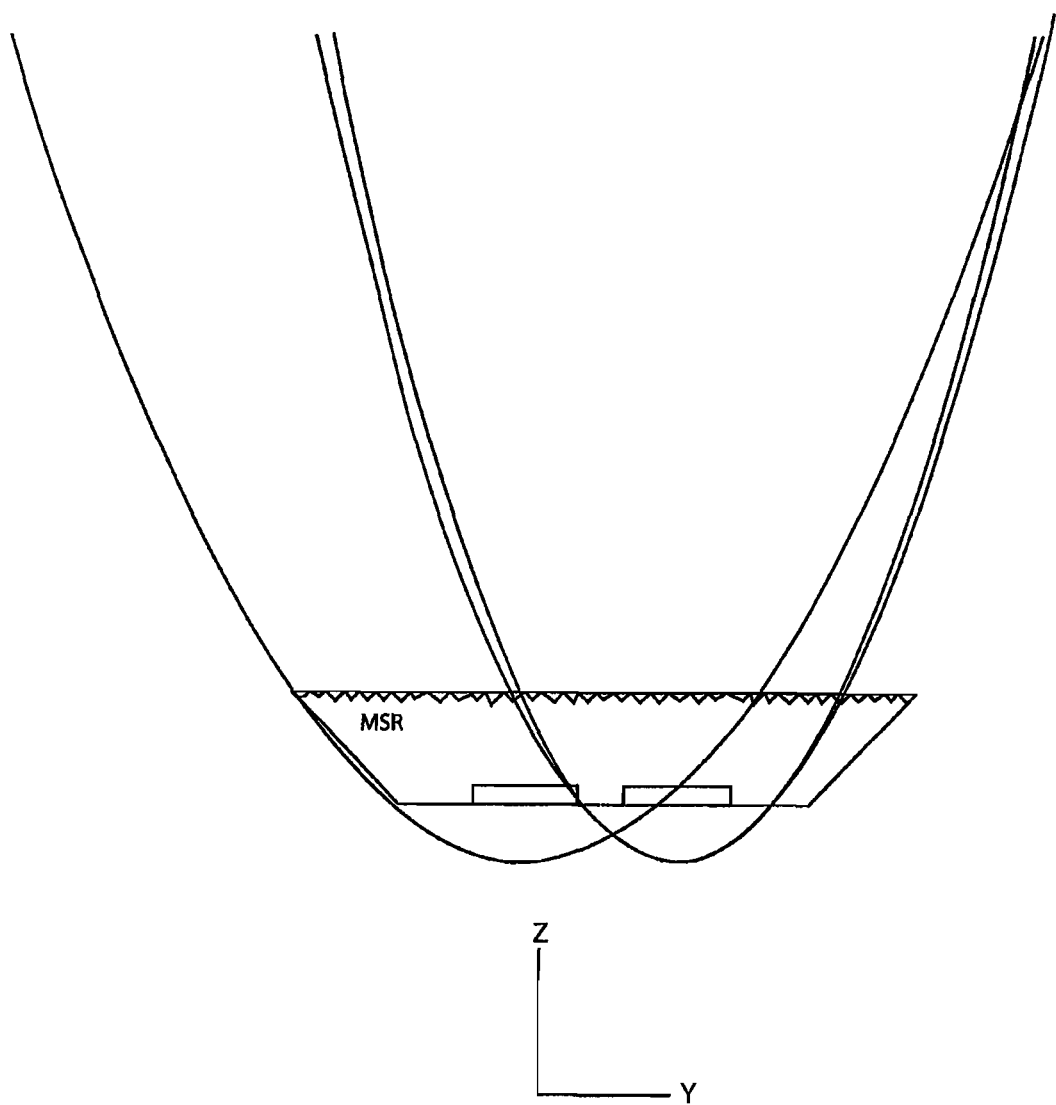
FIG. 28 is a side view in the z-y plane of a light extraction lens having a Multi-Focal Parabolic Concentrator surface, used with the LED light assembly of FIG. 7 with the isolines of the geometric solid shown in the figure.
Figure 32:
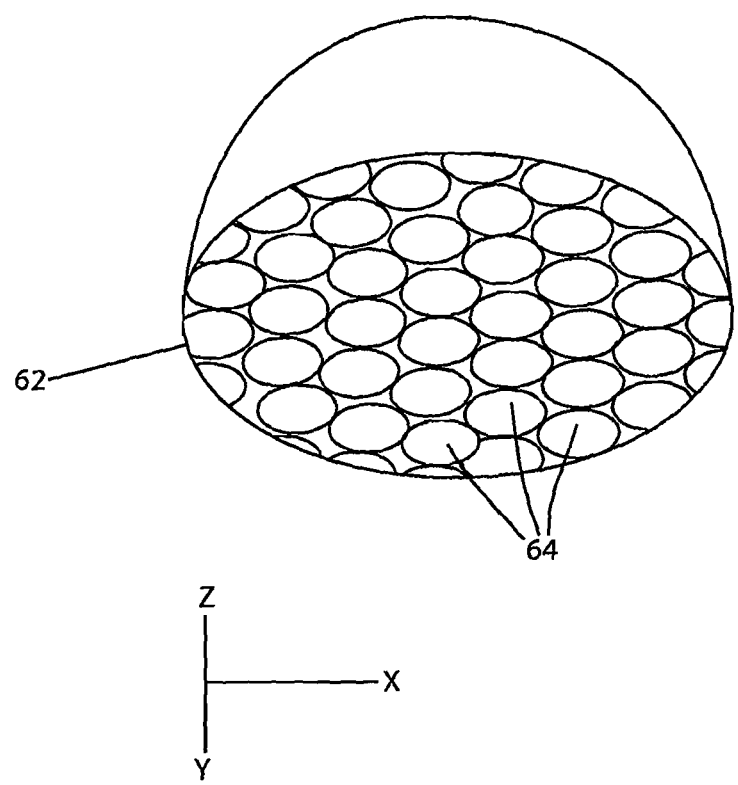
FIG. 32 is a bottom perspective view of multicolor LED assembly of FIG. 31.

FIGS. 27-30 show an MSR prescription used in conjunction with a Multi-Focal Parabolic Concentrator (MFPC) surface, which is essentially a multi-focal, multi-primary optic variant of a DTIRC surface of FIG. 25 in which a parabolic surface is rotated about its primary axis with each of the dies of a multi-die emitting device placed at a respective focus of one of the paraboloids. FIG. 27 is a projection of the MFPC along the ZX plane, while FIG. 28 is a projection along the ZY plane. FIG. 29 is a top view showing the emitters at a corresponding one of the foci of a paraboloid, and FIG. 30 shows each parabola rotated to produce the composite lens. The MFPC surface breaks rotational symmetry to match the multi-primary die layout.

FIGS. 31-36 depict another embodiment of the present invention. Elements illustrated in FIG. 31-36 which correspond to the elements described above in connection with the embodiment of FIGS. 2-30 which have similar structure and function have been identified with like numbers.

Referring now to FIGS. 31-36, the contoured bottom surface 26b of the lens 26 is designed to meet the criteria described in FIG. 6 according to a micro-lenslet array, which is shown as a micro fly's eye lenslet array layer 62 between the encapsulant 25 and lens 26. The micro fly's eye lenslet array layer 62, like the MSR prescription feature, takes advantage of slight index of refraction difference between the encapsulant 25 and the lens 26 to redistribute color specific phase of the light emanating from the color LEDs 21R, 21B (not shown), 21G. The index of refraction of the micro fly's eye lenslet array layer 62 may be higher or lower than the primary index of refraction of the encapsulant 25 encapsulating the LEDs 21R, 21B, 21G. Micro-fly's eye lenslet arrays operate in a similar fashion similar to the compound eyes of a fly. The single lens of the human eye focuses light on the fovea of the retina. The segmented compound eyes of a fly have a plurality of lenslets which focus light through many rhabdoms to photoreceptors. These structures or ommatidia are distributed over the compound eye. The micro-fly's eye lenslet array analogously makes a single LED light source appear to be emanating from a plurality of light sources. The lenslets 64 function by introducing micro-caustics which serve to disperse the light of a specific wavelength.

Each lenslet 64 can have a variety of shapes, including any arbitrary polygon which may include hexagons (FIG. 33), squares (FIG. 34), rectangles (FIG. 35), circles (radius), radius plus conic constant, aspheric, free-form NURBS, or Zernike polynomial-shaped cells. FIG. 35 demonstrates that a global deformation can be applied to the lenslet array. The deformation may be described by a Zernike polynomial or other multi-axis general polynomial. FIG. 36 shows that the cells may be distributed in a random fashion.

FIGS. 37-40 show a variation on the lenslet array concept of FIGS. 31-36 according to another embodiment of the present invention, in which the individual polygonal cells can be replaced by lenslets of more natural form. These cells are called Voronoi cells and a micro-lenslet array constructed from them have the shape and overall distribution and pattern of a Voronoi diagram. In a Voronoi diagram (see FIG. 38), a plane with "n" points is partitioned into convex polygons (cells) such that each polygon contains exactly one generating point and every point in a given polygon is closer to its generating point than to any other. A Voronoi diagram is sometimes also known as a Dirichlet tessellation. A tessellation is generally defined as a repeating pattern of similar or identical shapes which fills a surface. The cells are called Dirichlet regions, Thiessen polytopes, or Voronoi polygons. A point within each polygonal region is a point of higher interest where LE emitters are positioned. The size of the polygons is smallest and the distribution of the polygons is densest in the areas near the positions of the emitters. Voronoi or Dirichlet tessellation boundaries are formed from the orthonormal bisectors of the connections between the points. The bisectors are found by taking the complex hull of the points in two dimensional space after projection onto a three-dimensional paraboloid. These points in the set from which is formed the Voronoi tessellation boundaries can be perturbed in spatial position through a statistical Poisson distribution to further homogenize the light composed of multiple primaries. An algorithm highlights primary color concentration points as areas of importance for lenslet formation.

Figure 37:
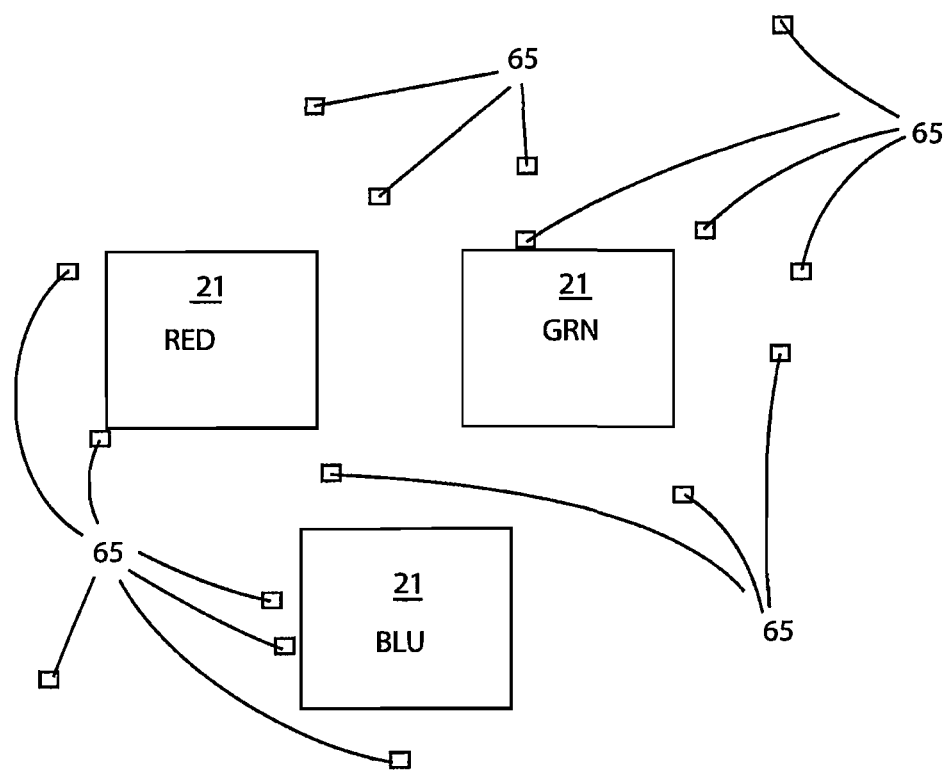
FIG. 37 is a top plan view of the multicolor LED assembly employing a Voronoi cell lenslet prescription, showing points of interest above the LEDs, in accordance with another embodiment of the present invention.
Figure 38:
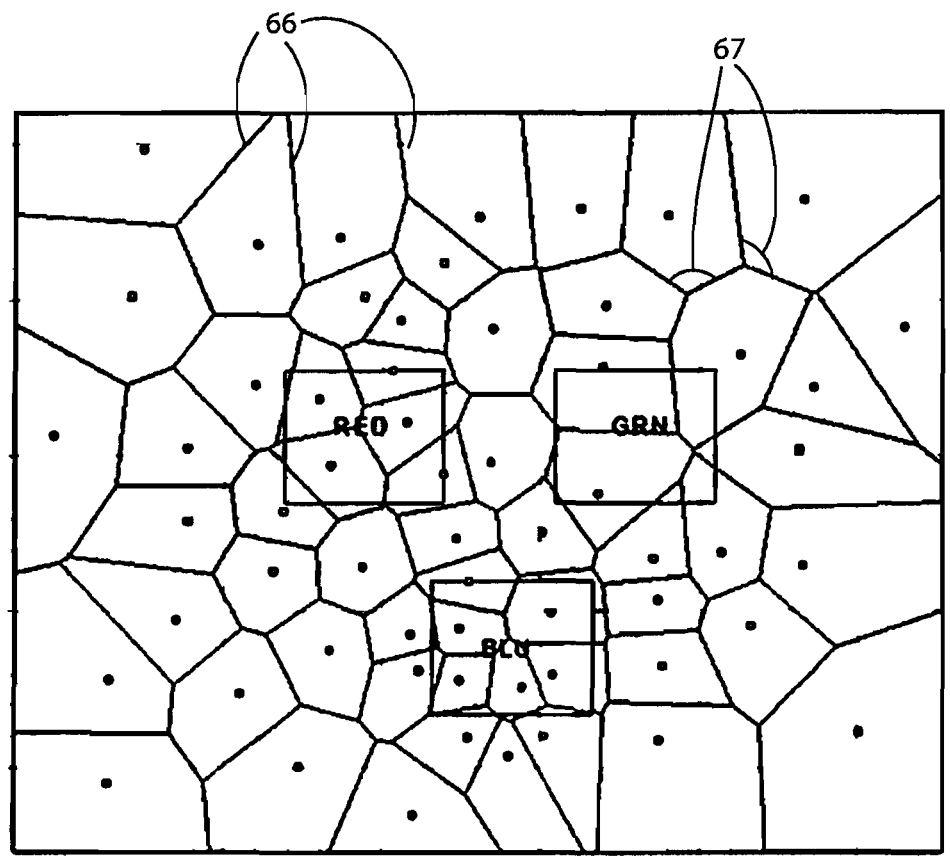
FIG. 38 is a top plan view of the multicolor LED assembly employing a Voronoi cell lenslet prescription, showing points of interest and the constructed polygonal Voronoi lenslets above the LEDs for the lenslet array of FIG. 37.

To construct the Voronoi lenslet array structure, refer to FIGS. 37 and 38. In FIG. 37, a cloud of points 65 is formed above multi-primary emitters (the LEDs 21) at a light extraction lens plane. Formation of the cloud of points 65 is determined by primary phase concentration or areas on a refractive surface where a primary color dominates the composite color. Areas with narrowest spectral bandwidth require more points which becomes an area of importance for Voronoi lenslet formation. Then, in FIG. 38, a Voronoi algorithm determines the lengths of the perimeter segments 66 and the angles between adjoining cell lenslets 67. Deformations are then applied to the lenslets 67 through radius, radius+conic constant, aspheric, Zernike, or free-form NURBS forms to further enhance color uniformity in the far field.

Figure 40:
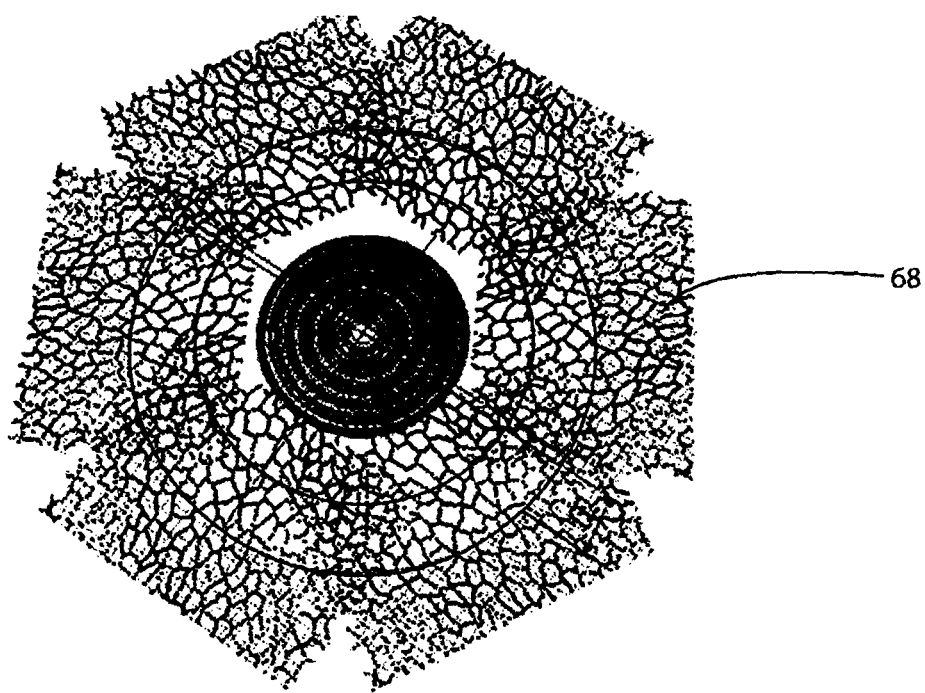
FIG. 40 is a top perspective view of an example of a Voronoi-Poisson described tessellation overlay on an integrated light extraction lens.

FIG. 39 shows optical power deformation applied to the Voronoi lenslet array with an index of refraction difference. The difference in index of refraction is necessary to perturb the angular phase of the local light field to bring one primary spatial illuminance or intensity distribution into closer correlation to a second spatial illuminance or intensity distribution. FIG. 40 shows an example of a Voronoi-Poisson described tessellation overlay on an integrated light extraction lens in which the Voronoi-Poisson described tessellation periphery serve as a stencil for where the lenslet optical power microdeformations must be created. Here the 6-pointed star 68 shadows are the areas of highest primary (LED light) wavelength concentration requiring dispersion for a desired luminous intensity and illuminance distribution multi-primary overlap.

Figure 41:
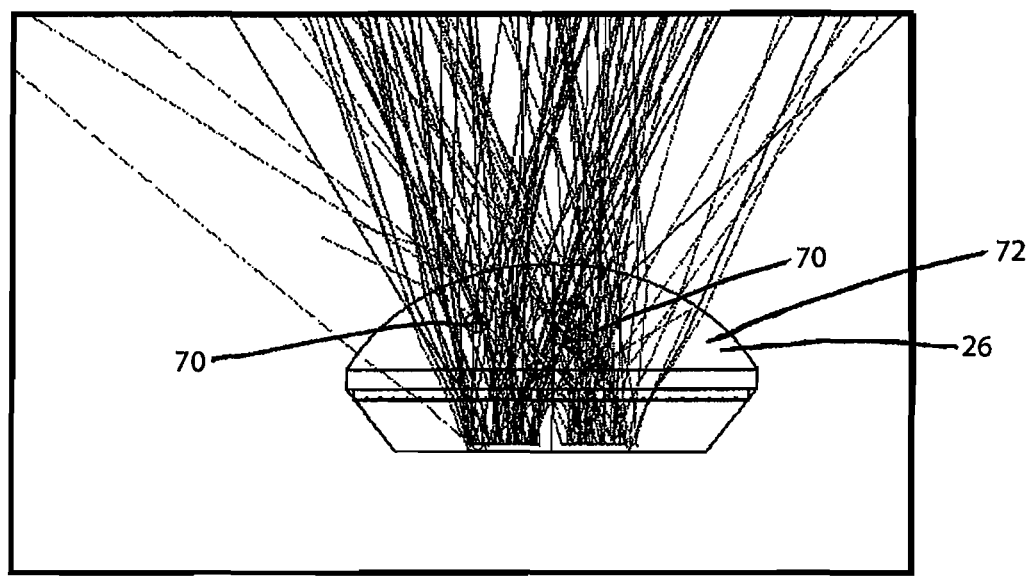
FIG. 41 is a side view of the multicolor LED assembly employing spherical refractive spheres embedded in the light extraction lens, in accordance with another embodiment of the present invention.

The micro-lenslet array structures of FIGS. 31-40 are subject to numerous variations and modifications. The micro fly's eye structure or the Voronoi-Poisson structure for lenslet arrays can be used in conjunction with any of the light extraction lens forms of FIGS. 10-27. According to another embodiment of the present invention, spherical particles used as refractive devices can be imbedded in any of the light extraction lenses described in FIGS. 10-40 to improve color uniformity. FIG. 41 shows micro-spheres 70 imbedded in the light extraction lens 26 which can also include a micro-lenslet array 62. The spherical particles 70 require a slightly different refractive index from the surrounding material 72 of the lens 26 to be effective. Optimization parameters include the optimal density of the particles 70, the particle radius, and the refractive index difference between the particles 70 and the surrounding lens material 72 in order to both improve color uniformity and keep light extraction high. When ray tracing, the effect of the spherical particles can be characterized through a modified Mie scattering model. Mie scattering refers to a mathematical formulation for describing the scattering of light by spherical dielectric particles of arbitrary diameter near that of the wavelength of light in a homogenous medium. To calculate the scattering of light by particles of arbitrary shapes Mie approximations no longer hold and a more rigorous method must be used such as the discrete-dipole approximation or DDA proposed by E. M. Purcell and C. R. Pennypacker ("Scattering and Absorption of Light by Nonspherical Dielectric Grains," Astrophysical Journal, 186: 705, 1973), incorporated herein by reference in its entirety. The modification can be described by the product of a scattering vector (s) and the radius of the imbedded particle (R), where s=2*k*sin(θ/2) and R=the average radius of the spherical particles. Many materials are available to create slight index of refraction differences between the particle 70 and the surrounding lens material 72. Refractive indices need to be similar to common high index silicones, glasses, and polymers. Table 2 lists refractive indices for materials that can be used to form the imbedded spherical particles 70. In Table 2, K refers to a crown, F to a flint, H refers to a glass lacking lead, arsenic and cadmium and is more environmentally friendly, BaK is a Barium Crown, ZK a dense crown, ZF a dense flint. The increasing number indicates increasing refractive index, for instance H_BaK2 has a lower refractive index than H_BaK6.

TABLE 2

Index of refraction for selected materials wavelength = 589 nm

| MATERIAL | INDEX |
|---|---|
| PMMA ACRYLIC | 1.492 |
| STYRENE | 1.590 |
| POLYCARBONATE | 1.584 |
| NAS | 1.563 |
| FUSED SILICA | 1.463 |
| K9 | 1.517 |
| F2 | 1.630 |
| H_BaK6 | 1.564 |
| H_ZK6 | 1.613 |
| H_F4 | 1.620 |
| H_ZK11 | 1.639 |
| H_ZF2 | 1.673 |
| H_ZF3 | 1.717 |
| H_BaK2 | 1.540 |
| FLUORITE | 1.387 |
| BOROSILICATE | 1.474 |
| PLEXIGLASS | 1.488 |
| QUARTZ | 1.458 |
| SAPPHIRE | 1.760 |
| WATER | 1.333 |
| ZIRCONIA | 2.173 |

Arbitrarily shaped solids can also be imbedded in the light extraction lens host material. Such solids include cubes, icosahedrons, Archimedean solids, platonic solids, or other solid shapes. The solids may be dispersed randomly with controlled density and volumetric size or be placed in more controlled spatial locations. Refractive "dust" or microparticles may also be dispersed in the light extraction lens host material.

Figure 42:
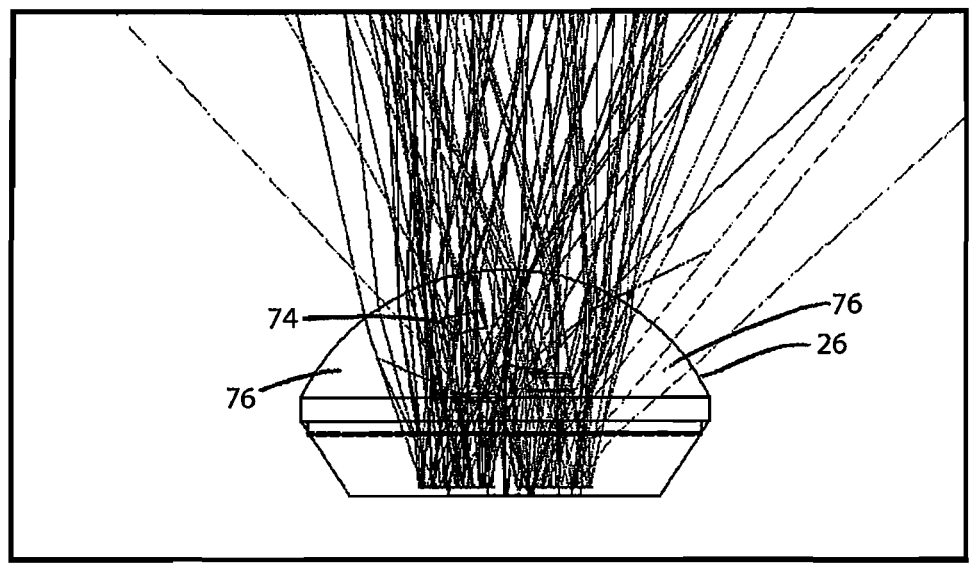
FIG. 42 is a side view of the multicolor LED assembly employing reflective particles embedded in the light extraction lens, in accordance with another embodiment of the present invention.

Refraction is not the only way of improving color uniformity by primary color phase randomization. In accordance with another embodiment of the present invention as shown in FIG. 42, reflective micro-particles are also an option. Reflective micro-particles 74 can be imbedded in the host material 76 of any of the light extraction lenses described in FIG. 10-27. Ideally, the reflective micro-particles 74 can be oriented vertically to reduce backscatter. The reflective micro-particles 74 can have arbitrary shapes and be composed of a variety of materials.

In a preferred embodiment, the reflective micro-particles 74 can be made from silver or aluminum which both have high reflectance in the visible wavelength region. If the micro-particles 74 are ferro-magnetic, then the orientation of the reflective micro-particles 74 can be controlled during the manufacture of the lens 26 when the lens material 76 is still molten by the application of small magnetic mesh fields before the host lens material 76 has reached its glass transition point. In general, a lower density of reflective micro-particles 74 is needed than the micro-refractive particles 70 described in FIG. 41 to achieve the same color uniformity effects.

Figure 43:
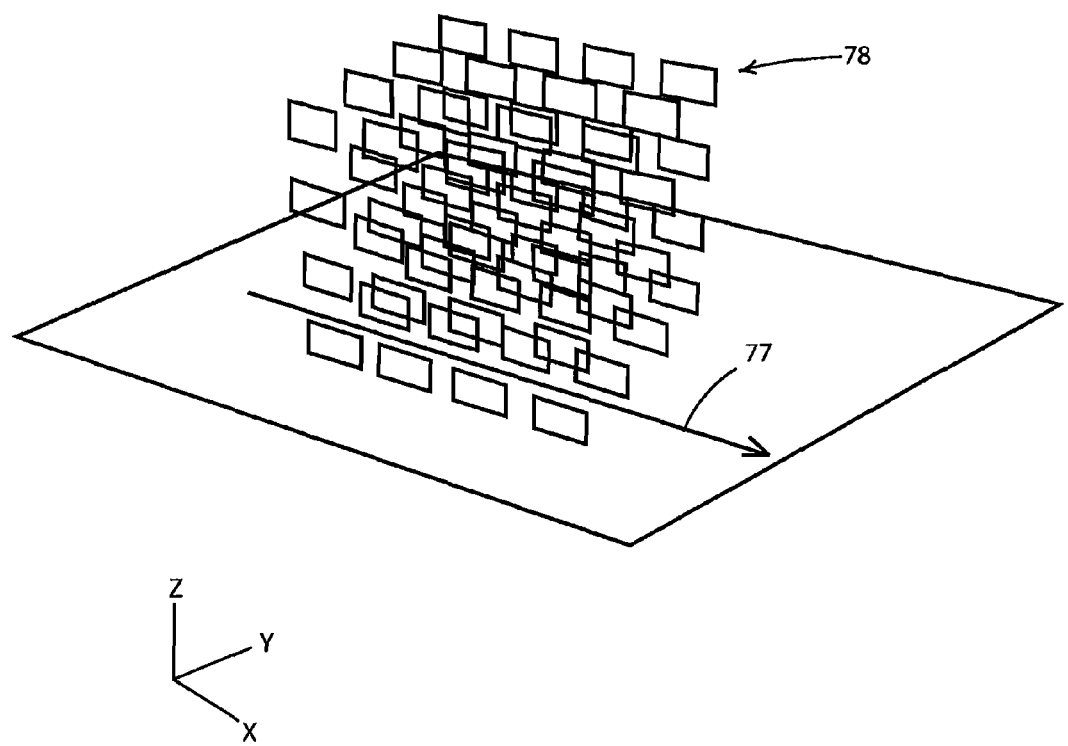
FIG. 43 is a perspective view of the multicolor LED assembly employing reflective particles embedded in the light extraction lens, wherein the particles are oriented to produce a rectangular reflector tunnel in accordance with another embodiment of the present invention.

Referring now to FIGS. 43 and 44, according to another embodiment of the present invention, micro-tunnels 77 of reflective materials can be formed in a refractive lens medium to direct and orient color specific phase of the light passing through the medium in a similar fashion to a waveguide. The micro-particle reflector tunnels 77 could be formed along arbitrary directional vectors. To create such a micro-tunnel, a 3D lattice of reflective micro-mirrors 78, are imbedded in the refractive lens medium while it is still molten. If the micro-mirrors are ferro-magnetic, then applying specific magnetic fields orients the lattice in such a way that light tunnels could be formed within a light extraction lens to further direct the light to improve color uniformity or to influence far-field intensity distributions. This micro-tunnel design can be applied to any of the light extraction lens design forms of FIGS. 10-42.

Figure 46:
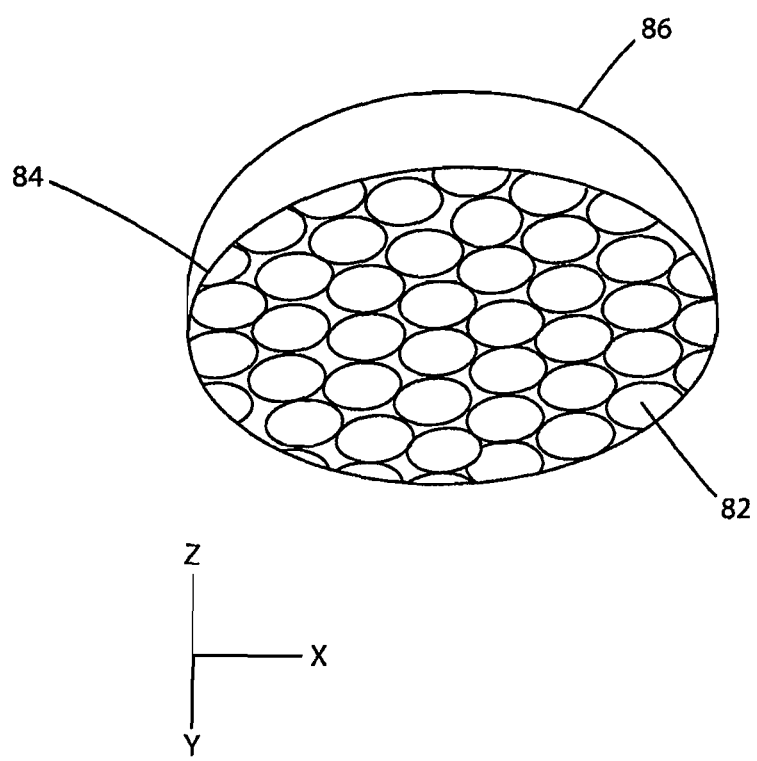
FIG. 46 is a bottom perspective view of the light extraction lens of FIG. 45, showing micro-lenslet prescriptions on the bottom surface.

Referring now to FIGS. 45 and 46, the light extraction lens designs of FIGS. 10-27 can include faceted geometry 80 in which facet perturbations of a smooth spline surface are specifically designed to further improve color uniformity. FIG. 46 shows microlenslet arrays 82 applied to the interface surface 84 between an LED encapsulation region (not shown) and faceted light extraction lens 86.

Figure 47:
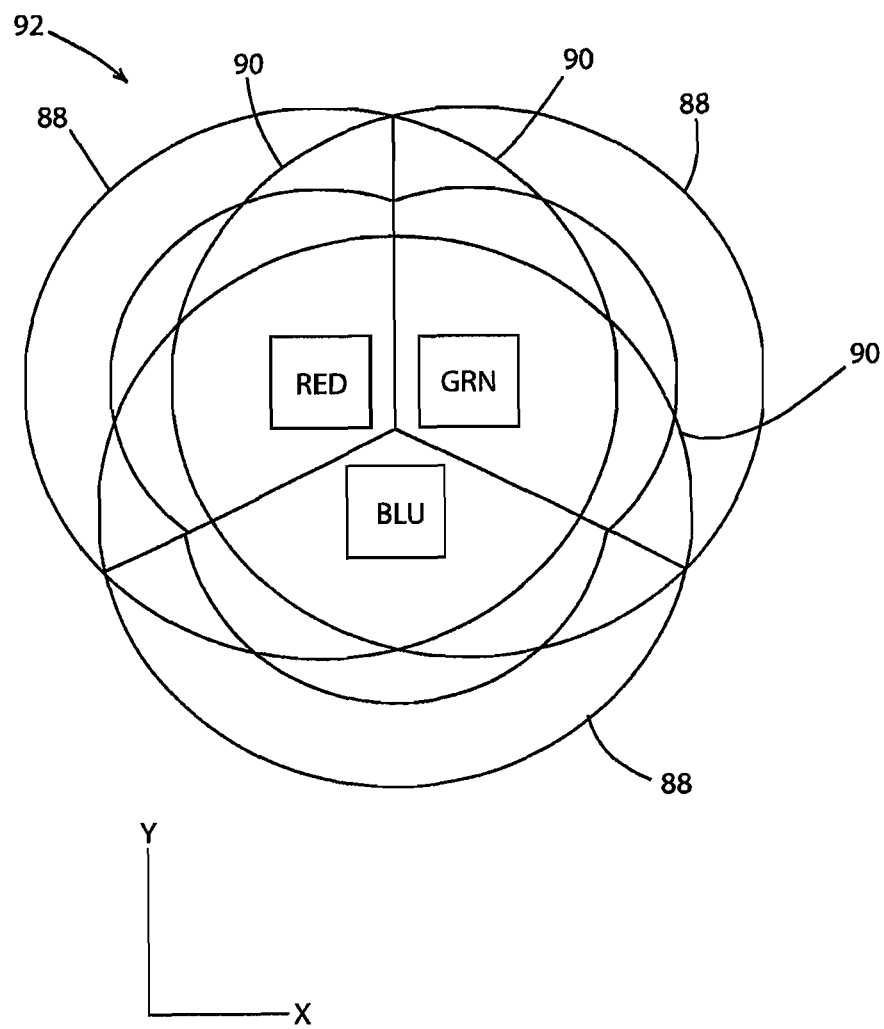
FIG. 47 is a top plan view of a multicolor LED assembly employing multiple lens lobes in the light extraction lens surface, in accordance with another embodiment of the present invention.

Referring now to FIG. 47, multiple lobes 88, which are formed of light extraction lens 90 designed for and centered on each light emitter 21 can be combined into a single light extraction lens 92. Multiple lobes 88 on a light extraction lens 90 can improve light extraction to compensate for the slight light extraction degradation produced by a few of the color uniformity enhancement features previously described. All of the color uniformity enhancement features previously described in FIGS. 10-46 can be applied to a multi-lobe lens.

Figure 48:
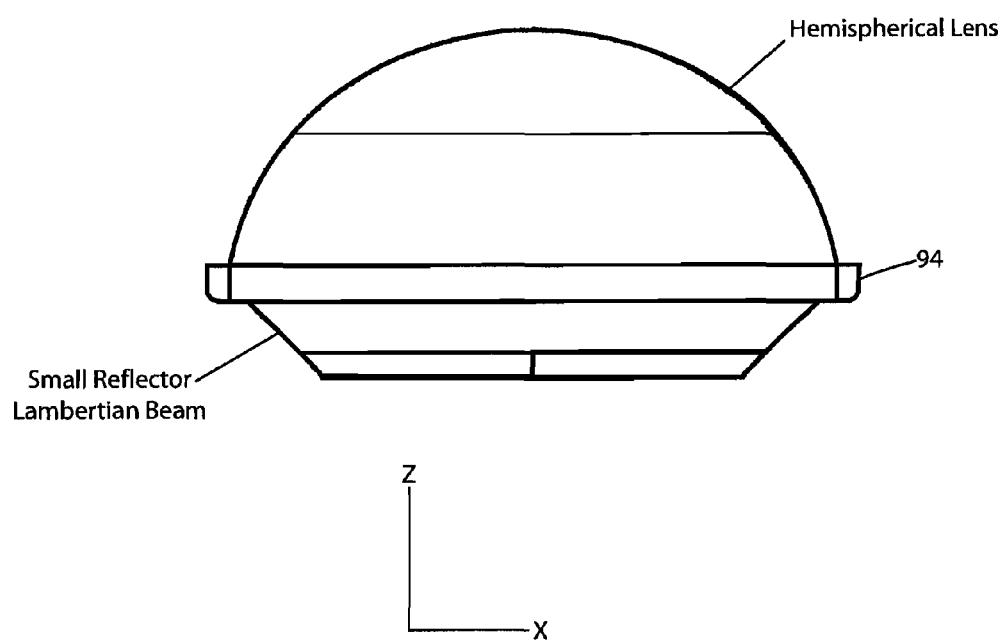
FIG. 48 is a side view of a multicolor LED assembly employing a reflector surrounding the LEDs.
Figure 49:
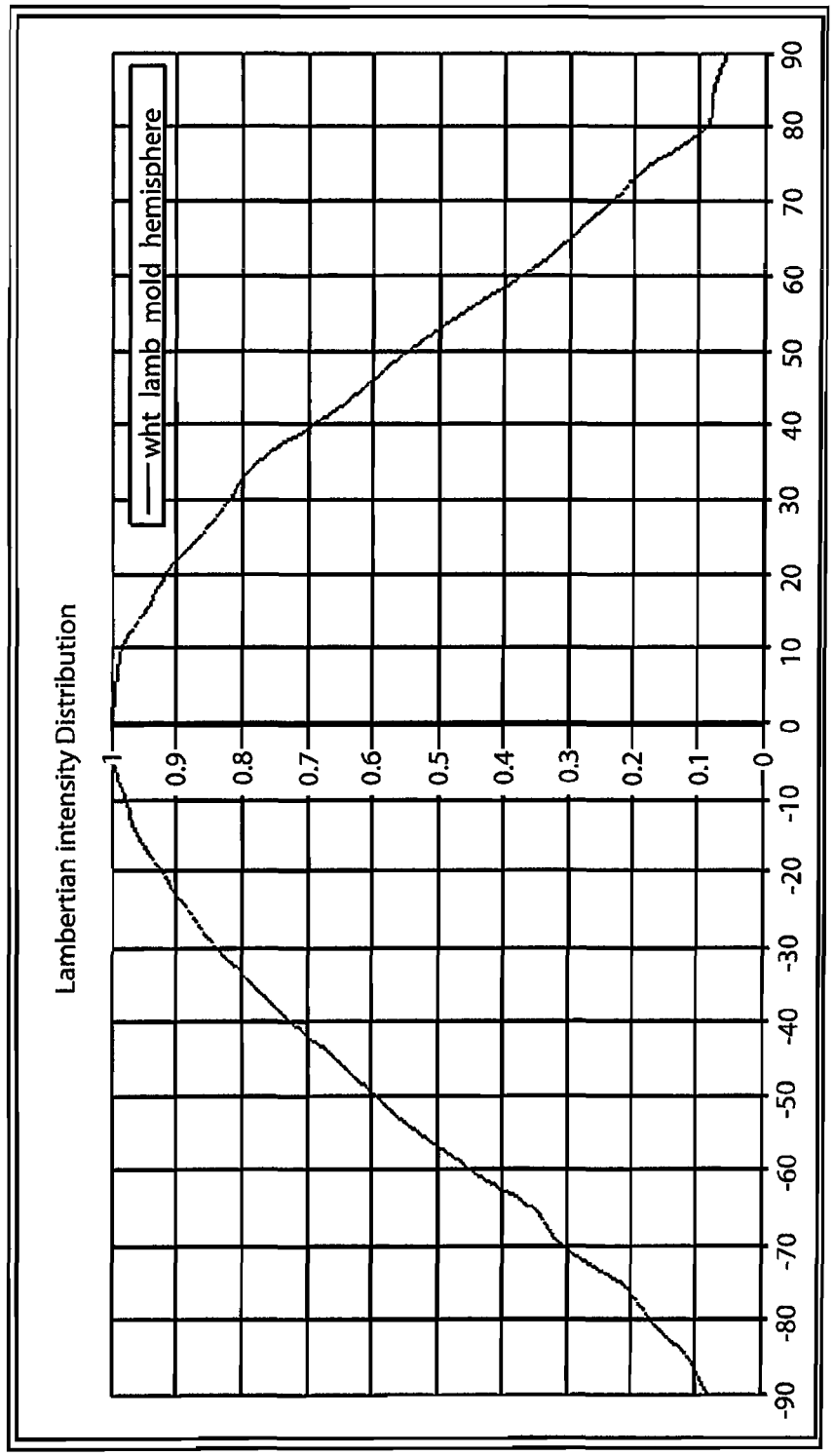
FIG. 49 is a graph of a typical Lambertian beam intensity distribution of the multicolor LED assembly shown in FIG. 48.

In many applications, a higher intensity beam of light is more desirable than a purely Lambertian beam produced by traditional LED packages. A Lambertian beam is a uniformly distributed beam that would be produced by a disc of light, such as the full moon. In a Lambertian light distribution, radiance as a function of angle is constant. Referring now to FIG. 48, one way of increasing on-axis intensity of a light engine (LED die emitter) is by integrating a reflector 94 as a one-piece package surrounding the LED emitters (not shown). The reflector 94 serves to both improve light extraction from the LED package and to shape the light. Typical Lambertian beams produced with an LED emitter having no reflector have a +/−62 degree full width at half maximum (FWHM) on axis intensity. FIG. 49 shows a typical Lambertian beam intensity distribution with the LED package construction shown in FIG. 48.

Figure 50:
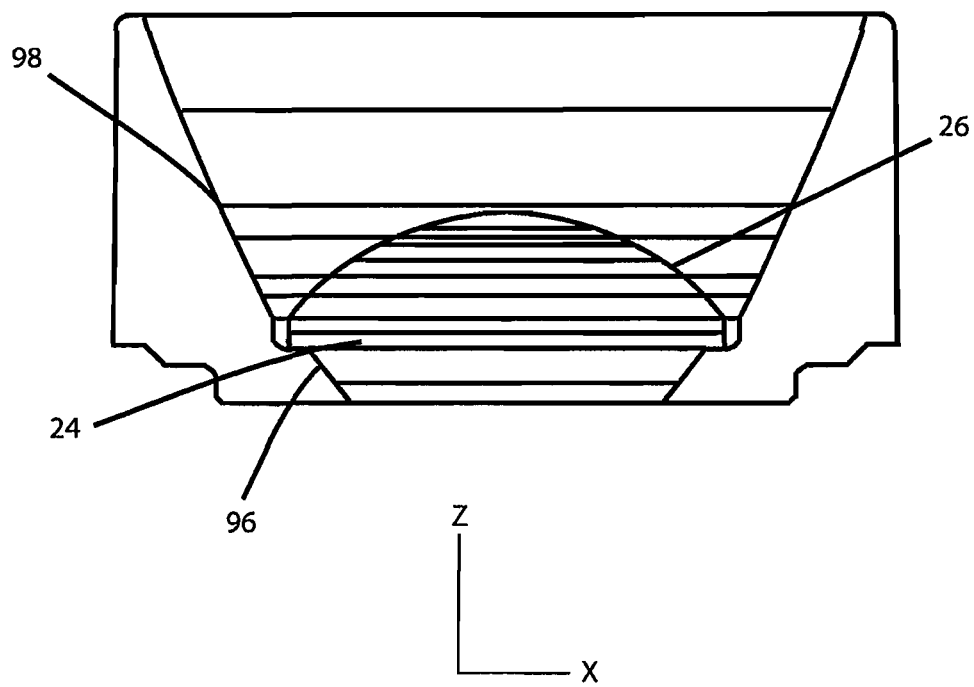
FIG. 50 is a side view of a multicolor LED assembly employing an integrated reflector surrounding the light extraction lens to produce a +−30 degree wide beam.
Figure 51:
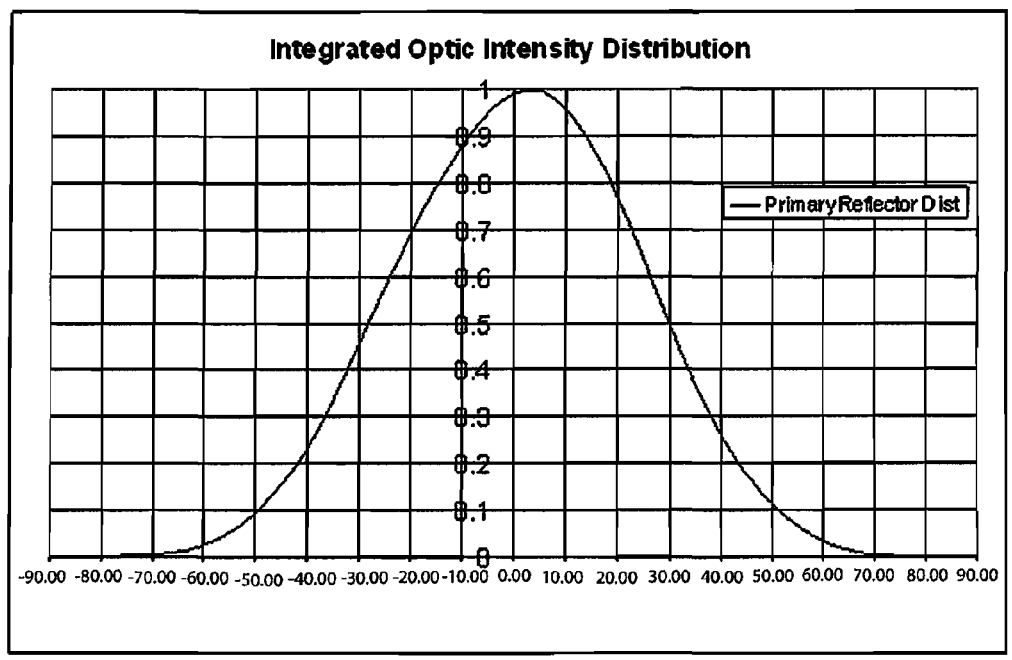
FIG. 51 is a graph of a beam intensity distribution of the multicolor LED assembly shown in FIG. 50.

To increase the intensity of a beam over a small angle of spread, a reflector 96 is integrated with the emitter cavity 24 as shown in FIG. 50. Overlying the cavity 24 and the reflector 96 is the light extraction lens 26, which can take on any of the shapes described in FIGS. 10-27. A primary reflector 98 encapsulates the light-extraction lens 26 and overlies the reflector 96. The reflector 96 has a spline shape described by a revolved polynomial, Bezier spline, or NURBS surface. The angles of the reflective surfaces are chosen to maximize light extraction from the immersed semiconductor source as well as reduce intensity dispersion. The taller primary reflector 98 concentrates the light into a tighter beam with increased on-axis intensity. By integrating the reflector 96 as a part of the LED cavity 24, high light extraction is achieved. A light extraction lens 26 disperses the light in a non-Lambertian manner to decrease the height of the reflector necessary to achieve a +/−30 degree beam as shown in FIG. 51. Light strikes the reflector 96, which exits the light extraction lens 26, some of which hits the primary reflector 98 and exits out of the multi-color LED assembly 20.

Figure 52:
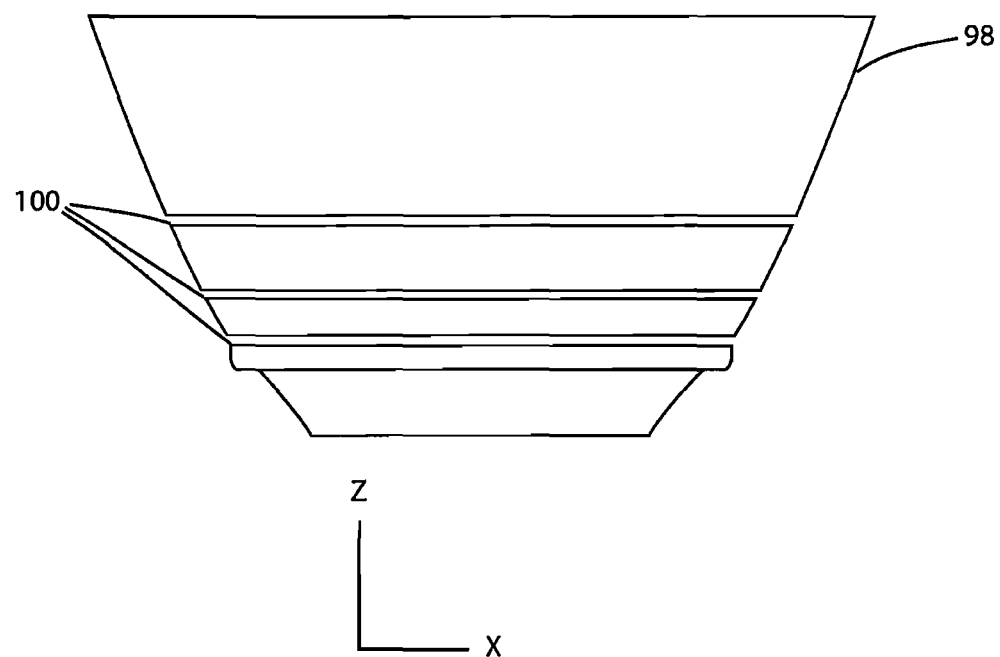
FIG. 52 is a side view of a multicolor LED assembly employing an integrated reflector surrounding the light extraction lens to produce a ±30 degree wide beam, wherein the integrated reflector is sliced in preparation for producing light control facets.
Figure 53:
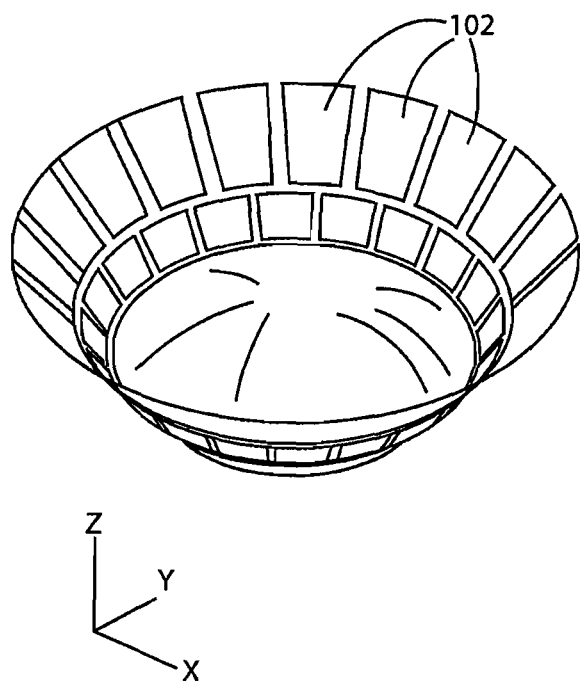
FIG. 53 is a side view of the multicolor LED assembly of FIG. 52, wherein the second reflector is additionally sliced vertically for producing light control facets.
Figure 54:
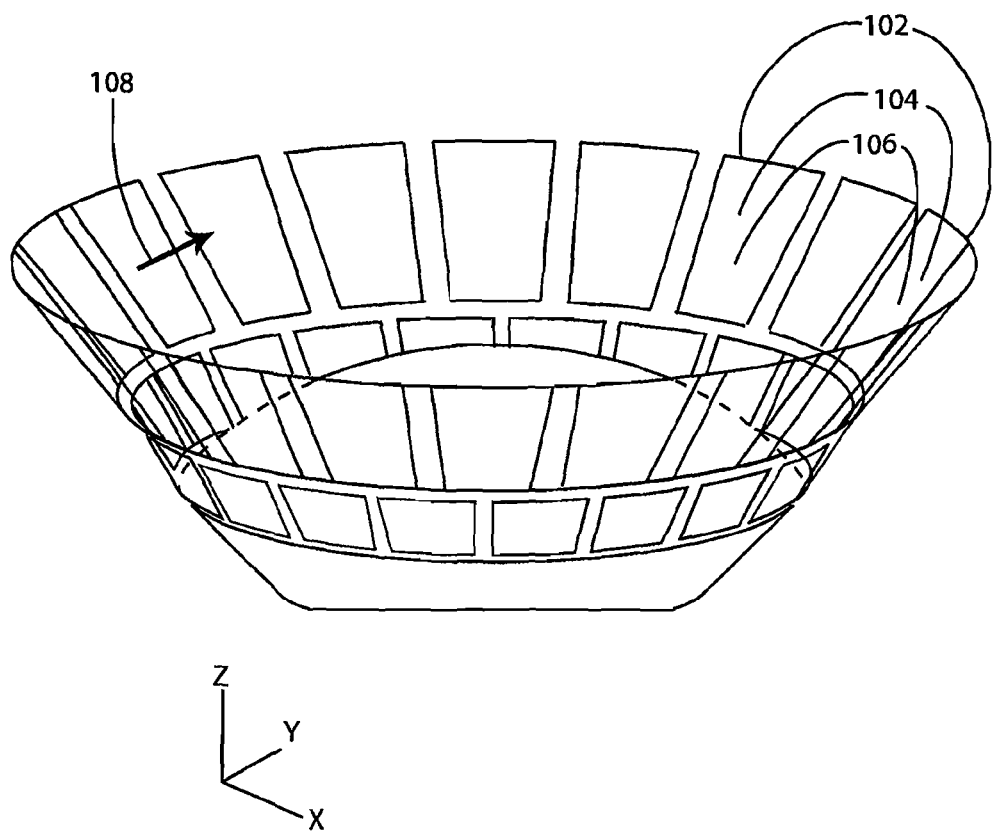
FIG. 54 is a side view of the multicolor LED assembly of FIG. 52, showing the construction of a facet angular control vector for each facet.
Figure 55:
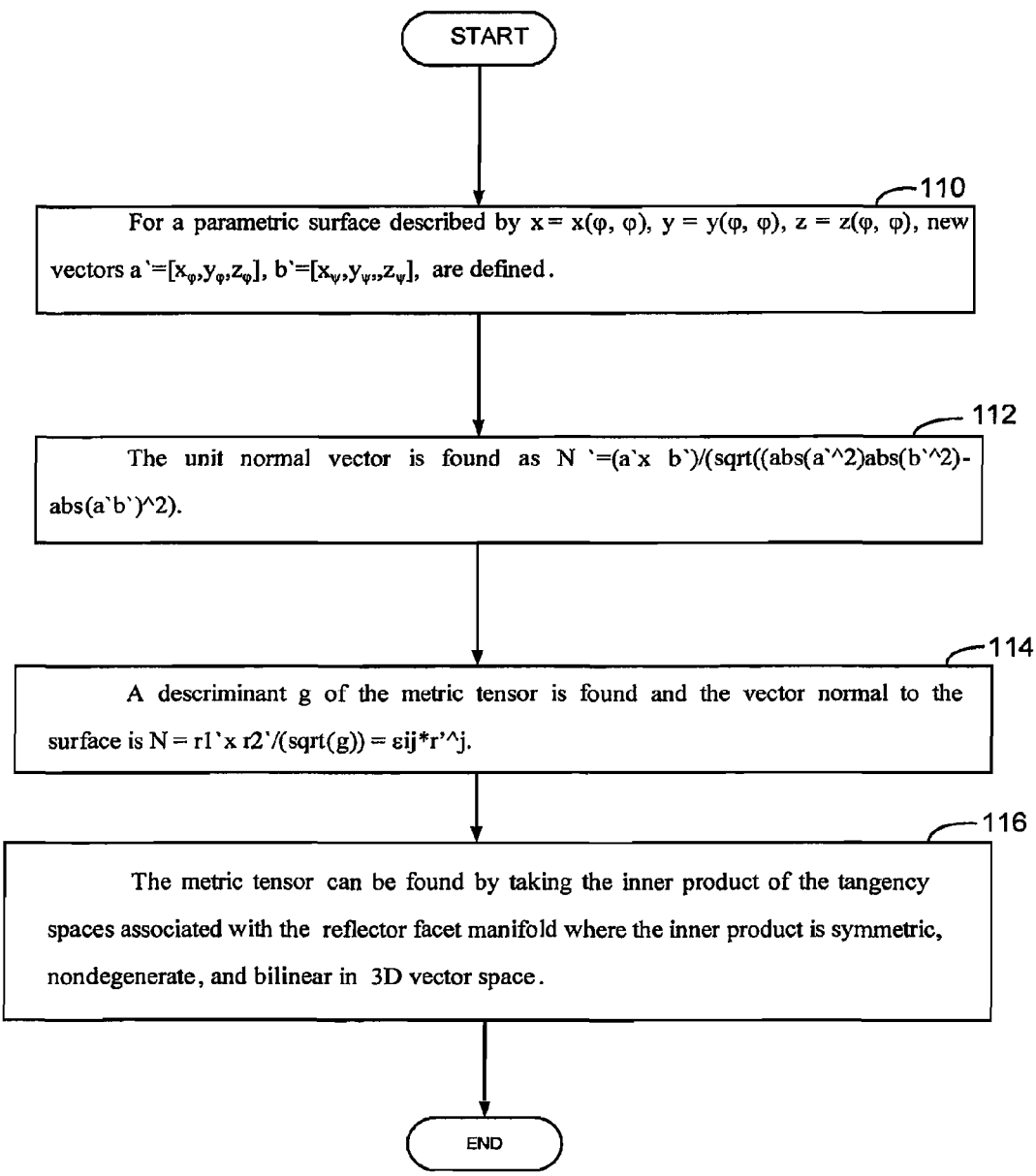
FIG. 55 is a flow chart illustrating the steps of constructing a randomly perturbed micro facet reflector using the facet angular control vectors of FIG. 54.

FIGS. 52-58 illustrate a technique of using light control facets and randomized facet perturbations of the primary reflector 98 to improve color uniformity. As shown in FIG. 52, the primary reflector 98 can first be broken into horizontal slices 100. In FIG. 53, these horizontal slices are then vertically cut into a plurality of facets 102. Referring now to FIG. 54, each of the facets 102 appear nearly flat in a local region 104 near their mathematical center 106. In the local region 104, a vector, called an angular facet control vector 108 can be found by applying the following algorithm as shown in FIG. 55. At step 110, for a parametric surface described by x=x($\phi$, $\phi$), y=y($\phi$, $\phi$), z=z($\phi$, $\phi$), new vectors a'=[$x_\phi$, $y_\phi$, $z_\phi$], b'=[$x_\psi$, $y_\psi$, $z_\psi$], are defined. At step 112, the unit normal vector is found as N'=(a'×b')/(sqrt((abs(a'^2)abs(b'^2)−abs(a'b')^2). At step 114, a descriminant g of the metric tensor is found and the vector normal to the surface is N=r1'×r2'/(sqrt(g))=∈ij*r'^j. At step 116, the metric tensor can be found by taking the inner product of the tangency spaces associated with the reflector facet manifold where the inner product is symmetric, nondegenerate, and bilinear in 3D vector space.

Figure 56:
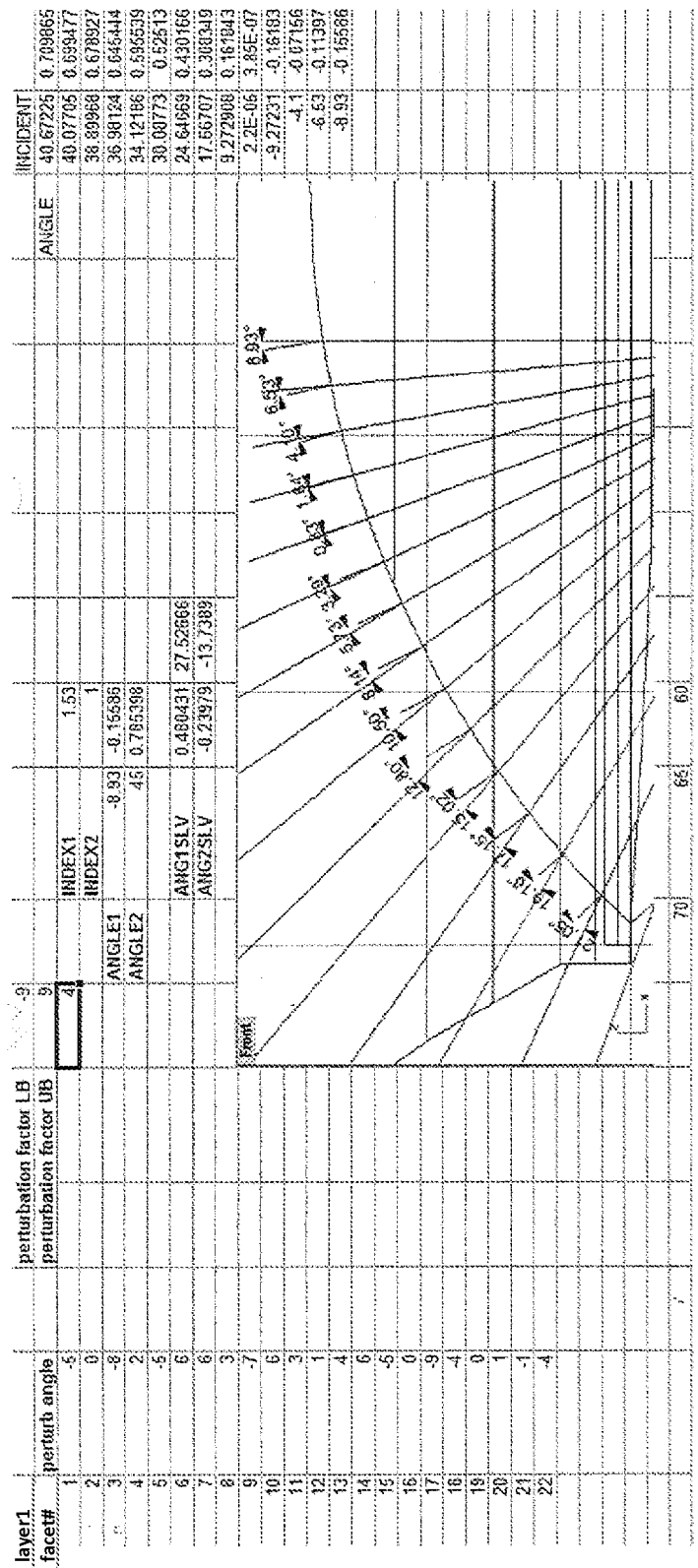
FIG. 56 is a graph for choosing a perturbation angle for constructing a randomly perturbed micro facet reflector using the facet angular control vectors of FIG. 54, and a table is also illustrated with the perturbation angle assigned to each control facet.

Using the graph of FIG. 56, perturbation is then applied to a facet 102 by deviating the angular facet control vector 108 from the unit normal vector by a random angle between an upper and lower bound. The degree of perturbation is higher where color specific phase concentration is highest. After completion of the multi-layer, multi-facet, perturbation routine, the resulting integrated primary reflector 98 both collimates the light, and randomizes color specific phase to improve the intensity distribution function overlap of Cyan, Magenta, and Yellow.

Figure 57:
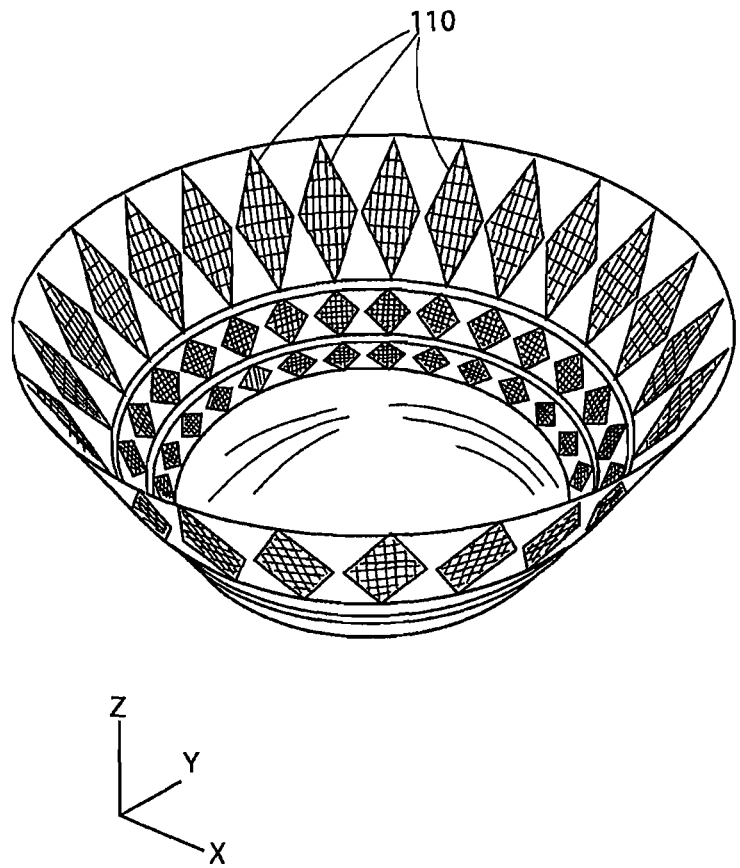
FIG. 57 is a top perspective view of the reflector of FIG. 52, showing the resulting randomly perturbed microfacets knitted together into a solid overall shape using NURBS geometry.
Figure 58:
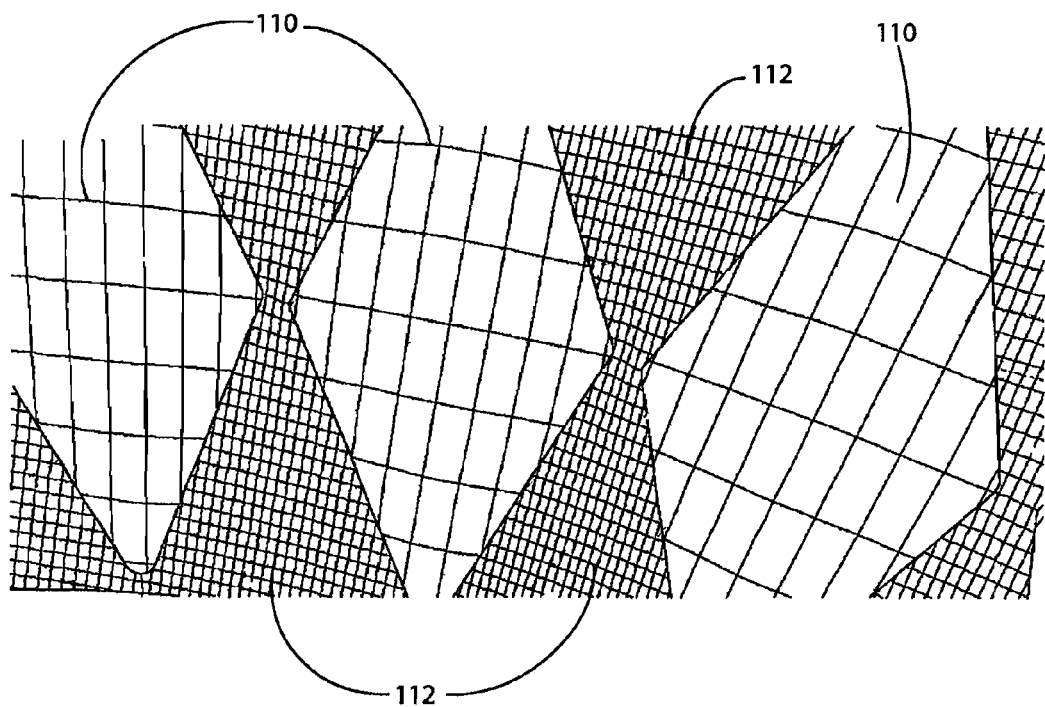
FIG. 58 is a close-up view of the reflector of FIG. 57.
Figure 59:
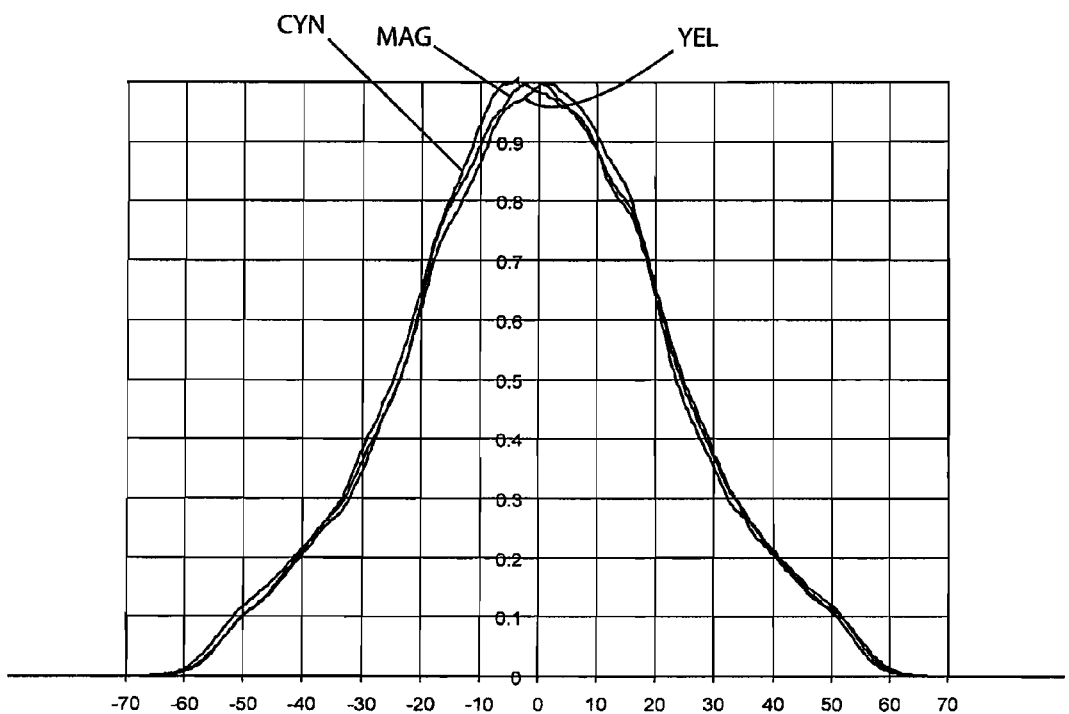
FIG. 59 is a graph of the resulting overlap of luminous intensity distributions of a multi-color LED assembly employing the reflector of FIG. 57.
Figure 60:
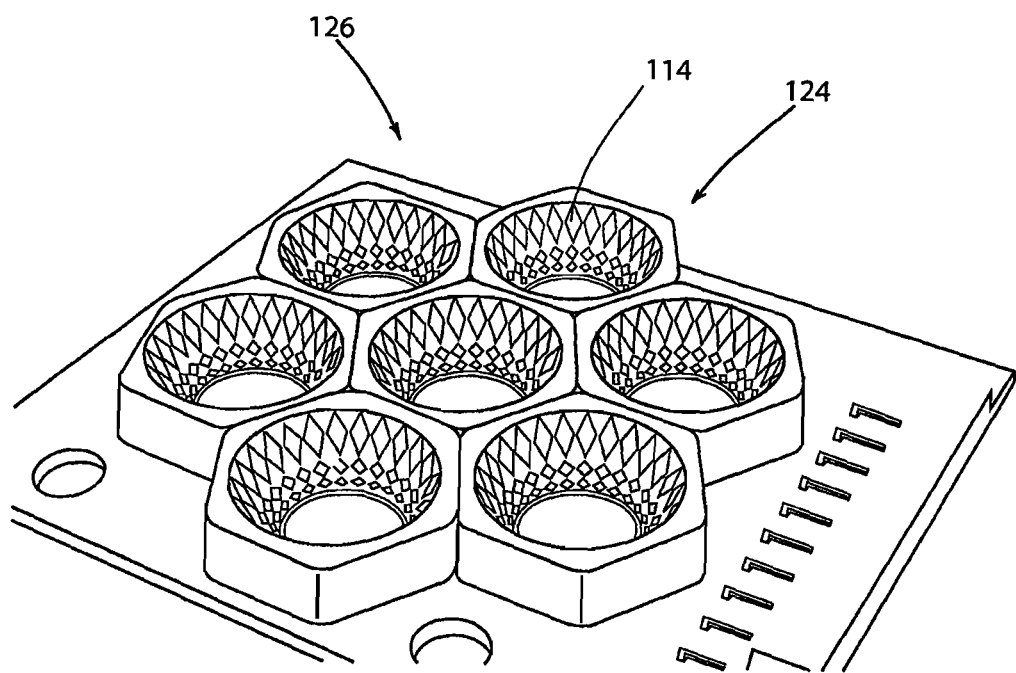
FIG. 60 shows an array of LED light assemblies employing the reflectors of FIG. 57.

FIG. 57 depicts microfacets 110 as diamond-shaped, with FIG. 58 being a close-up view of some of the diamond microfacets 110 in which the inter-facet space 112 is knitted together to prevent light from exiting through them. The present invention can be extended to other polygonal shaped facets, such as diamond, triangular, hexagonal shapes, etc., without departing from the spirit of the invention. Besides polygonal shapes, the microfacets 110 can take on shapes defined by multiple user-defined BSDF functions in which alternating diffuse and specular surface textures can be applied. Specular surfaces are those surfaces which have a mirror-like finish, while diffuse surfaces have a rough finish which tends to scatter impinging light. The inter-facet space 112 (the knitting) can be described by NURBS or other general polynomial blend functions. FIG. 59 shows the resulting overlap of intensity distributions for cyan, magneta, and yellow. FIG. 60 shows randomized perturbed facets 114 applied to an integrated primary reflector 124 with alternating specular/diffuse texturing, as well as an array of multiple collections of R-G-B light engines 126. Emphasis is placed on the perturbation of facets. Faceting alone is not sufficient to produce acceptable color uniformity for multi-primary LED light engine arrays 126, i.e., the randomized perturbation of the facet control vector can produce the desired effect.

Figure 61A:
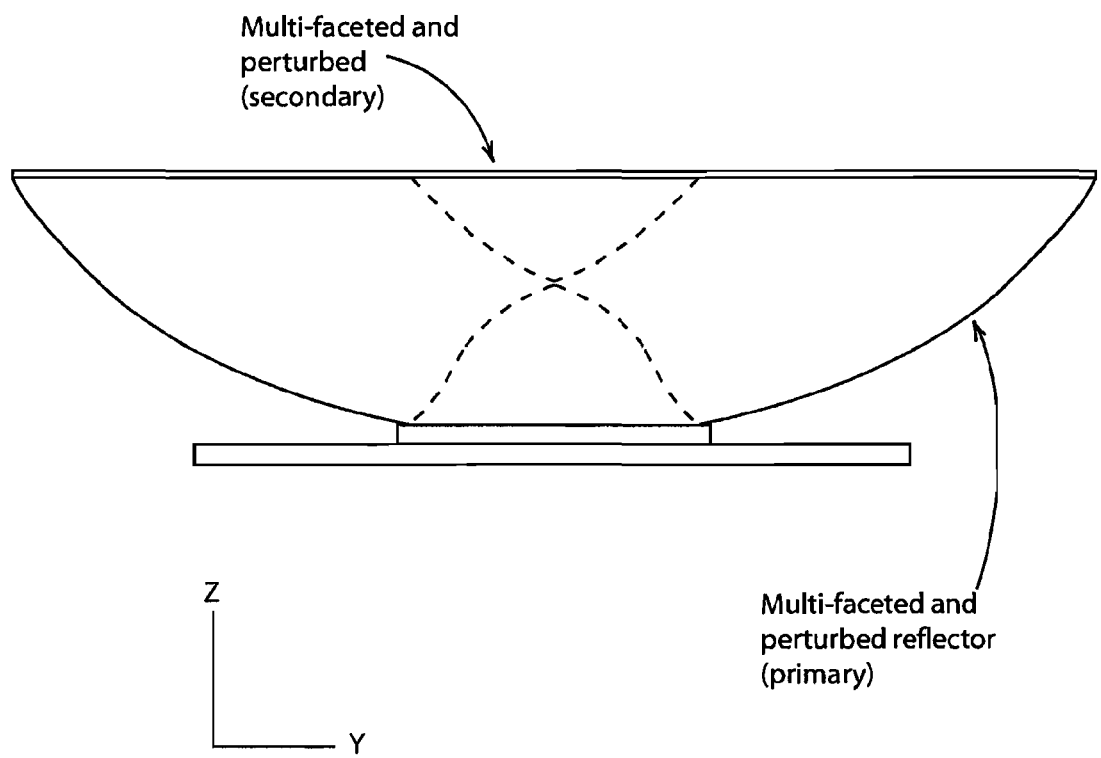
Figure 61B:
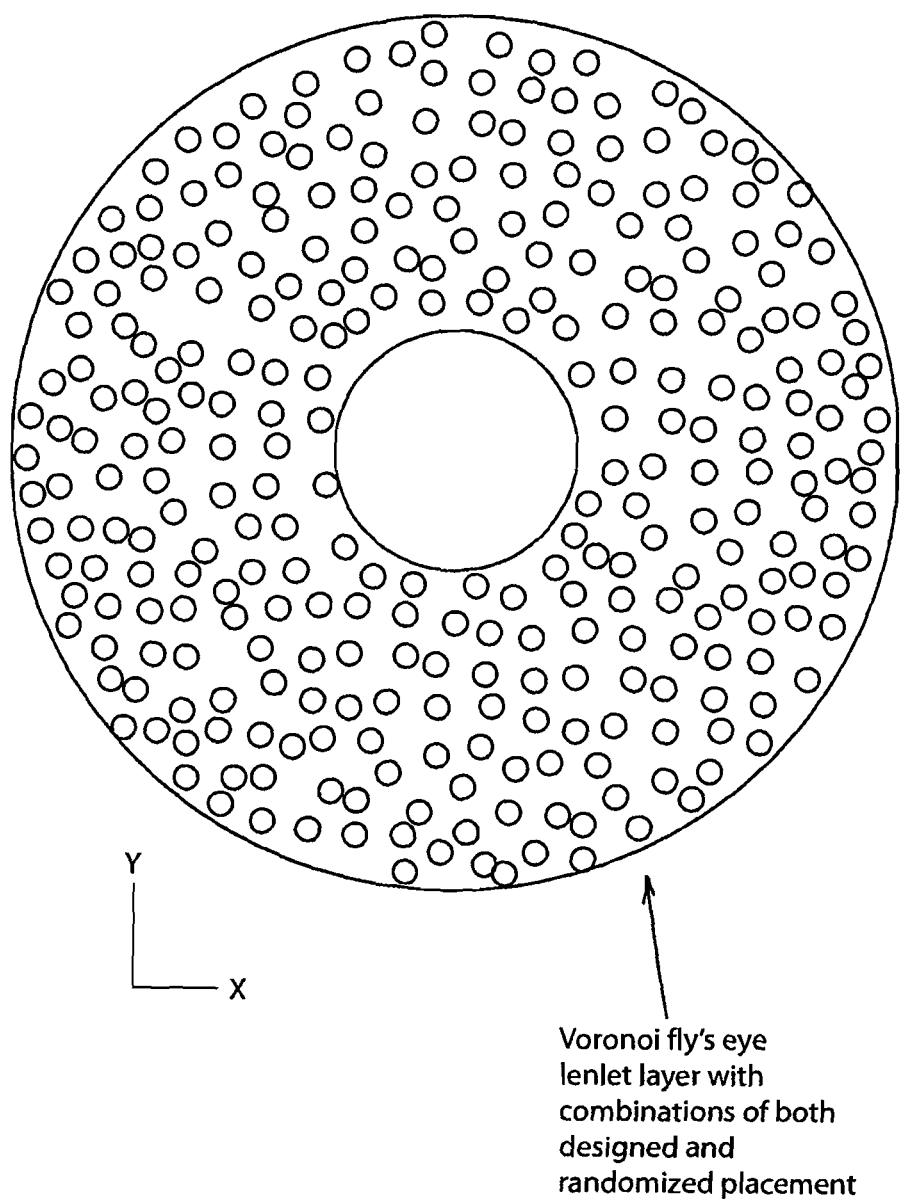
Figure 61E:
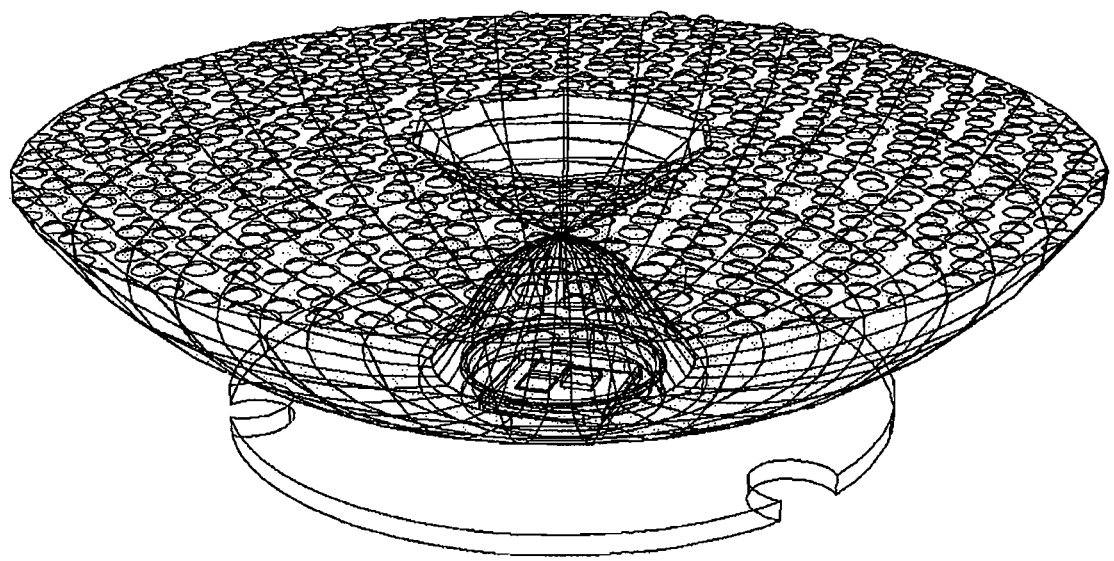

Referring now to FIG. 61, reflective (R), refractive (X), and Total Internally Reflecting (I) surfaces can be combined with any combination of the color uniformity enhancement features discussed in FIGS. 2-60. RXI concentrators enable compact, high efficiency collimation. RXI concentrators can be made available in both singlet and array configurations. The design of a traditional RXI concentrator is described by Benitez and Minano pg. 202 of "Non-Imaging Optics" Elsevier Academic Press (2005), which is incorporated herein by reference in its entirety. See FIGS. 61a-61e.

Figure 62:
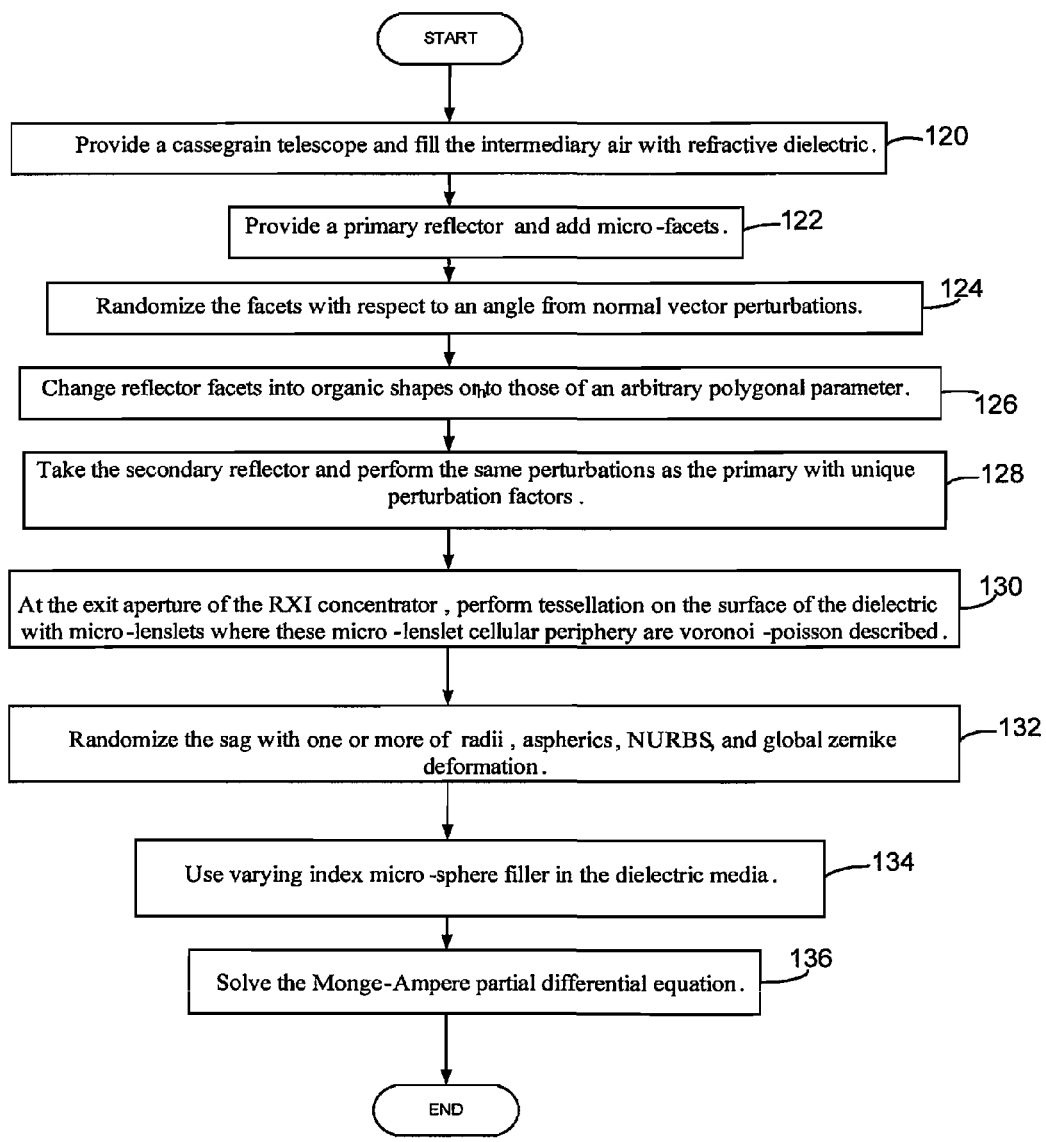
FIG. 62 is a flow chart illustrating the steps for constructing the RXI concentrator/collimator of FIG. 61.

The following steps are followed to construct an RXI concentrator as depicted in FIG. 62: At step 120, the intermediary air of a cassegrain telescope is filled with refractive dielectric. At step 122, micro-facets are added to the primary reflector. At step 124, the facets are randomized with respect to an angle from normal using the vector perturbations previously described for FIGS. 52-58. At step 126, reflector facets are changed into organic shapes or to those of an arbitrary polygonal parameter. At step 128, the same perturbations are applied to the secondary reflector as the primary with unique perturbation factors. At step 130, at the exit aperture of the RXI concentrator, the surface of the dielectric is tessellated with micro-lenslets where these micro-lenslet cellular peripheries are of the Voronoi-Poisson type described in FIGS. 37-40. At step 132, randomize sag with one or more of radii, aspherics, NURBS, and global Zernike deformation. Optionally, at step 134, use varying index micro-sphere filler in the dielectric media. At step 136, in terms of optimal global deformation on the primary and secondary reflectors, solve the Monge-Ampere partial differential equation using specialized numerical solution processes in terms of multi-primary wavelength specific phase and find solutions to the general polynomial descriptions of the primary and secondary reflectors, which optimally combine multi-primary phase in the far field.

Lenses can be manufactured by first creating a hardened steel or nickel master using standard EDM or electric discharge machining, microEDM, step and flash imprint lithography, or direct laser writing and replication using a special material such as Ormocer® as described by T. Ammer and M. Gale, "Chip-level integrated diffractive optical microlenses for multimode vertical-cavity surface-emitting laser to fiber coupling." Opt. Eng. 41 (12) 3141-3150 December 2002, incorporated herein by reference in its entirety.

It is to be understood that the exemplary embodiments are merely illustrative of the invention and that many variations of the above-described embodiments may be devised by one skilled in the art without departing from the scope of the invention. It is therefore intended that all such variations be included within the scope of the following claims and their equivalents.

What is claimed is:

1. An assembly of multicolor light emitting diodes packaged for controlled color mixing, comprising:
    a substrate;
    a plurality of light-emitting diode (LED) dies mounted overlying the substrate, each die emitting light of a corresponding color;
    an optically transmissive encapsulant covering the plurality of LED dies; and
    at least one lens having a top surface and a bottom surface overlying the encapsulant, the bottom surface of the lens touching the encapsulant and having a micro-surface roughness (MSR) prescription having a contoured shape with a plurality of V-shaped teeth or cavities;
    wherein the profile of distribution of the V-shaped teeth or cavities is structurally arranged to redirect light from each of the plurality of LED dies such that an overlap of the illuminance and luminous intensity distributions of the plurality of LED has a deviation from a complete overlap of colors, when plotted on a chromaticity chart, that is smaller than the size of MacAdam ellipses, which indicate regions on a chromaticity chart that contain all colors that are indistinguishable to a human eye from a color at a center of the respective ellipse.

2. The assembly of multicolor light emitting diodes of claim 1, wherein said deviation is equal to or less than a predetermined amount that falls within the areas of MacAdam ellipses plotted on chromaticity charts for the colors emitted and mixed together by the plurality of LED dies.

3. The assembly of multicolor light emitting diodes of claim 2, wherein the predetermined bottom surface comprises a microlenslet array.

4. The assembly of multicolor light emitting diodes of claim 3, wherein the MSR is described by one of angle resolve scatter function, Harvey BSDF function, user-defined BSDF function, and phong distribution function.

5. The assembly of multicolor light emitting diodes of claim 3, wherein the MSR is described by one or more of a forward Harvey, retro-Harvey, Lambertian, Poisson, forward phong, or retro phong distribution function.

6. The assembly of multicolor light emitting diodes of claim 3, wherein the microlenslet array is divided into two or more zones comprising two or more different MSR prescriptions.

7. The assembly of multicolor light emitting diodes of claim 3, wherein the top surface of the lens has a shape described by one of radius, radius plus conic constant, radius plus conic constant plus aspheric, radius plus conic constant plus aspheric plus global general polynomial, global Zernike deformation, dioptric total internal reflection (TIR), freeform Non-Uniform Rational B-Spline (NURBS) defined TIR, Fresnel plus TIR, diffractive optical element surface, biconic, cartoval, Dielectric Total Internal Reflecting Concentrator, Confocal Elliptic Concentrator, and Multi-Focal Parabolic Concentrator surface.

8. The assembly of multicolor light emitting diodes of claim 3, wherein the microlenslet array is a micro-fly's eye lenslet array.

9. The assembly of multicolor light emitting diodes of claim 8, wherein the micro-fly's eye lenslet array has polygonal-shaped lenslets.

10. The assembly of multicolor light emitting diodes of claim 8, wherein the micro-fly's eye lenslet array has lenslets in the shape of one of hexagons, squares, rectangles, circles (radius), radius plus conic constant, aspheric, free-form NURBS, and Zernike polynomials.

11. The assembly of multicolor light emitting diodes of claim 8, wherein the micro-fly's eye lenslet array has undergone a global deformation.

12. The assembly of multicolor light emitting diodes of claim 8, wherein the microlenslet arrays are distributed randomly.

13. The assembly of multicolor light emitting diodes of claim 8, wherein the top surface of the lens has a shape described by one of radius, radius plus conic constant, radius plus conic constant plus aspheric, radius plus conic constant plus aspheric plus global general polynomial, global Zernike deformation, dioptric total internal reflection (TIR), freeform Non-Uniform Rational B-Spline (NURBS) defined TIR, Fresnel plus TIR, diffractive optical element surface, biconic, cartoval, Dielectric Total Internal Reflecting Concentrator, Confocal Elliptic Concentrator, and Multi-Focal Parabolic Concentrator surface.

14. The assembly of multicolor light emitting diodes of claim 3, wherein the microlenslet array has a Voronoi lenslet array structure.

15. The assembly of multicolor light emitting diodes of claim 14, wherein the top surface of the lens has a shape described by one of radius, radius plus conic constant, radius plus conic constant plus aspheric, radius plus conic constant plus aspheric plus global general polynomial, global Zernike deformation, dioptric total internal reflection (TIR), freeform Non-Uniform Rational B-Spline (NURBS) defined TIR, Fresnel, diffractive optical element, biconic, cartoval, Dielectric Total Internal Reflecting Concentrator, Confocal Elliptic Concentrator, and Multi-Focal Parabolic Concentrator surface.

16. The assembly of multicolor light emitting diodes of claim 2, wherein the at least one lens comprises refractive microparticles.

17. The assembly of multicolor light emitting diodes of claim 16, wherein the predetermined bottom surface has one of a micro-fly's eye lenslet array, and a Voronoi lenslet array structure.

18. The assembly of multicolor light emitting diodes of claim 16, wherein the top surface of the lens has a shape described by one of radius, radius plus conic constant, radius plus conic constant plus aspheric, radius plus conic constant plus aspheric plus global general polynomial, global Zernike deformation, dioptric total internal reflection (TIR), freeform Non-Uniform Rational B-Spline (NURBS) defined TIR, Fresnel plus TIR, diffractive optical element, biconic, cartoval, Dielectric Total Internal Reflecting Concentrator, Confocal Elliptic Concentrator, and Multi-Focal Parabolic Concentrator surface.

19. The assembly of multicolor light emitting diodes of claim 2, wherein the at least one lens comprises reflective microparticles.

20. The assembly of multicolor light emitting diodes of claim 19, wherein the predetermined bottom surface has one of a micro-fly's eye, and a Voronoi lenslet array structure.

21. The assembly of multicolor light emitting diodes of claim 19, wherein the top surface of the lens has a shape described by one of radius, radius plus conic constant, radius plus conic constant plus aspheric, radius plus conic constant plus aspheric plus global general polynomial, global Zernike deformation, dioptric total internal reflection (TIR), freeform Non-Uniform Rational B-Spline (NURBS) defined TIR, Fresnel plus TIR, diffractive optical element, biconic, cartoval, Dielectric Total Internal Reflecting Concentrator, Confocal Elliptic Concentrator, and Multi-Focal Parabolic Concentrator surface.

22. The assembly of multicolor light emitting diodes of claim 19, wherein the reflective microparticles are configured to form microtunnels.

23. The assembly of multicolor light emitting diodes of claim 2, wherein the top surface of the at least one lens is faceted.

24. The assembly of multicolor light emitting diodes of claim 23, wherein the predetermined bottom surface has one of a micro-fly's eye, and a Voronoi lenslet array structure.

25. The assembly of multicolor light emitting diodes of claim 23, wherein the top surface of the lens has a shape described by one of radius, radius plus conic constant, radius plus conic constant plus aspheric, radius plus conic constant plus aspheric plus global general polynomial surface, global Zernike deformation, dioptric total internal reflection (TIR), free-form Non-Uniform Rational B-Spline (NURBS) defined TIR, Fresnel plus TIR, diffractive optical element, biconic, cartoval, Dielectric Total Internal Reflecting Concentrator, Confocal Elliptic Concentrator, and Multi-Focal Parabolic Concentrator.

26. The assembly of multicolor light emitting diodes of claim 2, wherein the at least one lens is formed of multiple lobes.

27. The assembly of multicolor light emitting diodes of claim 26, wherein the predetermined bottom surface has one of a micro-fly's eye, and a Voronoi lenslet array structure.

28. The assembly of multicolor light emitting diodes of claim 26, wherein the top surface of each lobe has a shape described by one of radius, radius plus conic constant, radius plus conic constant plus aspheric, radius plus conic constant plus aspheric plus global general polynomial surface, global Zernike deformation, dioptric total internal reflection (TIR), free-form Non-Uniform Rational B-Spline (NURBS) defined TIR, Fresnel plus TIR, diffractive optical element, biconic, cartoval, Dielectric Total Internal Reflecting Concentrator, Confocal Elliptic Concentrator, and Multi-Focal Parabolic Concentrator.

29. The assembly of multicolor light emitting diodes of claim 2, wherein the optically transmissive encapsulant covering the plurality of LED dies is surrounded by a first reflector.

30. The assembly of multicolor light emitting diodes of claim 29, wherein the at least one lens is surrounded by a second reflector above said first reflector.

31. The assembly of multicolor light emitting diodes of claim 30, wherein the first reflector has a spline shape described by one of a polynomial, Bezier, and NURBS surface.

32. The assembly of multicolor light emitting diodes of claim 30, wherein the predetermined bottom surface has one of a micro-fly's eye, and a Voronoi lenslet array structure.

33. The assembly of multicolor light emitting diodes of claim 30, wherein the top surface of the lens has a shape described by one of radius, radius plus conic constant, radius plus conic constant plus aspheric, radius plus conic constant plus aspheric plus global general polynomial surface, global Zernike deformation, dioptric total internal reflection (TIR), free-form Non-Uniform Rational B-Spline (NURBS) defined TIR, Fresnel plus TIR, diffractive optical element, biconic, cartoval, Dielectric Total Internal Reflecting Concentrator, Confocal Elliptic Concentrator, and Multi-Focal Parabolic Concentrator.

34. The assembly of multicolor light emitting diodes of claim 30, wherein the second reflector comprises a plurality of randomly-perturbed microfacets.

35. The assembly of multicolor light emitting diodes of claim 34, wherein interfacet spaces of randomly-perturbed micro facets are described by NURBS surfaces.

36. The assembly of multicolor light emitting diodes of claim 34, wherein the microfacets have shapes described by one of diamond, triangular, hexagonal, other polygonal shapes, and combinations thereof.

37. The assembly of multicolor light emitting diodes of claim 2, wherein the optically transmissive encapsulant and the at least one lens is surrounded by an RXI concentrator.

38. The assembly of multicolor light emitting diodes of claim 37, wherein the predetermined bottom surface has one of a micro-fly's eye, and a Voronoi lenslet array structure.

39. The assembly of multicolor light emitting diodes of claim 37, wherein the top surface of the lens has a shape described by one of radius, radius plus conic constant, radius plus conic constant plus aspheric, radius plus conic constant plus aspheric plus global general polynomial surface, global Zernike deformation, dioptric total internal reflection (TIR), free-form Non-Uniform Rational B-Spline (NURBS) defined TIR, Fresnel plus TIR, diffractive optical element, biconic, cartoval, Dielectric Total Internal Reflecting Concentrator, Confocal Elliptic Concentrator, and Multi-Focal Parabolic Concentrator.

* * * * *